US007897968B2

(12) United States Patent  
Kuwabara et al.

(10) Patent No.: US 7,897,968 B2
(45) Date of Patent: Mar. 1, 2011

(54) ELECTRONIC DEVICE AND SEMICONDUCTOR DEVICE AND METHOD FOR MANUFACTURING THE SAME

(75) Inventors: Hideaki Kuwabara, Kanagawa (JP); Shunpei Yamazaki, Tokyo (JP); Shinji Maekawa, Shizuoka (JP); Osamu Nakamura, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 12/504,840

(22) Filed: Jul. 17, 2009

(65) Prior Publication Data

US 2009/0279012 A1 Nov. 12, 2009

Related U.S. Application Data

(62) Division of application No. 10/579,443, filed as application No. PCT/JP2004/018076 on Nov. 29, 2004, now Pat. No. 7,575,965.

(30) Foreign Application Priority Data

Dec. 2, 2003 (JP) .................................. 2003-403733  
Dec. 26, 2003 (JP) .................................. 2003-432083

(51) Int. Cl.
*H01L 29/04* (2006.01)
(52) U.S. Cl. .............. 257/57; 257/66; 257/72; 257/776; 257/E51.005
(58) Field of Classification Search .................. 257/57, 257/59, 66, 72, 776; 438/149, 151, 157, 438/166, 128, 48, 283, 280, 618
See application file for complete search history.

(56) References Cited

U.S. PATENT DOCUMENTS

| 5,084,905 | A | * | 1/1992 | Sasaki et al. ............... 257/776 |
| 6,416,583 | B1 | | 7/2002 | Kitano et al. |
| 6,426,595 | B1 | | 7/2002 | Odake et al. |

(Continued)

FOREIGN PATENT DOCUMENTS

EP 1 369 928 A1 12/2003

(Continued)

OTHER PUBLICATIONS

International Search Report for PCT/JP2004/018076 Dated Mar. 8, 2005.

(Continued)

*Primary Examiner* — Evan Pert
*Assistant Examiner* — Scott Wilson
(74) *Attorney, Agent, or Firm* — Nixon Peabody LLP; Jeffrey L. Costellia

(57) ABSTRACT

It is conceivable that the problem that a signal is delayed by resistor of a wiring in producing a display which displays large area becomes remarkable. The present invention provides a manufacturing process using a droplet discharge method suitable for a large-sized substrate.

In the present invention, after forming a base layer 11 (or base pretreatment) which enhances adhesiveness over a substrate in advance and forming an insulating film, a mask having a desired pattern shape is formed, and a desired depression is formed by using the mask. A metal material is filled in the depression having a mask 13 and a sidewall made from an insulating film by a droplet discharge method to form an embedded wiring (a gate electrode, a capacitor wiring, lead wiring or the like. Afterwards, it is flattened by a planarization processing, for example, a press or a CMP processing.

18 Claims, 28 Drawing Sheets

U.S. PATENT DOCUMENTS

| | | | |
|---|---|---|---|
| 6,627,263 B2 | 9/2003 | Kitano et al. | |
| 6,952,036 B2 * | 10/2005 | Suzuki et al. | 257/347 |
| 2001/0029066 A1 | 10/2001 | Itagaki et al. | |
| 2002/0053881 A1 | 5/2002 | Odake et al. | |
| 2002/0136829 A1 | 9/2002 | Kitano et al. | |
| 2004/0113161 A1 | 6/2004 | Suzuki et al. | |
| 2005/0250262 A1 | 11/2005 | Suzuki et al. | |

FOREIGN PATENT DOCUMENTS

| | | |
|---|---|---|
| JP | 03-159174 | 7/1991 |
| JP | 09-115433 | 5/1997 |
| JP | 2000-188251 | 7/2000 |
| JP | 2000-298446 | 10/2000 |
| JP | 2003-318193 | 11/2003 |
| JP | 2003-318401 | 11/2003 |
| WO | WO 02/067335 A1 | 8/2002 |

OTHER PUBLICATIONS

Written Opinion of the International Searching Authority for PCT/JP2004/018076 Dated Mar. 8, 2005.

* cited by examiner (A)

(B)

(C)

(D)

terminal portion | pixel portion (A)

(B)

(A)

(B)

(A)

(B)

(C)

(A)

(B)

ELECTRONIC DEVICE AND SEMICONDUCTOR DEVICE AND METHOD FOR MANUFACTURING THE SAME

TECHNICAL FIELD

The present invention relates to a semiconductor device having a circuit comprising a thin film transistor (hereinafter referred to as TFT) and a method for manufacturing the same. For example, the invention relates to an electronic device on which an electro-optical device typified by a liquid-crystal display panel is mounted as a component or an electronic device on which a light-emitting display device having an organic light-emitting element is mounted as a component.

A semiconductor device according to this specification indicates device in general which functions by using semiconductor properties. An electro-optical device, a semiconductor circuit and an electronic device are all included in a semiconductor device.

BACKGROUND ART

In recent years, a technique of configuring a thin film transistor (TFT) by using a semiconductor thin film (a thickness of about several nanometers to several hundred nanometers) which is formed over a substrate having an insulating surface attracts attention. A thin film transistor is widely applied to an electronic device such as an IC and an electro-optical device, and there is an urgent need for the development particularly as a switching element of an image display device.

Conventionally, a liquid crystal display device is known as an image display device. An active matrix liquid crystal display device is used more often than a passive matrix liquid crystal display device since a higher-definition image can be obtained compared to the passive matrix liquid crystal display. In an active matrix liquid crystal display device, a display pattern is formed on screen by driving a pixel electrode arranged in matrix. More specifically, by applying a voltage between a selected pixel electrode and a counter electrode corresponding to the pixel electrode, a crystalline layer which is disposed between the pixel electrode and the counter electrode is modulated optically, and the optical modulation is recognized as a display pattern by an observer.

Application of thus active matrix electro-optical device has been widened, and the demand on high definition, high aperture ratio and high reliability has been increased along with the demand on large area of screen size.

Till now, production engineering has been adopted in which a liquid crystal display panel is mass produced efficiently by cutting out a plurality of liquid crystal display panels from one mother glass substrate. Size of a mother glass substrate is enlarged from 300×400 mm of the first generation in the early 1990s to 680×880 mm or 730×920 mm of the fourth generation in 2000, and a plurality of the display panel can be obtained from one mother glass substrate.

In addition, the demand on improved productivity and lower cost has been increased along with the demand on large area of screen size.

In addition, in recent years, researches on a light emitting device comprising an EL element as a self-luminous light emitting element has been activated. The light emitting device is also referred to as an organic EL display or an organic light emitting diode. The light emitting devices have characteristics such as high response speed which is suitable for displaying moving images, low voltage drive, and low power consumption drive. Therefore, the light emitting devices has been attracting attention as a next-generation displays including new-generation cellular phones, personal digital assistants (PDA) and the like.

An EL element including a layer containing an organic compound as a light-emitting layer has the structure in which the layer containing an organic compound (hereinafter referred to as EL layer) is interposed between an anode and a cathode. Upon applying electric field to the anode and cathode, luminescence (Electro Luminescence) is emitted from the EL layer. In addition, luminescence from the EL element includes luminescence (fluorescence) in returning from a singlet excited state to a ground state and luminescence (phosphorescence) in returning from the triplet excited state to the ground state.

Application of thus active matrix display device has been widened, and the demand on high definition, high aperture ratio and high reliability has been increased along with the demand on large area of screen size.

Referring to Japanese Patent Laid-Open No. 2000-298446, a large-sized display is realized by disposing a plurality of panels like tiles to form one display screen. However, the cost is high since a plurality of panels is used, and a driving method becomes special.

In addition, the demand on improve3d productivity and lower cost has been increased along with the demand on large area of screen size.

Additionally, the technique is described in Japanese Patent Laid-Open No. 2000-188251, in which film formation is conducted over a semiconductor wafer by using an apparatus capable of continually discharging liquid resist with a linear shape of small diameter from a nozzle in order to increase yield of liquid which is used as film formation.

DISCLOSURE OF INVENTION

It is conceivable that the problem that a signal is delayed by resistor of a wiring in producing a display which displays large area becomes remarkable. In a large-area display, a gate line propagating wave form is likely to deteriorate since wiring resistor and a wiring capacitance are increased along with increase of total length of the wiring. Wring resistor can be decreased by increasing an area of cross section of a metal film serving as the wiring. However, when an area of cross section is increased by increasing a film thickness, a step is occurred between a surface of the substrate and a surface of a wiring; thereby, defect of orientation of liquid crystal is caused in a liquid crystal display device, and short of an anode and a cathode is caused in a light emitting device. Additionally, when a wiring width is broaden to increase an area of cross section, it is inevitable that an aperture ratio is decreased. Further, wiring capacitance is increased and larger amount of current is necessary for raising a voltage of the wiring; thereby, power consumption is increased.

Thus, the present invention provides a device in which a large screen display using an embedded wiring formed by a droplet discharge method, having a structure intended to solve a signal delay problem, and a method for manufacturing the same.

The invention also provides a method for realizing a display device having a wiring formed by a droplet discharge method as a desired electrode width and a bottom gate type TFT having a channel length of 10 µm or less as a switching element.

In the present invention, after forming a base layer (or base pretreatment) which enhances adhesiveness over a substrate in advance and forming an insulating film, a mask having a desired pattern shape is formed, and a desired depression is formed by using the mask.

When the depression is formed by etching, it is preferable that a base layer and further the substrate is not etched. Desirably, the base layer functions as an etching stopper. By leaving the base layer, adhesiveness between the substrate and a wiring are improved. In addition, when a groove is formed by etching to the substrate, intensity of the substrate is decreased. Accordingly, there is a risk that a crack due to an external pressure by a press step, a CMP processing or a step of attaching a counter substrate, or shrinkage of a substrate in a thermal step, or breaking of the substrate is occurred.

Then, a metal material is filled in the depression having a mask and a sidewall made from an insulating film by a droplet discharge method to form an embedded wiring (a gate electrode, a capacitor wiring, lead wiring or the like). Note that the mask is formed by using a droplet discharge method or a printing method (relief printing, flat plate, copperplate printing, screening or the like). Therefore, according to the invention, an embedded wiring with a small width can be formed even by a droplet discharge method as long as the mask for forming the depression is formed with a minute pattern.

In this specification, a droplet discharge method indicates a method for forming a material pattern on a surface to be processed by discharging material solution onto a desired region from a nozzle. In this specification, for example, an ink-jet printing method, a dispense method, a spray method or the like are given as a droplet discharge method. Note that a droplet discharged by an ink-jet method is not ink used for printed materials but is an object including a metal material or an insulating material is used.

Then, after removing the mask, temporary baking is carried out. Note that a metal material mistakenly formed over the mask is also removed when the mask is removed. In addition, it is preferable that the material of the mask is water repellent properties. In this step, the wiring is made to form to swell higher than the surface of the insulating film. Afterwards, it is performed by a planarizing processing, for example, a press or a CMP processing. Of course, the CMP processing may be performed after pressing, or the pressing is performed after the CMP processing.

In particular, when the thickness of the wiring is larger than the width thereof, the thickness of the wiring can be adjusted by grinding the insulating film in a CMP processing, and a wiring with uniform wiring resistance can be obtained even between different substrates.

When a CMP processing is carried out with the use of slurry and the like, difference of elevation in a depression and a projection (P-V value: Peak to Valley, difference in height between a maximum value and a minimum value) is decreased, in other words, the depression and the projection are planarized. Note that the P-V value of the depression and the projection may be observed with an AFM (atomic force microscope). Specifically, the P-V value of the depression and the projection on a surface to be processed is about 20 nm to 70 nm. The P-V vale of the projection and the depression on a surface can be decreased less than 20 nm, preferably 5 nm or less. Here, the surface to be processed indicates a surface including an upper surface of the embedded wiring and an upper surface of the insulating film.

In addition, a film thickness of the wiring depends on a thickness of the insulating film by making the insulating film harder than the wiring, and thus, a flat surface is obtained. Moreover, even when pressing is conducted, a wiring width is not broadened by the existence of the insulating film being in contact with a side surface of the wiring. Further, by pressing, density of the wiring is increased, and the resistor can be decreased. Baking is carried out along with planarizing by a hot pressing. Alternatively, baking is carried out after planarization. By using the hot-press capable of beating both sides of the substrate simultaneously, increase in P-V value of the depression and the projection due to baking can be controlled. Then, a gate insulating film and a semiconductor film are formed sequentially to manufacture a TFT.

In addition, the wiring width depends on precision of the depression by a mask; therefore, a desired width can be obtained regardless of an amount and viscosity of droplet to be dropped and a nozzle diameter. Generally, a wiring width dependent on a contact angle of a liquid material discharged from a nozzle to a substrate. For example, an amount of the material solution discharged from one nozzle diameter (50 μm×50 μm) of a standard ink-jet device is from 30 pl to 200 pl, and a wiring width to be obtained is from 60 μm to 600 μm. On the other hand, according to the invention, an embedded wiring with small width (for example, an electrode width of from 1 μm to 10 μm) and large thickness (for example, from 1 μm to 100 μm) can be obtained. The width of the embedded wiring of the invention can be narrowed down to the limit of photolithography technique, and the thickness thereof can be thicken by conducting film formation as thick as possible. In order to narrow the wiring width and to reducing wiring resistor, the embedded wiring of which thickness is longer than the width thereof is preferable. However, it is necessary to form a contact hole to connect to a wiring in an upper layer; therefore, it is preferable that the width of the wiring is longer than the diameter of the contact hole. When a diameter of a contact hole is 1 μm or more, adequate contact resistor can be obtained.

In addition, when a diameter of the nozzle is smaller than standard, an amount of a material solution discharged from one nozzle is from 0.1 pl to 40 pl, and the wiring width to be obtained is from 5 μm to 100 μm. A depression and a projection are likely occurred on a surface of a wiring obtained by a nozzle with small diameter after baking. However, the surface of the wiring can be planarized since a planarizing process such as a pressing or a CMP is performed on the embedded wiring of the invention. A depression and a projection of from 20 nm to 70 nm is occurred by baking on a surface of a wiring obtained by a droplet discharge method.

In particular, when a wiring obtained by a droplet discharge method is used as a gate wiring of a bottom gate type TFT, there is a risk that electric field concentration is generated in projection to cause a short-circuit if a surface has a depression and projection. Thus, it is important that a planarizing process is red out to flatten a surface of a gate wiring. Additionally, it is possible to prevent a short-circuit by providing the gate insulating film much thicker than a depression and a projection of the surface of the gate wiring; however, it may be a cause of increase in a driving voltage of a TFT and further, increase in a power consumption. According to the invention, a gate insulating film with a film thickness of from 1 nm to 200 nm, preferably from 10 nm to 30 nm can be obtained by planarizing the surface of the gate wiring.

In addition, when the material pattern is formed by a droplet discharge method, there are two cases: a case in which a material droplet is discharged intermittently from the nozzle and is dropped in a dot shape, and a case in which a string of material, formed of series of dots, discharged continually adheres. In the present invention, a material pattern may be formed by either pattern appropriately. In addition, instead of an ink-jet nozzle, a spray nozzle and a dispenser nozzle can be used.

The bottom gate type TFT using thus obtained embedded wiring as a gate wiring can lower resistance. Typically, a surface over which a metal wiring is formed has a structure in which a wiring width is protruded by the thickness. However, a coverage defect or the like is not likely to occur even when the gate insulating film and the semiconductor film is thinned down since the embedded wiring is used in the invention.

According to one structure of the invention disclosed in this specification, a semiconductor device comprises an insulating layer and at least one of a gate wiring and a gate electrode formed over a substrate having an insulating surface, a gate insulating film formed over one of the gate wiring and the gate electrode, and an active layer of a thin film transistor including at least a channel formation region over the gate insulating film, a source wiring and an electrode formed over the active layer, and a pixel electrode formed over the electrode, wherein one of the gate wiring and the gate electrode contains a resin and has the same film thickness as that of the insulating layer.

According to another structure disclosed in this specification, a semiconductor device comprises a base layer formed over a substrate having an insulating surface, an insulating layer and at least one of a gate wiring and a gate electrode formed over the base layer, a gate insulating film formed over one of the gate wiring and a gate electrode, and an active layer of a thin film transistor including at least a channel formation region over the gate insulating film, a source wiring and an electrode formed over the active layer, and a pixel electrode formed over the electrode, wherein one of the gate wiring and the gate electrode contains a resin and has the same film thickness as that of the insulating layer.

According to the above structure, the base layer comprises a material selected from the group consisting of a transition metal, an oxide of said transition metal, a nitride of said transition metal, and an oxynitride of said transition metal.

According to the above structure, the transition metal comprises a material selected from the group consisting of Sc, Ti, Cr, Ni, V, Mn, Fe, Co, Cu, Zn.

Additionally, according to the above structure, the active layer of the thin film transistor is a non-single crystalline semiconductor film or a polycrystalline semiconductor film added with hydrogen or halogen hydrogen.

As an active layer of a thin film transistor, an amorphous semiconductor film, a semiconductor film including a crystal structure, a compound semiconductor film including an amorphous structure or the like can be suitably used Further, as the active layer of the TFT, a semiamorphous semiconductor film (also referred to as microcrystal semiconductor having) an intermediate structure between a semiamorphous structure and a crystalline structure (including a single crystalline and polycrystalline structure), which is a semiconductor having a tertiary state which is stable in a view of free energy, including a crystalline region having a short-distance order and lattice distortion. In addition, at least some region of the film includes a crystal grain of from 0.5 nm to 20 nm. The Raman spectrum is shifted to the wave number side lower than 520 $cm^{-1}$. Diffraction peaks of (111) or (220) derived from Si crystalline lattice are observed in X-ray diffraction of the semiconductor film. Hydrogen or halogen is included at least 1 atom % or more as a neutralizer for an uncombined hand (dangling bond). As a method for manufacturing the semiamorphous semiconductor film, it is formed by performing grow discharging decomposition (plasma CVD) of a silicide gas. For the silicide gas, it is possible to use $SiH_4$, additionally, $Si_2H_6$, $SiH_2Cl_2$, $SiHCl_3$, $SiCl_4$, $SiF_4$ or the like. This silicide gas may be diluted with $H_2$, or $H_2$ and one or more kinds of the rare gas elements: He, Ar, Kr and Ne. A Dilution ratio ranges from 2 times to 1000 times. Pressure ranges approximately from 0.1 Pa to 133 Pa, power frequency ranges from 1 MHz to 120 MHz, preferably, from 13 MHz to 60 MHz. Substrate heating temperature may be 300° C. or less, preferably, temperatures from 100° C. to 250° C. As for an impurity element in a film, it is preferable that impurities of atmospheric component such as oxygen, nitrogen or carbon are set $1\times10^{20}$ atoms/$cm^{-1}$ or less, in particular, the oxygen concentration is set $5\times10^{19}$ atoms/$cm^3$ or less, preferably, $1\times10^{19}$ atoms/$cm^3$ or less. Note that electric field effect mobility of a TFT (a thin film transistor) having a semiamorphous semiconductor layer as the active layer is about 5 $cm^2$/Vsec to 50 $cm^2$/Vsec.

According to each of the above structure, the width of the gate electrode of the thin film transistor is from 5 μm to 100 μm since the embedded wiring is formed by a droplet discharge method. Additionally, a bottom gate type TFT realizing a gate electrode with small width can be manufactured; therefore, in each structure, a channel length of the thin film transistor can be set to 5 μm to 100 μm.

According to each of the above structure, the length of the gate electrode width of the thin film transistor is shorter than that of the thickness of the gate electrode of the thin film transistor. In order to narrow a wiring width and to lowering a wiring resistance, an embedded wiring is preferable to have a larger thickness than width.

According to each of the above structure, a surface including an upper surface of the gate wiring or the gate electrode and a surface including an upper surface of the insulating layer are in the same plane. The gate wiring and the gate electrode are embedded wirings. The insulating layer here indicates an insulating material pattern formed in the same step. Further, the gate wiring and the gate electrode indicate metal layers embedded in the insulating layer.

According to each of the above structure, a P-V value of the projection and a depression on the upper surface of the insulating layer is less than 20 nm. Planarity of an orientation film in a liquid crystal display device and planarity of an anode surface in a light emitting device can be ensured by improving planarity of an upper surface of the insulating layer.

According to each of the above structure, a P-V value of the projection and a depression on the upper surface of the insulating layer is less than 20 nm. A gate insulating film can be thinned by improving planarity of the gate electrode or an upper surface of the gate electrode.

According to each of the above structure, the semiconductor device comprises a liquid crystal display device including a second substrate opposing to the substrate and a liquid crystal interposed between a pair of substrates composed of the substrate and the second substrate.

Alternatively, according to each of the above structure, the semiconductor device comprises a light emitting device including a plurality of light emitting elements having a cathode, a layer containing an organic compound and an anode.

According to each of the above structure, the semiconductor device is an interactive video/audio communication device or a general-purpose remote control device.

According to another structure of the invention for realizing the above structures, a method for manufacturing a semiconductor device comprises the steps of: forming a base film or carrying out a base pretreatment over a first substrate having an insulating surface; forming an insulating film over the substrate; forming a mask over the insulating film; forming a depression by selectively etching the insulating film; forming an embedded wiring in the depression by a droplet discharge method; removing the mask; performing a planarization processing to an upper surface of the embedded wiring; forming a gate insulating film over the electrode; and forming a semiconductor film over the gate insulating film.

According to the structure regarding the above manufacturing step, the base layer is used as an etching stopper in the step of forming the depression by selectively etching the insulating film According to the structure regarding the above manufacturing step, the planarizing process is a press treatment, a heat press treatment or a CMP processing which presses the insulating film and the embedded wiring with a press member. Alternatively, the planarization processing is a heat press treatment in which the baking of the embedded wiring is performed by carrying out heating and pressing simultaneously. In case of using a heat press treatment capable of heating both sides of the substrate at the same time, shorter baking time is possible compared to the case of baking the wiring just with an oven or a hot plate.

According to the structure regarding the above manufacturing step, the step of forming a mask over the insulating film comprises a step of forming a first material layer soluble in a first solvent and a second material layer soluble in a second solvent surrounding the first material layer are formed with a device provided with a plurality of nozzles which can discharge different materials, and a step of forming a mask comprising the first material film by removing the second material alone by the second solvent.

There is a risk that an accurate pattern of the mask is difficult to obtain due to dripping in the case where a resist material has high fluidity or in the case where the resist material increases its fluidity in baking when the mask is formed by a droplet discharge method. Therefore, the dripping may be prevented by using a material (for example, water-soluble resin) which includes a solvent different from that of the material for forming a mask (resist or the like) and by dropping the material onto a pattern region to be opened. Preferably, by using a droplet discharge device provided with a plurality of nozzle units which can discharge resist and a water-soluble solution, intervals between a step of discharging the resist and a step of discharging the water-soluble solution are shorten. In this case, the resist and the water-soluble solution are discharged according to the same alignment position; therefore, there is less pattern misalignment. Further, when washing is carried out by using water after baking, the water-soluble resin is removed alone, and an accurate mask pattern can be obtained.

When a droplet discharge device provided with a plurality of nozzle units capable of discharging an insulating material and a metal material, the discharge is carried out according to the same alignment position; therefore, an interlayer insulating film and a connection electrode are formed without pattern misalignment.

Conventionally, when the material and further photomask are different, alignment of an insulating material and alignment of a metal material is required to conduct respectively, since alignment is regulated for in each case. Accordingly, pattern misalignment is likely to occur.

According to the structure regarding the above manufacturing step, the embedded wiring is one of a gate electrode and gate wiring of a thin film transistor.

As an example shown in FIGS. 10A and 10B, the gate electrode and the gate wiring may be formed separately so that the gate electrode with a small width is in contact with the gate wiring with a large width. The width of the gate electrode may be set to from 5 μm to 20 μm; the width of the gate wiring, 10 μm to 40 μm, so that a ratio between the width of the gate electrode and that of the gate wiring is 1:2. For example, the gate electrode alone is formed by a droplet discharge method by using an ink-jet head having a small nozzle diameter in a depression formed in a insulating film. After planarization such as press step, the gate wiring is formed by using an ink-jet head having a large diameter so as to overlap with a part of the gate electrode. By forming the gate electrode and the gate wiring separately, throughput can be improved.

The invention can be applied regardless of a TFT structure, for example, a bottom gate type (inverted staggered type) TFT and a staggered type TFT can be used. Additionally, the invention is not limited to a TFT having a single gate structure, a multi gate type TFT having a plurality of channel formation regions, for example a double gate type TFT is acceptable.

Further, a TFT having a dual gate structure in which gate electrodes are formed over and under semiconductor layers, and channels (dual channel) are formed over and under one of the semiconductor layers.

According to the present invention, manufacture of a display displaying a large area can be realized without spin coat method, by using an embedded wiring formed by a droplet discharge method. Compared to a spin coat method, a droplet discharge method can reduce a material solution to lower a production cost.

Further, a heater can contact with a substrate at the same time with planarization of the embedded wiring by a heat press; therefore, uniform baking can be carried out in a short time. Accordingly, productivity is improved.

BRIEF DESCRIPTION OF DRAWINGS

FIG. 11D are a perspective view showing carrying out a liquid crystal drop by a droplet discharge method (Embodiment 2);

BEST MODE FOR CARRYING OUT THE INVENTION

Figure 1:
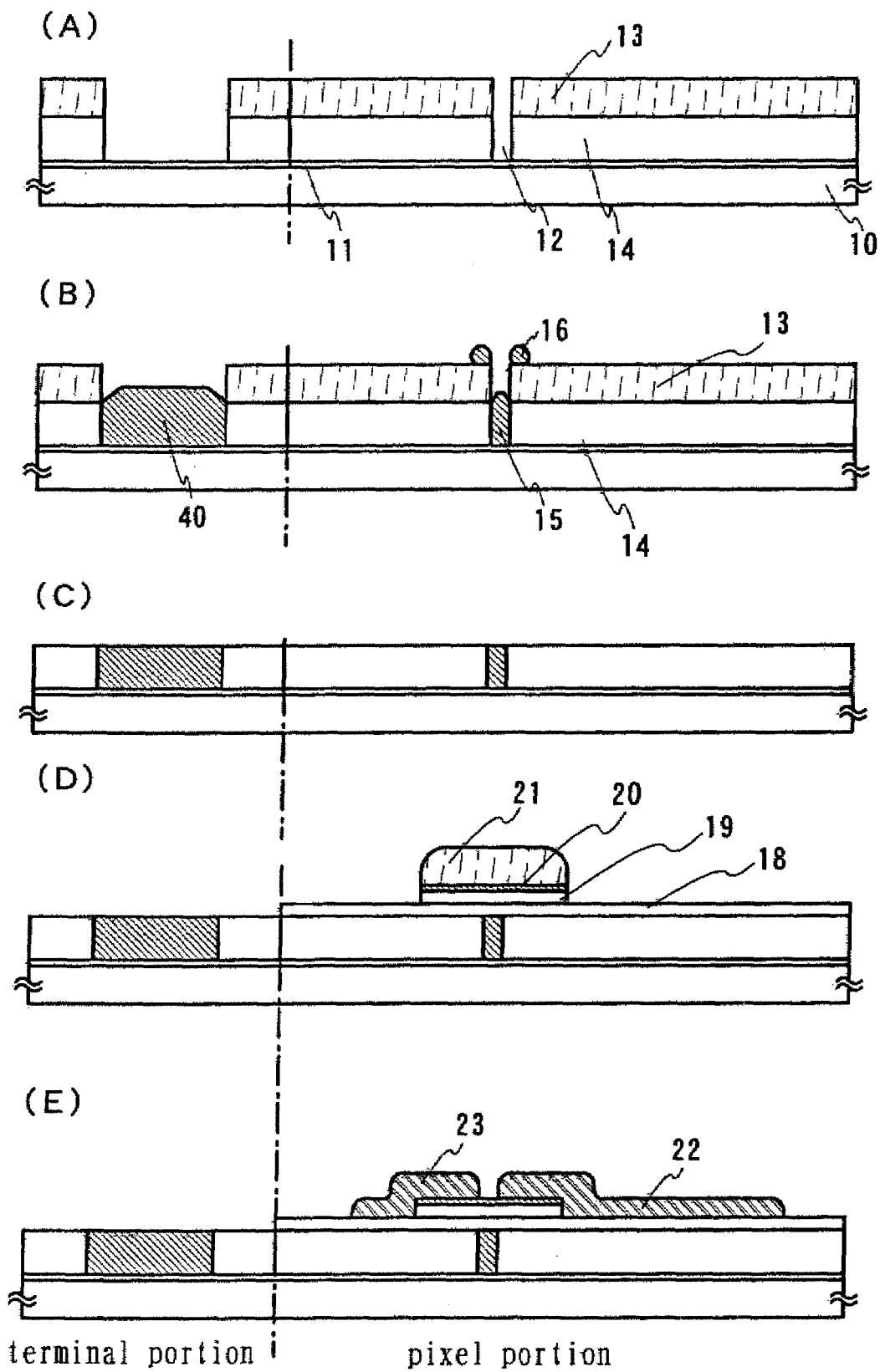
FIGS. 1A to 1F are cross-sectional views each illustrating a manufacturing step of AM-LCD.

Embodiment mode of the present invention is described hereinafter.

Embodiment Mode 1

Here, FIGS. 1A to 1E and 2A to 2D are views illustrating examples of manufacturing an active matrix liquid crystal display device in which a channel etch type TFT is used as a switching element.

First, a base layer 11 for improving adhesiveness to a material layer to be formed later by a droplet discharge method is formed over a substrate 10. The base layer 11 does not always need to have a layer structure as long as it is formed very thin. Accordingly, the formation of the base layer 11 can be regarded as base pretreatment. Photocatalystic substance (titanium oxide ($TiO_x$), strontium titanate ($SrTiO_3$), cadmium selenide (CdSe), potassium tantalate ($KTaO_3$), cadmium sulfide (CdS), zirconiumoxide ($ZrO_2$), niobium oxide ($Nb_2O_5$), zinc oxide (ZnO), ferric oxide ($Fe_2O_3$), tungsten oxide ($WO_3$)) may be applied over an entire surface with a spray method or a sputtering method. Alternatively, a treatment to selectively form an organic material (polyimide; acrylic; or an applied insulating film using a material, in which a skeletal structure is configured by bonding silicon (Si) and oxygen (O), at least containing one kind of hydrogen, fluorine, alkyl, or aromatic hydrocarbon in a substituent) may be carried out by using an ink-jet method or a sol-gel method.

A photocatalystic indicates a material which has a photocatalytic function. The photocatalystic is activated when it is irradiated with light in an ultraviolet light region (wavelength: 400 nm or less, preferably, 380 nm or less). A minute pattern can be drawn by discharging a conductor contained in a solvent on the photocatalystic by an ink-jet method.

For example, $TiO_x$ is not hydrophilic but oleophilic, that is, water repellent before being irradiated with light. Light irradiation causes photocatalytic activity, and $TiO_2$ is converted into hydrophilic and non-oleophilic, that is, oil repellent. Note that $TiO_2$ can be hydrophilic and oleophilic at the same time depending on a length of irradiation time.

Note that hydrophilic means a state which is easy to get wet with water and has a contact angle of 30° or less. Specifically, a state having a contact angle of 5° or less is referred to as super-hydrophilic. On the other hand, water-repellent means a state which is hard to get wet with water and has a contact angle of 90° or more. Similarly, oleophilic means a state which is easy to get wet with oil, and "oil-repellent" means a state which is hard to get wet with oil. Note that the contact angle means an angle made by a formation face and a tangent to a droplet on the edge of a dropped dot.

In case of using a water-based solvent, it is preferable to add a surfactant in order to smoothly discharge a droplet from a nozzle of an ink-jet nozzle. In stead of the ink-jet nozzle, a fog generating nozzle or a dispenser nozzle also can be used.

In case of discharging a conductor mixed into an oil (alcohol) based solvent, a wiring can be similarly formed by discharging a conductor onto a region which is not irradiated with light (hereinafter referred to as a non-irradiation region) and discharging a dot from the above of the non-irradiation region or to the non-irradiation region.

Note that a nonpolar solvent or a low polar solvent can be used as the oil (alcohol) based solvent. For example, terpineol, mineral spirit, xylene, toluene, ethyl benzene, mesitylene, hexane, heptane, octane, decane, dodecane, cyclohexane, or cyclooctane can be used.

Further, photocatalytic activity can be improved by doping a transition metal (such as Pd, Pt, Cr, Ni, V, Mn, Fe, Ce, Mo, or W) into the photocatalytic substance, and photocatalytic activity can be caused by light of a visible light region (wavelength: from 400 nm to 800 nm). This is because the transition metal can form a new level within a forbidden band of an active photocatalystic having a wide band gap and can expand a light absorption range to a visible light region. For example, an acceptor type such as Cr or Ni, a donor type such as V or Mn, an amphoteric type such as Fe, or other types such as Ce, Mo, or W can be doped. A wavelength of light can thus be determined depending on the photocatalytic substance. Therefore, light irradiation means to irradiate with light having such a wavelength that photocatalytically activates the photocatalytic substance.

When the photocatalytic substance is heated and reduced in a vacuum or under reflux of hydrogen, an oxygen defect is generated in crystal. Without doping a transition element, an oxygen defect plays a similar role to an electron donor in this way. Specifically, in case of forming with a sol-gel method, the photocatalytic substance may not be reduced since an oxygen defect exists from the beginning. In addition, an oxygen defect can be formed by doping a gas of $N_2$ or the like.

Here, an example of carrying out base pretreatment for improving the adhesiveness in case of discharging a conductor over the substrate is shown without particularly limited thereto. A TiOx film may be formed to improve the adhesiveness between the material layers in the case where a material layer (for example, an organic layer, an inorganic layer, or a metal layer) is formed by a droplet discharge method, or the case where a material layer (for example, an organic layer, an inorganic layer, or a metal layer) is further formed over discharged conductive layer by droplet discharge method. In other words, in case of making patterns by discharging a conductor by a droplet discharge method, it is desirable to perform a base pretreatment over and under the interface of the conductive material layer in order to improve the adhesiveness.

In addition, 3d transition metal (Sc, Ti, Cr, Ni, V, Mn, Fe, Co, Cu, Zn or the like), the oxide, nitride or oxynitride thereof can be used as the base layer 11, without being limited to a photocatalytic material.

Besides a non-alkaline glass substrate such as a barium borosilicate glass, an alumino borosilicate glass, or aluminosilicate glass manufactured with a fusion method or a floating method, a plastic substrate or the like having the heat resistance that can withstand processing temperature or the like can be used as the substrate 10. Further, a substrate such as a semiconductor substrate such as single crystal silicon, a metal substrate such as stainless steel or a ceramic substrate provided with an insulating layer on the surface thereof may be applied in case of a reflective liquid crystal display device.

Subsequently, an insulating film is formed over an entire surface with a sputtering method, a CVD method or a droplet discharge method. For this insulating film, an inorganic material (silicon oxide, silicon nitride, silicon oxynitride or the like), a photosensitive or non-photosensitive organic material (polyimide, acryl, polyamide, polyimide amide, resist or benzocyclobutene) or a lamination thereof or the like can be used. In addition, as the insulating film, a SiOx film including the alkyl group which is obtained by using siloxane-based polymer may be applied. A thickness and electrical resistivity of a gate wiring subsequently formed is determined by the width as width of the insulating film. In case of forming a liquid crystal display device having a large-area screen, it is desirable to form a gate wiring with low resistance. A thickness of the insulating film may be thick, for example, it may be set to from 1 μm to 100 μm. Here, thickness of the insulating film is set to 5 μm. In addition, the insulating film with preferable adhesiveness is formed by the base layer 11.

Subsequently, a mask 13 comprising photopolymer (typically resist) is formed. The mask 13 is formed by a droplet discharge method or a printing method (relief printing, flat plate, copperplate printing, screening equipment or the like). Although a desired mask pattern may be formed directly by a droplet discharge method or a printing method, in order to formed in high definition, it is desirable that a desirable mask pattern is obtained by using a resist removing apparatus shown in FIGS. 4A and 4B and carrying out exposure using the photomask after forming a resist film over an entire surface by a droplet discharge method or a printing method.

Figure 4:
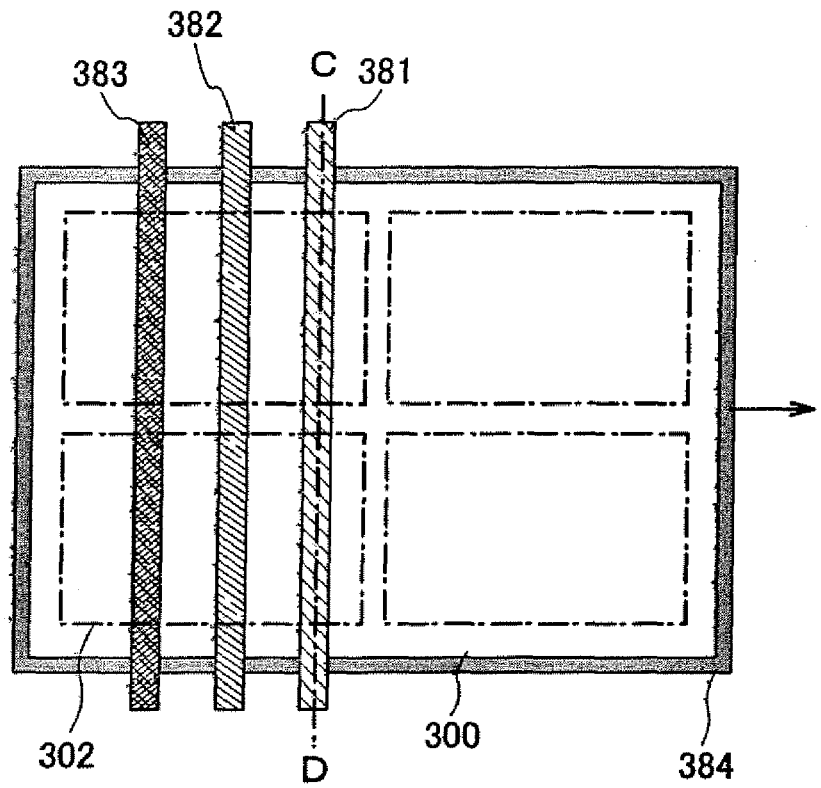
FIGS. 4A and 4B are views each showing a wet processor.
Figure 4:
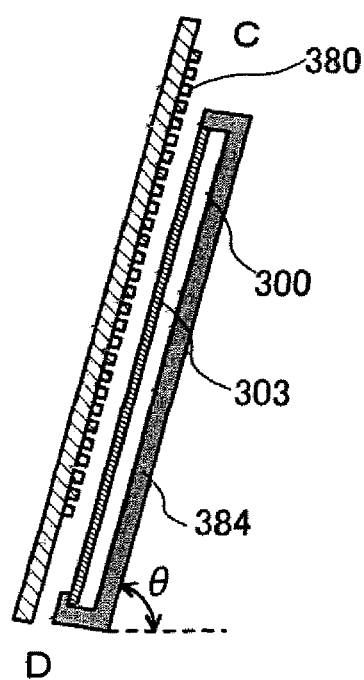

A resist removing apparatus shown in FIGS. 4A and 4B can develop and wash the substrate without making the substrate spin. FIG. 4A is a side view, resist removing solution is discharged from resist removing nozzles 381 while a large-area substrate 300 which is fixed to a substrate support 384 is carried. Four pieces of a pixel portion 302 can be obtained to be manufactured from the large-area substrate 300. Then, washing water is jetted from deionized water nozzles 382, and gas is jetted from blow nozzles 383. The large-area substrate 300 is disposed slantingly to have an angle of θ as shown in FIG. 4B of a cross-sectional view. The angle θ can range of 0°<θ<90°, preferably 45°<θ<80°. In FIG. 4B, reference numeral 303 denotes a resist film. Resist removing solution discharged from a plurality of resist removing solution nozzles 380 to the resist film 303 flows along the substrate surface by gravity. Additionally, the angle θ is set to 90°<θ<120°, and resist removing solution can be jetted from a plurality of resist removing solution nozzles 381 with high pressure. In this case, the solution drops without flowing on the substrate 300; accordingly, unevenness of the solution can be avoided. Similarly, washing water is jetted from the deionized water nozzles 382, and gas is jetted from the blow nozzles 383 with high pressure.

Subsequently, an insulating layer 14 is formed by selectively etching the insulating film to form a depression 12 (FIG. 1A). In this etching, a material of an insulating film, an etchant and etching gas are suitably adjusted so that the base layer 11 functions as an etching stopper.

Subsequently, material solution is dropped toward a depression by a droplet discharge method, typically an ink-jet method with the mask 13 left. Afterwards, baking is carried out in an oxygen atmosphere, thereby forming a gate electrode or a metal wiring 15 which includes resin serving a gate electrode or a gate wiring (FIG. 1B). An accurate pattern shape, particularly, a wiring with small width can be obtained since a depression is formed on the insulating layer 14 beforehand. Here, the width of the metal wiring 15 including resin to be a gate wiring is set 1 μm. Note that FIG. 1B shows a state of a substrate before temporary baking. Even if an extra droplet 16 is left on the mask 13, it can be removed simultaneously in a subsequent step of removing the mask since baking can be curried out being isolated from the metal wiring by setting the mask lyophobic.

Additionally, a wiring with large width can be obtained simultaneously. A wiring 40 extending toward a terminal portion is formed in the same manner as the metal wiring 15 including resin. Here, the width of the wiring 40 extending toward the terminal portion is set to 30 μm. In addition, although it is not shown here, a capacitor electrode or a capacitor wiring for forming a storage capacitor is formed, if necessary.

As the wiring material, any one of gold (Au), silver (Ag), copper (Cu), platinum (Pt), palladium (Pd), tungsten (W), nickel (Ni), tantalum (Ta), bismuth (Bi), lead (Pb), indium (In), tin (Sn), zinc (Zn), titanium (Zn), or aluminum (Al); an alloy thereof; dispersed nanoparticles thereof; or silver halide particles is used. In particular, the gate wiring is preferable to be low resistance. Therefore, a material in which any one of gold, silver, or copper dissolved or dispersed in a solvent is preferably used, and more preferably silver or copper with low resistance is used in consideration of a specific resistance value. However, in case of using silver or copper, a barrier metal film (Ta, TaN, Ti, TiN, W, WN or the like) may be additionally provided in order to prevent a metal element (silver or copper) from dispersing. A solvent corresponds to ester such as butyl acetate, alcohols such as isopropyl alcohol, an organic solvent such as acetone or the like. Surface tension and viscosity are appropriately adjusted by adjusting of a concentration of the solvent and adding a surfactant or the like.

In addition, a metal wiring may be formed by a droplet discharge method by dispersing or dissolving particles which is a combination of the above metal materials, for example metal particles in which a periphery of copper is coated with silver, in a solvent. A periphery of copper is coated with silver; thus, adhesiveness can be improved in case of forming a base film or performing base pretreatment. Additionally, the depression and projection of copper can be made smooth by coating with silver. Alternatively, a metal wiring may be formed by a droplet discharge method by dispersing or dissolving metal particles in which a periphery of copper is coated with a buffer layer (Ni or NiB) to be further coated with silver entirely in a solvent. Note that the buffer layer is provided in order to increase adhesiveness between copper (Cu) and silver (Ag).

A diameter of a nozzle used in a droplet discharge method is set to from 0.02 μm to 100 μm (preferably, 30 μm or less), and a discharging amount of a composition discharged from the nozzle is preferably set to from 0.001 pl to 100 pl (preferably, 10 pl or less). There are two types of an on-demand type and a continuous type for a droplet discharge method, both of which may be used. Furthermore, as a nozzle to be used in a droplet discharge method, there is a piezoelectric system using properties transformed by applying voltage and a heating system boiling a composition by a heater provided in a nozzle and discharging the composition, and both of which may be used. A spacing between a subject and a discharge opening of a nozzle is preferable to be made as close as possible to drop a droplet in a desired place, which is preferably set to from 0.1 mm to 3 mm (preferably, 1 mm or less).

While keeping the relative spacing, one of the nozzle and the subject moves and a desired pattern is drawn. In addition, plasma treatment may be carried out on a surface of the subject before discharging a composition. This is to take advantage of a surface of the subject becoming hydrophilic and lyophobic when plasma treatment is carried out. For example, it becomes hydrophilic to deionized water and it becomes lyophobic to a paste dissolved with alcohol.

A step of discharging a composition may be carried out under a low pressure so that a solvent of the composition can be volatilized while the composition is discharged and hit on a subject and that later steps of drying and baking can be skipped or shorten. After discharging the composition, either or both steps of drying and baking is carried out by irradiation of laser light, rapid thermal annealing, heating furnace or the like under the atmospheric pressure or the low pressure. Both the steps of drying and baking are steps of heat treatment. For example, drying is carried out at 100° C. for 3 minutes and baking is carried out at temperatures from 200° C. to 350° C. for from 15 minutes to 120 minutes, of which object, temperature, and time are different. In order to carry out the steps of drying and baking well, the substrate may be heated, of which temperatures are set to from 100° C. to 800° C. (preferably, temperatures from 200° C. to 350° C.), though depending on a material of a substrate or the like. Through this step, a solvent in a composition is volatilized or dispersant is removed chemically, and a resin around cures and shrink, thereby accelerating fusion and welding. In other words, the baked wiring and the electrode include resin. The step of drying and baking are carried out under the oxygen atmosphere, the nitrogen atmosphere, or the atmosphere. However, this step is preferable to be carried out under an oxygen atmosphere in which a solvent decomposing or dispersing a metal element is easily removed.

The adhesiveness of a metal film which is formed by a droplet discharge method can be significantly improved by forming the base film or by carrying out base pretreatment. The metal layer can be withstood even it is soaked in rare hydrofluoric acid (diluted 1:100) for one minute or more; therefore, sufficient adhesiveness can be obtained even in a tape peeling test.

In addition, adhesiveness of the metal layer can be improved also in a sidewall by making the insulating layer 14 a lyophilic material or making the sidewall of the insulating layer 14 lyophilic.

Subsequently, the mask 13 comprising a resist is removed. In this stage, a metal layer may be upheaved higher than a surface of the insulating layer. After discharging solvent (thinner or the like) from a nozzle by using a similar device shown in FIGS. 4A and 4B, washing and drying may be carried out sequentially. In addition, ultrasonic cleaning may be carried out as well as washing.

Subsequently, a planarizing process, for example, a press or a chemical-mechanical polishing thereinafter referred to as CMP) is carried out (FIG. 1C).

Figure 5:
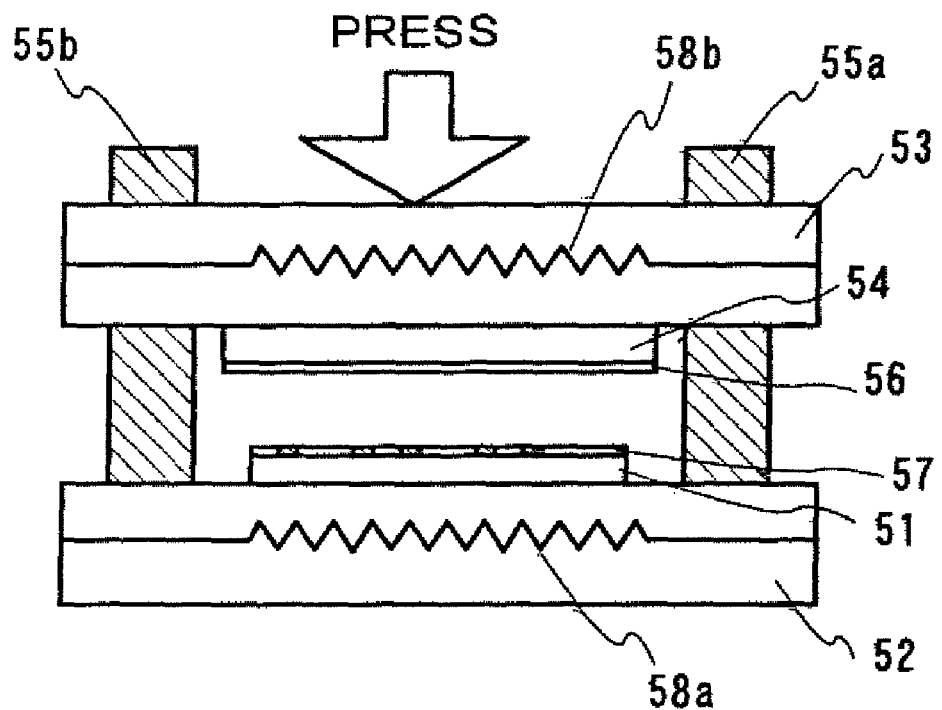
FIGS. 5A and 5B are cross-sectional views each showing a press device.
Figure 5:
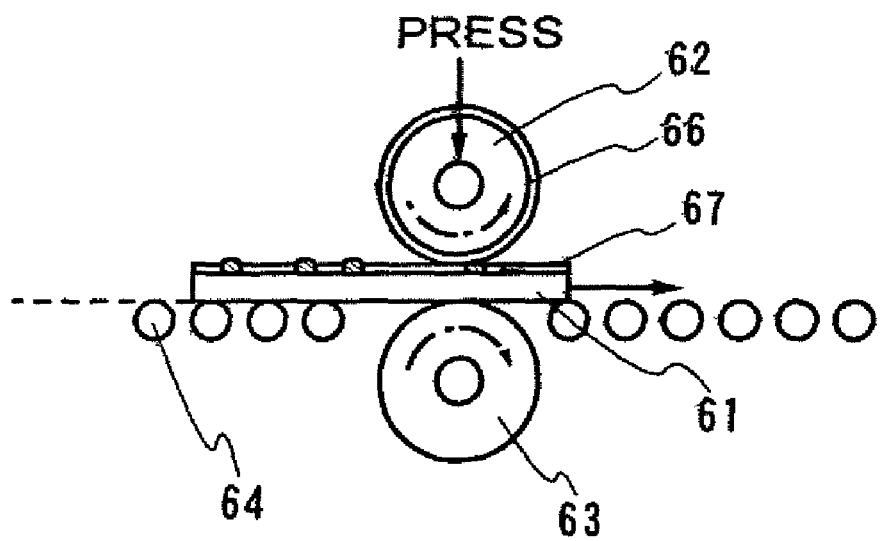

An example of a hot-press device pressurizing automatically is shown in FIG. 5A. The hot-press device comprises a pair of top and bottom hot plates 52 and 53, and a sample is sandwiched between the pair of hotplates to be pressed by moving the top hotplate 53 downward. Pressurization is carried out at a pressure in a range (bearing of from 0.5 kgf/cm² to 1.0 kgf/cm²) where a glass substrate is not broken. Heaters 58a and 58b are incorporated in the hot plates 52 and 53, respectively, and the hot plate on lower side is fixed. The top hot plate 53 is placed with supports 55a and 55b to be moved up and down freely. With the hot plates 52 and 53, a top plate 54 provided with a Teflon coat film 56 on the surface thereof and a substrate 51 provided with a layer to be processed 57. Here, the layer 57 to be processed indicates the insulating layer 14 and the metal wiring 15. An exposure surface of the metal wiring 15 is conformed to an exposure surface of the insulating layer 14 by planarization by pressing. A pattern of the metal wiring 15 is not stretched since the insulating layer 14 maintains the thickness and width even after pressing. Baking can be carried out in a short time by pressing a temporary-baked substrate and heating up to a baking temperature with the substrate pressed. In a large-area substrate, a huge baking chamber is required; therefore, a bake processing time is likely to get longer when whole baking chamber is heated.

An example of another pressurizing device is shown in FIG. 5B, which is different from the one shown in FIG. 5A. A substrate 61 is sandwiched between a roller 62 and a feed roller 63. By using pressurizing means (not shown in the figure), the substrate 61 is pressed by pressurization with the feed roller 63 driven and rotated. The roller 62 has a metallic cylindrical body provided with a teflon coat film 66 on its surface, and arranged opposite to the feed roller 63 to make a pair therewith. Then, roller conveyers 64, in which a plurality of conveyance rollers are disposed, rotated by driving means are provided in the vicinity of the feed roller 63 to feed and carry out the substrate 61. Additionally, the substrate is provided with a layer 67 to be pressed. Further, a sheathed heater with thermoregulation ability may be provided inside the roller 62 and the feed roller 63 so that a surface of the roller can be kept heated.

Either of the press devices can carry out planarization by pressing. In case of carrying out hot-press for a long time or at high temperature, the press device shown in FIG. 5A is suitable. On the other hand, in case of carrying out hot-press for a short time or at low temperature, the press device shown in FIG. 5B is suitable. Note that the Teflon coat films 56 and 66 are provided, preventing adhesiveness of a component material of a layer to be processed are provided in both press devices.

Figure 6:
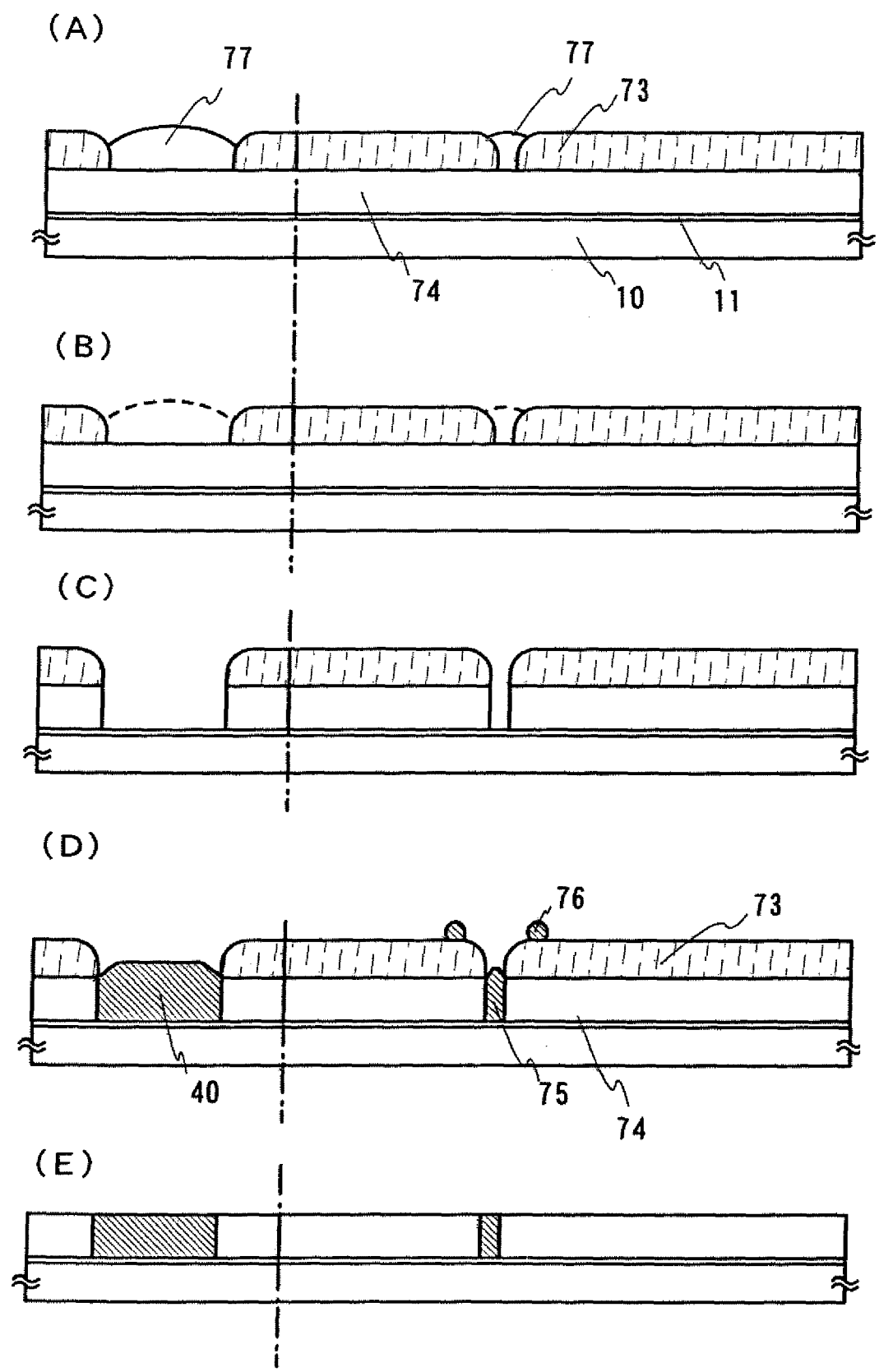
FIGS. 6A to 6E are cross-sectional views each illustrating a step of forming a mask.

Here, another manufacturing step is described with reference to FIGS. 6A to 6E. In a droplet discharge method, a device capable of discharging materials of different kind from a plurality of nozzles is used. A step in which the base layer 11 is formed over the substrate 10 to form an insulating layer 74 is the same as the above-mentioned steps; therefore, it is not described. A water-soluble resin 77 and a mask 73 comprising a resist are discharged over the insulating layer 74 with the same device as illustrated in FIG. 6A. The water-soluble resin 77 is used for preventing pattern deformation in the case where a resist material has high fluidity or in the case where the resist material increases its fluidity in baking. Additionally, the water-soluble resin 77 protects a region where resist is unnecessary, for example a periphery of the substrate. Then, after baking or photo-curing, washing is carried out with water to remove the water-soluble resin alone as illustrated in FIG. 6B. Note that FIG. 6B shows a state before temporary baking. By using thus obtained mask 73, a fine pattern may be obtained by selectively etching the insulating layer 74 as illustrated in FIG. 6C. Subsequently, wirings 75 and 40 are formed by a droplet discharge method as illustrated in FIG. 6D, and an extra droplet 76 adhering to the mask 73 and the mask are removed simultaneously. Afterwards, planarization is carried out by pressing as illustrated in FIG. 6E. In case of adopting a step of forming a resist mask illustrated in FIGS. 6A to 6E, the mask 73 has a structure in which the end thereof has a curvature. Accordingly, the spacing between the extra droplet 76 and the wiring 75 can be further broadened. The water-soluble resin is described as an example.

However, without limiting thereto, after forming a material including a solvent other than water, which is insoluble in a mask, the material alone may be solved in the solvent.

Either steps illustrated in FIGS. 6A to 6E or FIGS. 1A to 1C may be used.

Subsequently, a gate insulating film 18, a semiconductor film and an n-type semiconductor film are formed sequentially by using a plasma CVD method or a sputtering method. In this embodiment mode, an embedded wiring having a flat surface even over a wiring is used; therefore, a coverage defect is not occurred even when each film thickness is small. For example, a thickness of the gate insulating film 18 can be set to from 1 nm to 200 nm by using a plasma CVD method or a sputtering method.

A material mainly containing silicon oxide, silicon nitride or silicon nitride oxide which are obtained with a PCVD method or a sputtering method are used as the gate insulating film 18. Preferably, the gate insulating film 18 is thinned to be from 10 nm to 50 nm and formed with a single layer or multi layer structure of an insulating layer including silicon.

In this way, in case of using a plasma CVD method for forming the insulating film with a small thickness, it is necessary to obtain the small film thickness with good controllability by decreasing a formation rate. For example, the deposition rate of the silicon oxide film can be set at 6 nm/min when RF power is set at 100 W, frequency is 10 kHz; pressure is 0.3 Torr; an $N_2O$ gas flow is 400 sccm; and an $SiH_4$ gas flow is 1 sccm.

In addition, the gate insulating film 18 may be discharged and baked by a droplet discharge method using siloxane-based polymer to obtain a SiOx film including an alkyl group. Note that a film thickness is 100 nm or more in a case of forming the gate insulating film 18 by a droplet discharge method The semiconductor film formed with an amorphous semiconductor film or a semiamorphous semiconductor film which is manufactured with a vapor phase growth method, a sputtering method or a thermal CVD method using a semiconductor material gas typified by silane and germanium.

As an amorphous semiconductor film, an amorphous silicon film obtained by a PCVD method using $SiH_4$ or a gas mixture of $SiH_4$ and $H_2$. Further, as a semiamorphous semiconductor film, a semiamorphous silicon film obtained by a PCVD method using a gas mixture in which $SiH_4$ is diluted 1:3 to 1:1000 in $H_2$, a gas mixture in which $Si_2H_6$ is diluted with $GeF_4$ with a gas flow rate of 20:0.9 to 40:0.9 ($Si_2H_6$: $GeF_4$), or a gas mixture of $Si_2H_6$ and $F_2$ can be used. Note that a semiamorphous silicon film is preferably used since crystallinity can be given according to the interface with the base.

An n-type semiconductor film may be formed with a PCVD method using a silane gas and a phosphine gas, which can be formed with an amorphous semiconductor film or a semiamorphous semiconductor film. A contact resistance of the semiconductor film and an electrode (electrode to be formed in a later step) is decreased when an n-type semiconductor film 20 is provided, which is preferable. However, it may be formed if necessary.

Figure 9:
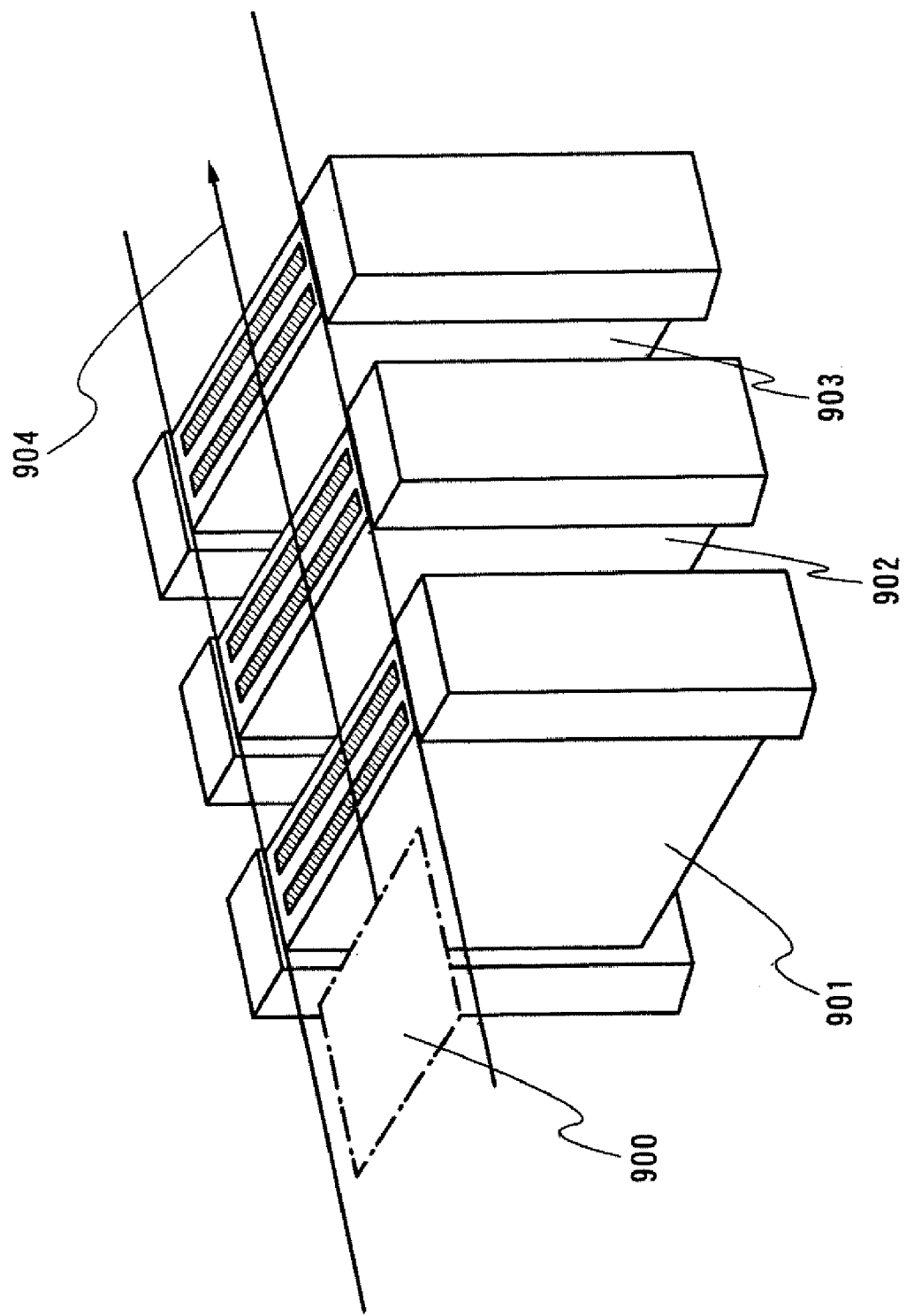
FIG. 9 is a perspective view showing a showing deposition device.

Note that the gate insulating film 18, the semiconductor film and the n-type semiconductor film are preferably formed selectively, which is possible with the use of the device shown in FIG. 9. A device shown in FIG. 9 conveys a substrate 900 with a face down method, and continual film formation is possible with atmospheric pressure plasma CVD devices 901, 902, and 903. A process gas introduction slit and a process gas discharge slit are provided in the atmospheric pressure plasma CVD devices 901, 902 and 903 respectively. A film can be formed when a substrate 900 passes near a region interposed between both the slits. Note that the process gas discharge slit is provided in upstream of a substrate transportation path 904 and the process gas introduction slit is provided in the downstream thereof. A device shown in FIG. 9 is capable of carrying out film formation after a part of the substrate 900 passes over the CVD device, one, of substrate. In a case of forming a gate insulating film over an entire surface, in an active matrix substrate for a liquid crystal display device, it is unnecessary to etch the gate insulating film in a pixel portion. It is necessary to remove the gate insulating film when the terminal electrode in a terminal portion is exposed. However, when the device shown in FIG. 9 is used, a gate insulating film which covers only a pixel portion can be obtained without forming a gate insulating film in a region where the terminal electrode in the terminal portion is provided.

Subsequently, a mask 21 is provided, and a semiconductor film and an n-type semiconductor film are etched selectively to obtain a semiconductor film 19 and an n-type semiconductor film 20 with an island shape (FIG. 1D). Either method illustrated in FIG. 1A and FIGS. 6A and 6B may be used as forming the mask 21.

Subsequently, a composition including a conductor (Ag (silver), Au (gold), Cu (copper), W (tungsten), Al (aluminum) or the like) is discharged by a droplet discharge method selectively to form a source or drain wirings 22 and 23. Similarly, a connection wire (not shown in the figure) is formed in the terminal portion (FIG. 1E). Alternatively, the source or drain wiring 22 and 23 may be formed by patterning after forming a metal film by a sputtering method, replacing by a droplet discharge method.

Subsequently, an n-type semiconductor film and an upper layer of a semiconductor film are etched with the used of the source or drain wirings 22 and 23 as masks to obtain a state illustrated in FIG. 2A. In this stage, a channel etch type TFT comprising a channel formation region 24, a source region 26 and a drain region 25 is completed.

Subsequently, a protective film 27 for preventing the channel formation region 24 from being contaminated by impurity is formed. For the protective film 27, a material mainly containing silicon nitride or silicon nitride oxide obtained with a sputtering method or a PCVD method is used. In addition, the protective film 27 may be formed with a CVD device shown in FIG. 9 selectively. Here, an example of forming a protective film is shown; however, it is not required to be provided if it is particularly necessary.

Subsequently, an interlayer insulating film 28 is selectively formed by a droplet discharge method. A resin material such as an epoxy resin, an acrylic resin, a phenol resin, a novolac resin, a melamine resin, or a urethane resin is used as the interlayer insulating film 28. In addition, the interlayer insulating film 28 is formed by a droplet discharge method with an organic material such as benzocyclobutene, parylene, flare, or light-transmitting polyimide; a compound material made from polymerization such as siloxane-based polymer; a composition material containing water-soluble homopolymer and water-soluble copolymer; or the like.

Subsequently, the protective film is etched using the interlayer insulating film 28 as a mask to form a projection (pillar) 29 including a conductor over a part of the source or drain wirings 22 and 23. The projection (pillar) 29 may be laminated by repeating discharging of a composition containing a conductor (Ag (silver), Au (gold), Cu (copper), W (tungsten), or Al (aluminum) or the like) and baking.

Subsequently, a pixel electrode 30 in contact with the projection (pillar) 29 is formed over the interlayer insulating film 28 (FIG. 1D). A terminal electrode 41 in contact with a wiring 40 is similarly formed. In case of manufacturing a light-transmitting liquid crystal display panel, a predetermined pattern formed of a composition containing indium tin oxide (ITO), indium tin oxide containing silicon oxide (ITSO), zinc oxide (ZnO), tin oxide ($SnO_2$) or the like may be formed by a droplet discharge method or a printing method and baked to form the pixel electrode 30 and the terminal electrode 41. In case of manufacturing a reflective liquid crystal display panel, the pixel electrode 30 and the terminal electrode 41 can be formed of a composition mainly containing particles of a metal such as Ag (silver), Au (gold), Cu (copper), W (tungsten), or Al (aluminum) by a droplet discharge method. As another method, a transparent conductive film or a light reflective conductive film is formed with a sputtering method, and a mask pattern is formed by a droplet discharge method; thus, the pixel electrode may be formed by further etching In case of forming a pattern of relatively large area such as the pixel electrode 30 by a droplet discharge method, there is a risk that a projection and a depression are caused. Accordingly, it is preferable that a surface of the pixel electrode 30 is planarized by hot-press with the pressing device shown in FIGS. 5A and 5B. Additionally, in case of using a material such as indium tin oxide (ITO) which requires baking for crystallization as a material of the pixel electrode 30, pressing and baking can be carried out simultaneously.

Figure 2:
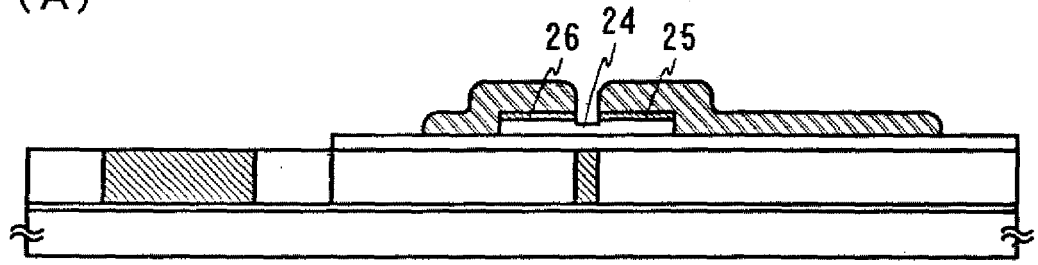
FIGS. 2A to 2D are cross-sectional views each showing a manufacturing step of AM-LCD.
Figure 2:
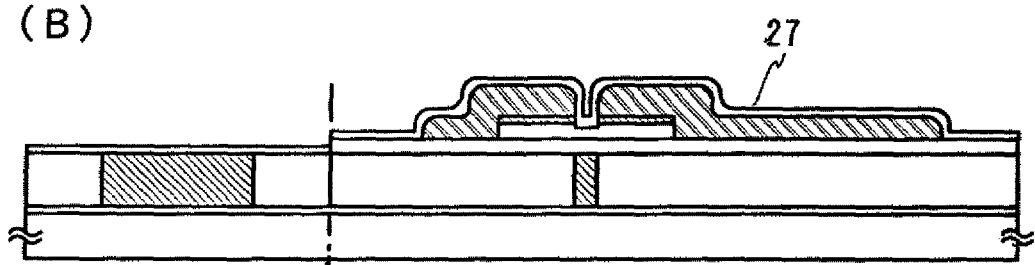
Figure 2:
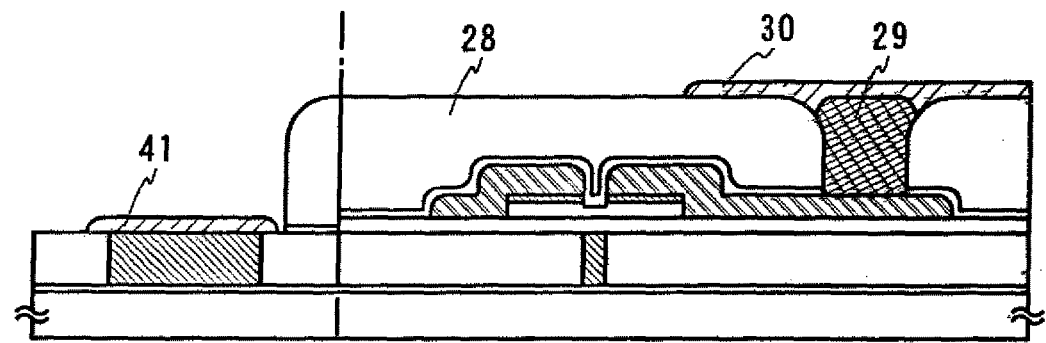
Figure 2:
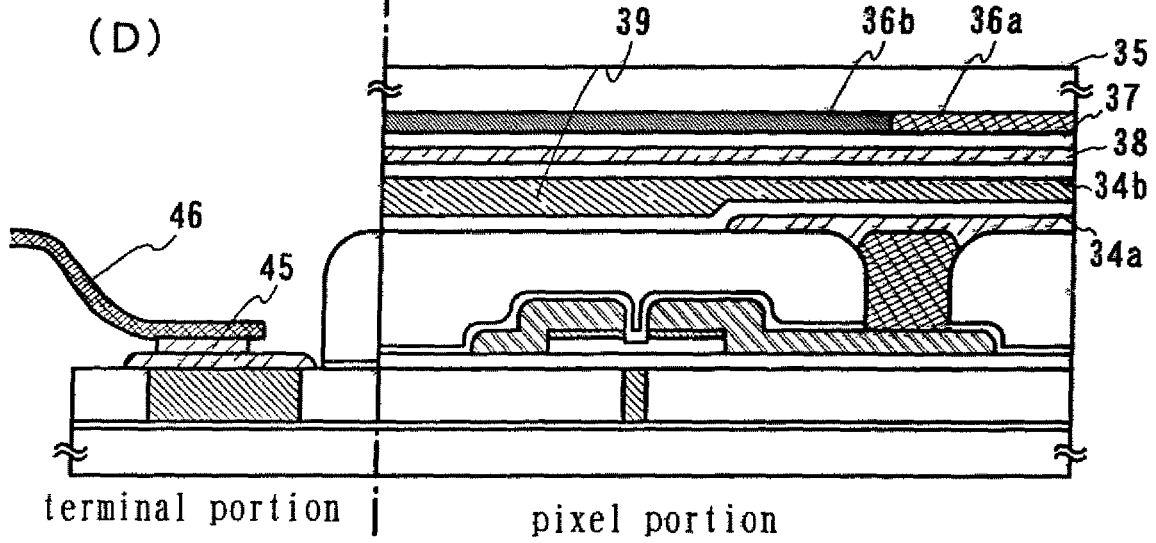
Figure 3:
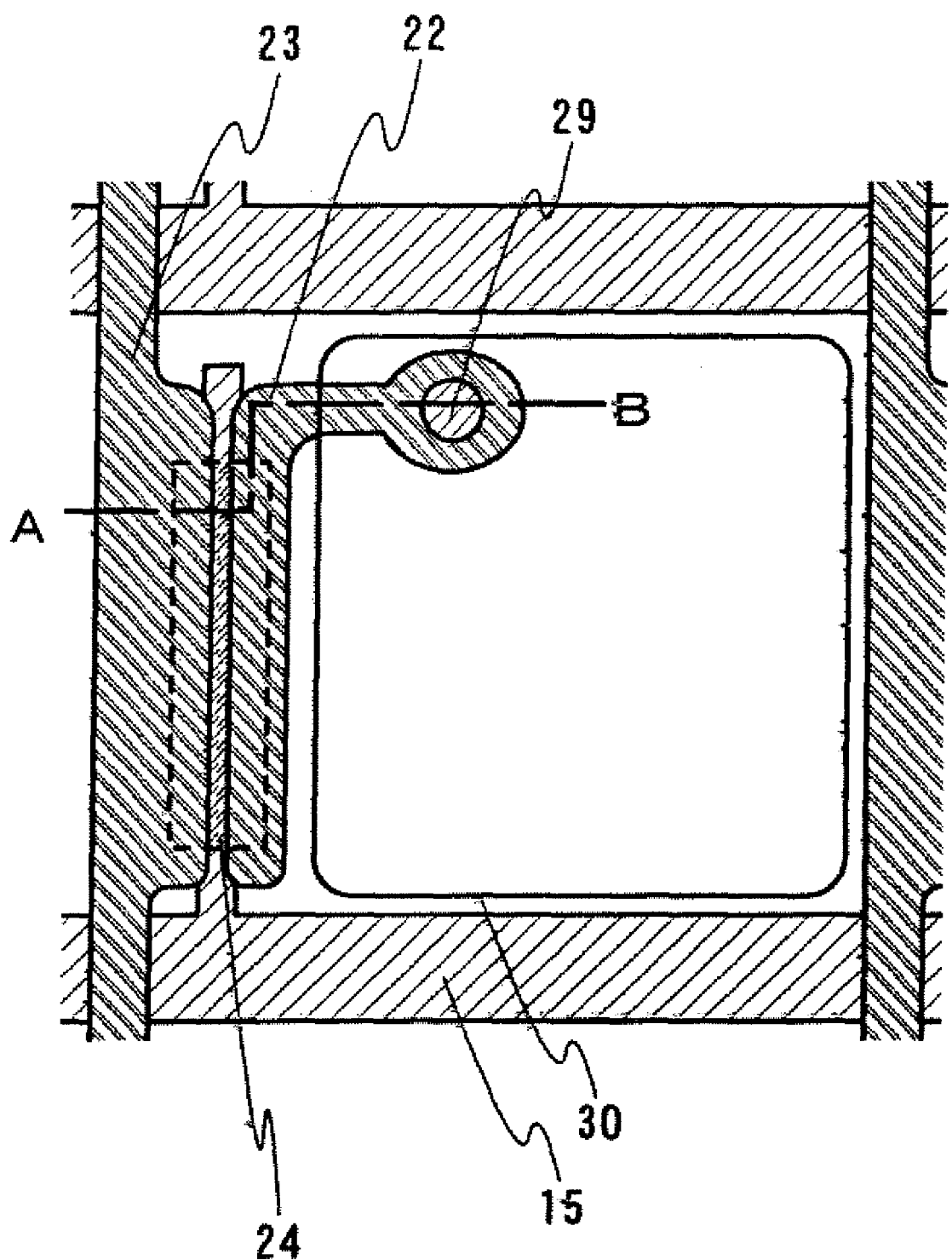
FIG. 3 is a top view showing a pixel.

FIG. 3 shows a top view of a pixel at a stage of FIG. 2D as an example. In FIG. 3, a cross-sectional view along with a chain line A-B corresponds with a cross-sectional view illustrated in FIG. 2D. Note that the same reference numerals are used as the corresponding parts.

An example in which the protective film 27 is provided is described here; therefore, the interlayer insulating film 28 and the projection (pillar) 29 are formed separately. However, in the case where the protective film is not provided, the interlayer insulating film 28 and the projection (pillar) 29 can be formed by the same device (for example, the device shown in FIGS. 7 and 8A to 8C) by a droplet discharge method.

An example in which the protective film 27 is provided is described here; therefore, the interlayer insulating film 28 and the projection (pillar) 29 are formed separately. However, in the case where the protective film is not provided, the interlayer insulating film 228 and the projection (pillar) 229 are formed by the same device (for example, the device shown in FIGS. 7 and 8A to 8C) by a droplet discharge method.

Figure 7:
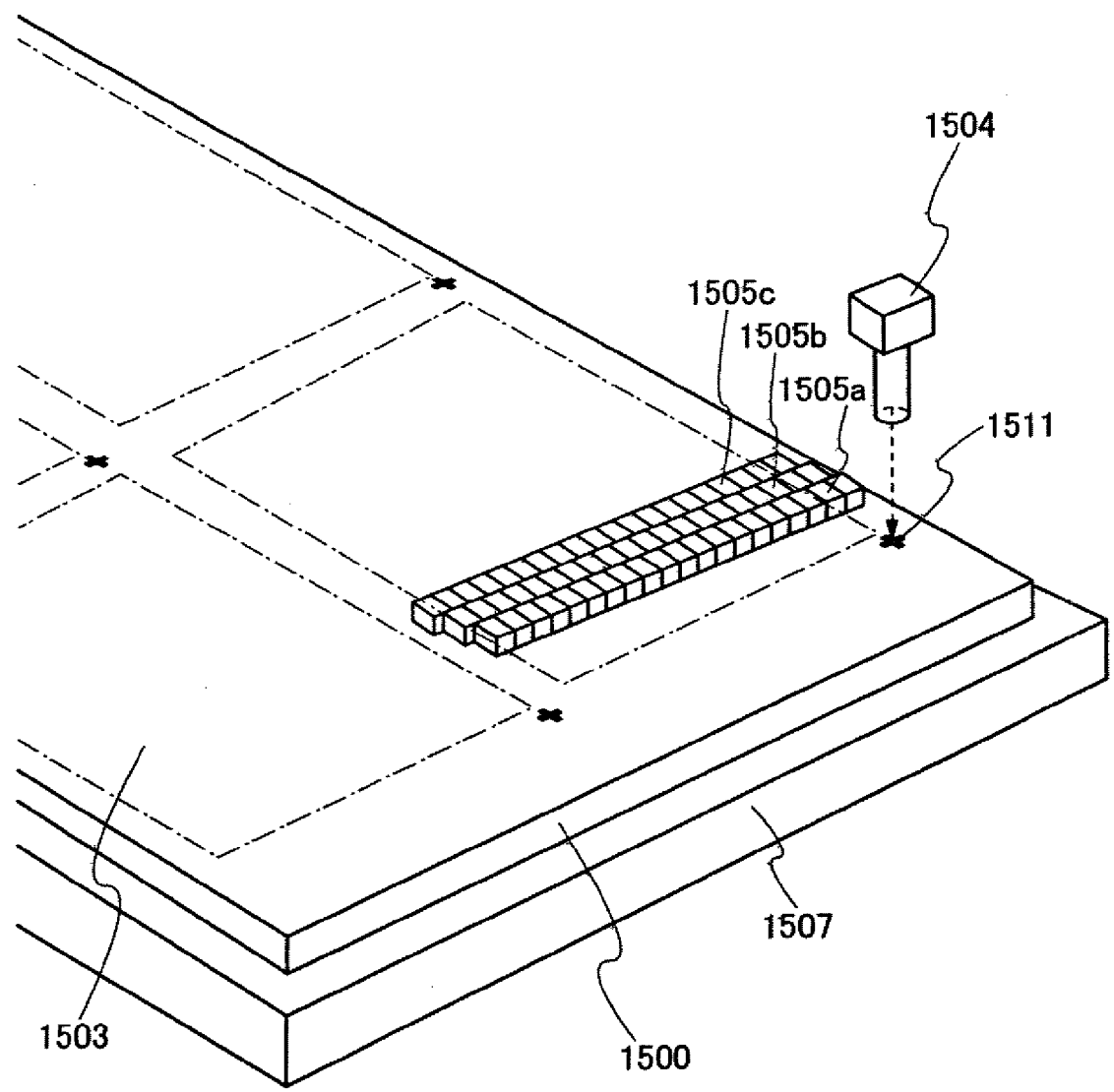
FIG. 7 is a perspective view showing a droplet discharge device.

In FIG. 7, reference numeral 1500 denotes a large-sized substrate; 1504, an imaging unit; 1507, a stage; 1511, a marker; 1503, a region where one panel is formed. The droplet discharge device provided with heads 1505a, 1505b and 1505c having the same width as one panel moves a stage to scan, for example, zigzag or reciprocate these heads; thereby, a pattern of a material layer suitably formed. It is possible to use heads with the same width as the large-sized substrate; however, it is easier to operate the heads while they are as wide as one panel of FIG. 7. In addition, for improving throughput, it is desirable to discharge a material while the stage is moved.

In addition, it is desirable to impart a thermoregulation function to the heads 1505a, 1505b and 1505c and a stage 1507.

Note that the spacing between the head (a nozzle tip) and the large-sized substrate is set to about 1 mm. Hitting accuracy can be enhanced by narrowing the spacing.

The heads 1505a, 1505b, and 1505c arranged in three lines perpendicular to the scan direction may discharge different materials for respective material layers, or may discharge one material. When one material is discharged from the three heads to form an interlayer insulating film having a pattern, the throughput is improved.

As to the device shown in FIG. 7, scan may be performed by moving a large-sized substrate 1500 while a head is fixed, or moving the head while the large-sized substrate 1500 is fixed.

Each of the heads 1505a, 1505b and 1505c of a droplet discharge unit is connected to a control unit, and the heads are controlled by a computer; thus, a preprogrammed pattern can be applied. A discharge amount is controlled by a pulse voltage to be applied. A droplet may be discharged in the timing based on a marker formed on the substrate. Alternatively, a position of discharging a droplet may be determined based on the edge of the substrate. Such reference point is detected by an imaging unit such as a CCD to be converted into a digital signal by an image processing unit. Then, it is recognized by a computer to generate a control signal, and the control signal is sent to a control unit. Of course, information of a pattern to be formed over the substrate is placed in a recording medium. Based on this information, the control signal is sent to the control unit and each head of the droplet discharge unit can be controlled individually.

Figure 8:
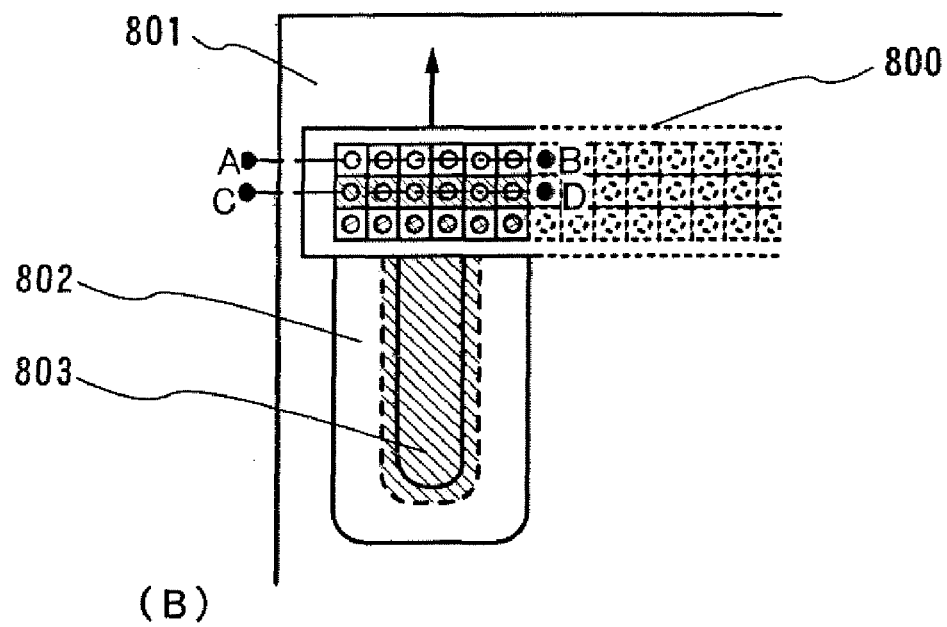
FIGS. 8A to 8C are views each showing a step of pattern formation by a droplet discharge method.
Figure 8:
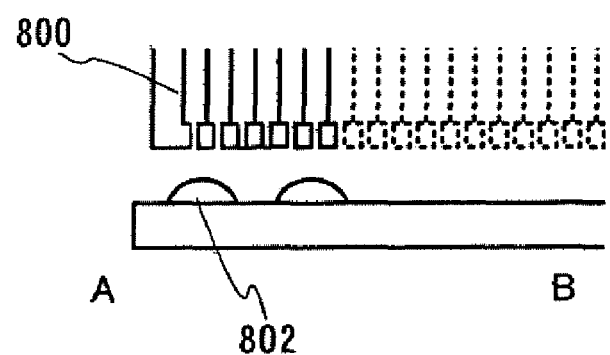
Figure 8:
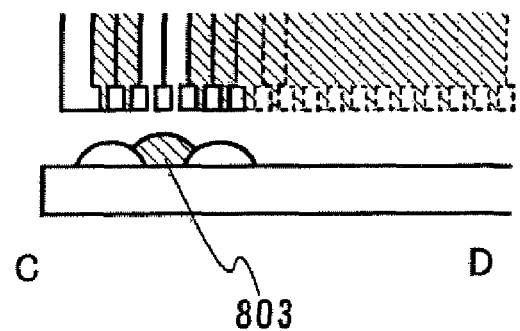

As shown in FIG. 8, in case of forming different materials are patterned simultaneously, a first material solution is discharged from nozzles in a first row of a nozzle unit 800 toward a substrate 801 to form a first material layer 802 in ahead. Subsequently, a second material solution is discharged from nozzles of a second row to form a second material layer 803. There is less pattern misalignment because of the same alignment. When thus discharging is carried out, and processing time is further shortened.

FIG. 8 is a top view showing a mid-flow as a pattern is formed; FIG. 8B is a cross-sectional view showing discharge from the first row; and FIG. 8C is a cross-sectional view showing discharge from the second row.

A discharging method shown in FIGS. 8A to 8C is effective even when the second material layer has high fluidity since the first material layer can prevent a droplet from diffusing.

In addition, a water-soluble resin and a mask material are formed by using the discharging method to obtain a state of FIG. 6A.

By the above-mentioned steps, a TFT substrate for a liquid crystal display panel, in which a bottom gate type (also referred to as inverted staggered type) TFT and a pixel electrode are formed over the substrate 10 is completed.

Subsequently, an orientation film 34a is formed so as to cover a pixel electrode 30. For the orientation film 34a, a droplet discharge method, a screen printing method or a offset printing method may be used. Afterwards, rubbing treatment is performed on a surface of the orientation film 34a.

Then, a counter substrate 35 is provided with a coloring layer 36a, a light shielding layer (black matrix) 36b and a color filter comprising an overcoat layer 37, and further, a counter electrode 38 comprising a transparent electrode and an orientation film 34b thereover. A sealant (not shown in the figure) with a closed pattern is then formed by a droplet discharge method so as to surround a region overlapped with a pixel portion. Here, an example in which a sealant with a closed pattern is formed by a droplet discharge method is shown in order to drop a liquid crystal in later step. A dip coating method (pumping up method) by which a liquid crystal is injected by using capillary phenomenon may be used after providing a seal pattern having an opening and pasting the TFT substrate and a counter substrate. In addition, a color filter can be formed by a droplet discharge method.

Next, a liquid crystal is dropped under reduced pressure so as to prevent bubbles from entering, and the both are pasted together. A liquid crystal is dropped once or several times in the closed-loop seal pattern. A twisted nematic (TN) mode is mostly used as an alignment mode of a liquid crystal. In this TFT mode, the alignment direction of liquid crystal molecules is twisted at 90° according to the polarization of light from its entrance to the exit. In case of manufacturing a TN liquid crystal display device, the substrates are pasted together so that the rubbing directions are orthogonalized.

The spacing between the pair of substrates with a liquid crystal 39 interposed therebetween may be maintained by spraying a spherical spacer, forming a columnar spacer comprising resin, or mixing a filler into the sealant. The above-mentioned columnar spacer is formed of an organic resin material mainly containing at least one material selected from acrylic, polyimide, polyimideamide, and epoxy; any one material of silicon oxide, silicon nitride, and silicon oxynitride; or an inorganic material composed of a film stack of these materials.

Next, an unnecessary substrate is divided. In case of obtaining a plurality of panels from one substrate, each panel is separated off. In case of obtaining one panel from one substrate, the separation step can be skipped by pasting a counter substrate which is cut in advance.

An FPC 46 is pasted to the terminal electrode 41 with an anisotropic conductive layer 45 therebetween by a known method. A liquid crystal module is completed through the above steps (FIG. 2D). Further, an optical film is provided as necessary. In case of a transmissive liquid crystal display device, polarizers are respectively pasted to both an active matrix substrate and a counter substrate.

As described above, according to this embodiment mode, the light exposure step using a photomask by a droplet discharge method is skipped; thus, the process can be simplified and the time of manufacture can be reduced. A liquid crystal display panel can be easily manufactured by even using a glass substrate after five generations, one side of which exceeds 1000 mm by forming each kind of pattern directly on a substrate by a droplet discharge method. A large-area panel can be manufactured since an embedded wiring with low resistance can be formed by using a droplet discharge method.

In this embodiment mode, a process in which spin coating is not carried out, and a light exposure with using a photomask is not carried out as possible. However, without limitation, a part of patterning may be performed by a light exposure step using a photomask.

Embodiment Mode 2

Here, an example of manufacturing an active matrix light emitting display device using a channel etch type TFT as a switching element is shown in FIGS. 20A to 20E and 21A to 21D.

First, similarly to Embodiment Mode 1, a base layer 211 for improving adhesiveness with a material layer formed later over a substrate 210 by a droplet discharge method.

A material selected from the group consisting of a 3d transition metal (Sc, Ti, Cr, Ni, V, Mn, Fe, Co, Cu, Zn or the like), an oxide of said transition metal, a nitride of said transition metal, and an oxynitride of said transition metal can be used as the base layer 211, without being limited to photo-catalystic material.

Besides a non-alkaline glass substrate such as a barium borosilicate glass, an alumino borosilicate glass, or alumino-silicate glass manufactured with a fusion method or a floating method, a plastic substrate or the like having the heat resistance that can withstand processing temperature of this manufacturing step can be used as the substrate 210.

Subsequently, similarly to Embodiment Mode 1, an insulating film is formed over an entire surface with a sputtering method, a CVD method or a droplet discharge method.

As this insulating film, an inorganic material (silicon oxide, silicon nitride, silicon oxynitride or the like), a photo-sensitive, a non-photosensitive organic material (polyimide, acrylic, polyamide, polyimide amide, a resist or benzocyclobutene) or a lamination layer thereof or the like can be used. Alternatively, a SiOx film including an alkyl group obtained by using siloxane-based polymer may be used as this insulating film. According to the thickness of insulating film, a thickness of a gate wiring to be formed later and electrical resistivity are determined. In case of manufacturing a light emitting display device having a large screen, the gate wiring with a low resistance is preferably formed; therefore, the insulating layer may be thickened, for example, may be thickened to from 1 μm to 100 μm. Here, a thickness of the insulating film is set 5 μm. Note that an insulating film with preferable adhesiveness is formed by the base layer 211.

Subsequently, similarly to Embodiment Mode 1, a mask 213 comprising photosensitive resin (typically a resist) is formed. The mask 213 is formed by using a droplet discharge method or a printing method (relief printing, flat plate, copperplate printing, screening or the like).

Figure 20:
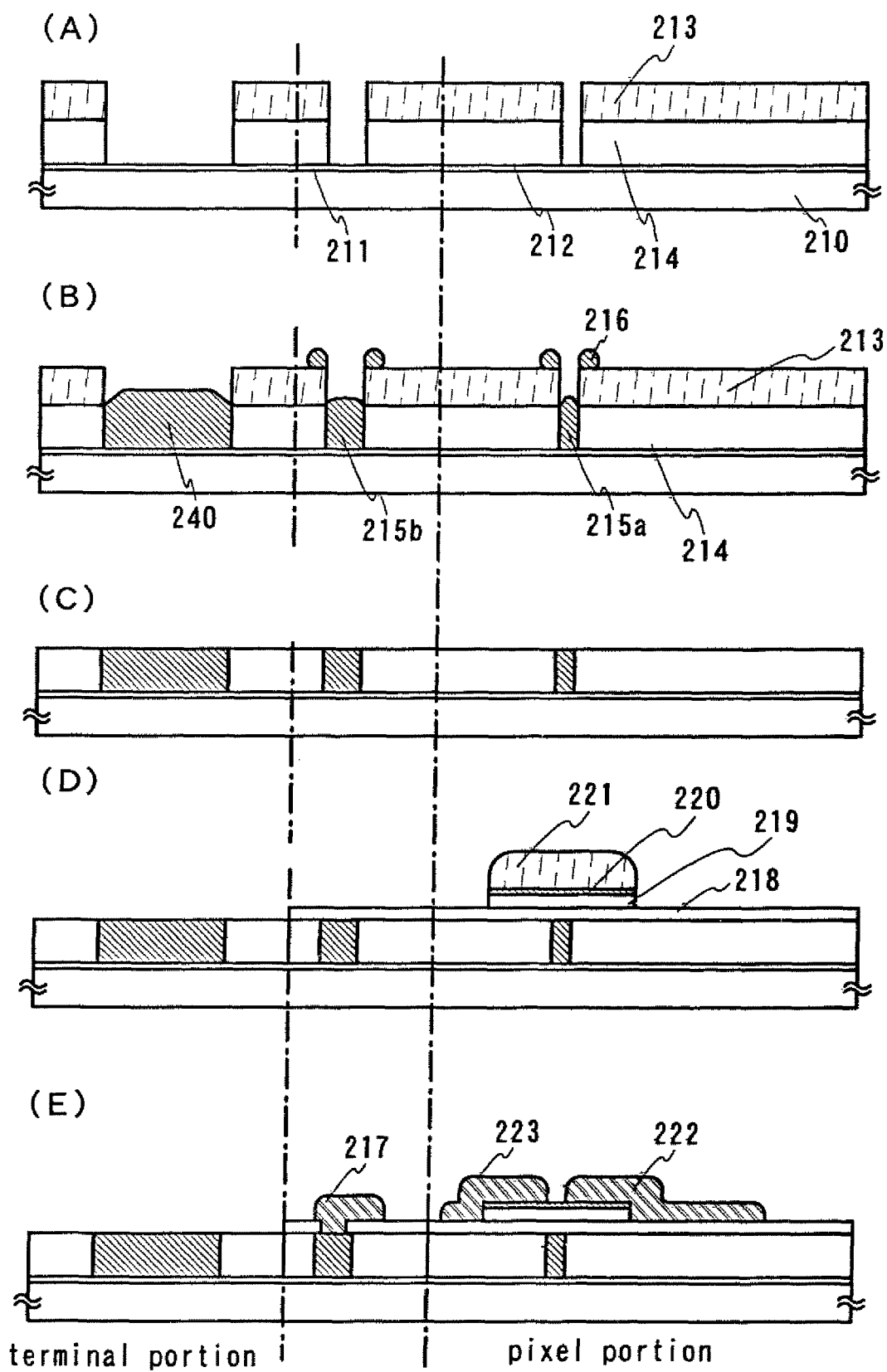
FIGS. 20A to 20E are cross-sectional views each illustrating a step of manufacturing a light emitting device.

Similarly to Embodiment Mode 1, an insulating layer 214 is formed by selectively etching the insulating film to form a depression 212 (FIG. 20A). In this etching, a material of an insulating film, an etchant or an etching gas are suitably adjusted so that the base layer 211 functions as an etching stopper.

Then, similarly to Embodiment Mode 1, material solution is dropped to the depression by a droplet discharge method, typically an ink-jet method, with the mask 213 left. Afterwards, baking is carried out in an oxygen atmosphere, thereby forming metal wirings 215a and 215b to be a gate electrode or a gate wiring (FIG. 20B). In FIG. 20B, the metal wiring 215a denotes an electrode overlapped with a semiconductor layer formed later; the metal wiring 215b, a wiring in contact with an upper wiring. The width of the metal wiring 215b is wider than that of the metal wiring 215a in order to have a contact with the upper wiring. Here, the width of the metal wiring 215b is set 4 μm, and the width of the metal wiring 215a is set 2 μm.

Since a depression is formed by the insulating layer 214 in advance, an accurate pattern shape, particularly the metal wiring 215a with a small width can be obtained. Additionally, a wiring with a large width can be obtained at the same time. Note that FIG. 20B shows a state of a substrate before temporary baking. Even if an extra droplet 216 is left on the mask 213, it can be removed simultaneously with mask in a later step of removing mask since baking can be curried out separately from the metal wiring by setting the mask lyophobic.

A wiring 240 extending toward a terminal portion is formed in the same manner as the metal wirings 215a and 215b. Not shown here, a power supply line for providing a current to a light emitting element may be formed. Further, a capacitor electrode or a capacitor wiring for forming a storage capacitor is formed, if necessary.

In addition, adhesiveness of a metal layer can be improved also on a sidewall by making the insulating layer 214 lyophilic or making the sidewall of the insulating layer 214 lyophilic.

Subsequently, similarly to Embodiment Mode 1, the mask 213 comprising a resist is removed. In this stage, a metal layer may be upheaved higher than a surface of the insulating layer.

Subsequently, similarly to Embodiment Mode 1, a planarizing process, for example a press treatment or a CMP is carried out (FIG. 20C. An exposure surfaces of the metal wirings 215a and 215b are conformed to an exposure surface of the insulating layer 214 by a planarization with pressing. Each of the patterns of the metal wirings 215a and 215b are not stretched since the insulating layer 214 maintains the thickness and width after pressing. Baking can be carried out in a short time by pressing a temporary-baked substrate and heating up to a baking temperature with the substrate pressed. In a large-area substrate, a huge baking chamber is required; therefore, a bake processing time is likely to get longer when whole baking chamber is heated.

Figure 23:
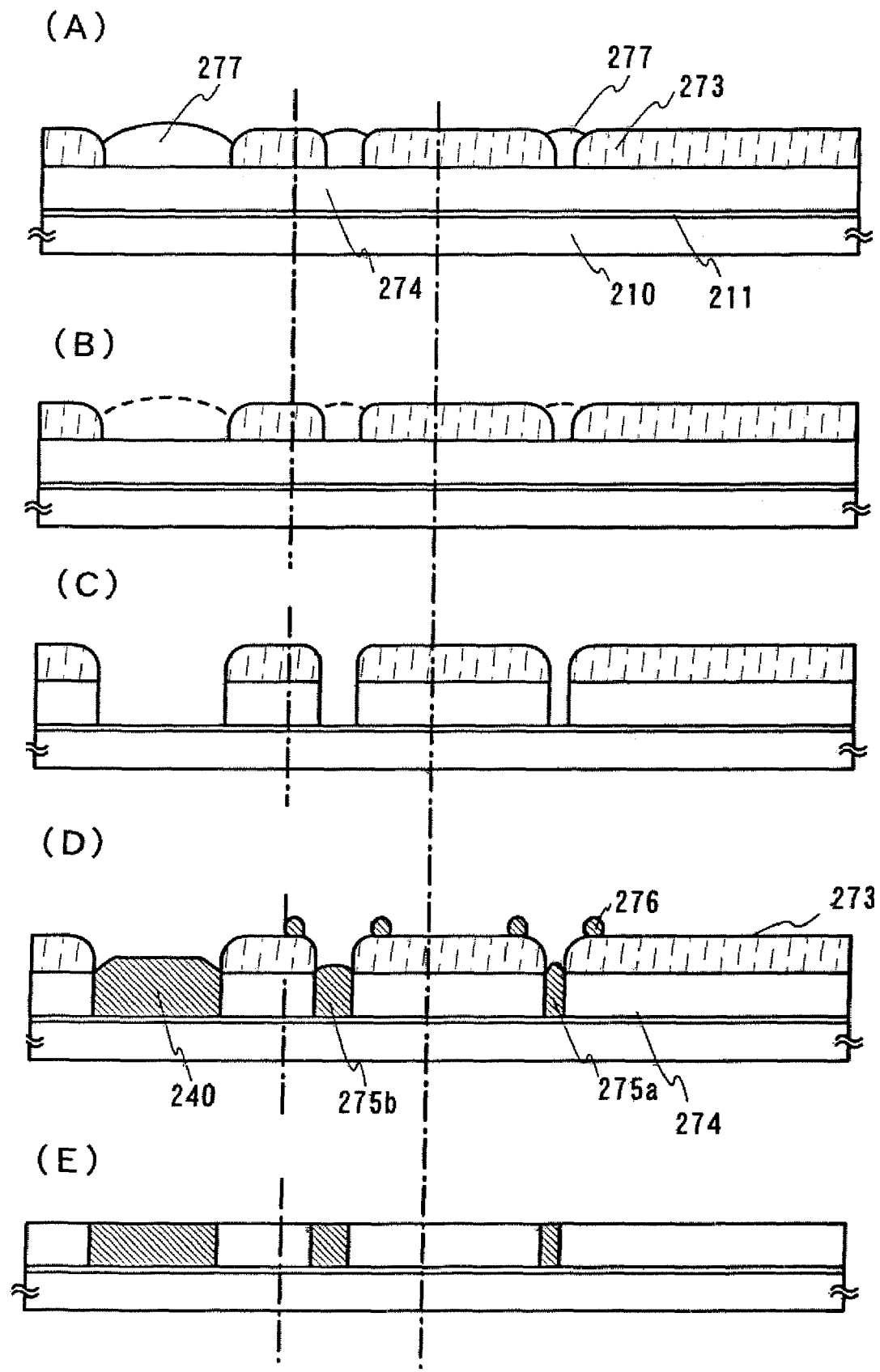
FIGS. 23A to 23E are cross-sectional views each illustrating a step for forming a mask.

Here, another manufacturing process is described with reference to FIGS. 23A to 23E. In a droplet discharge method, a device capable of discharging materials of different kind from a plurality of nozzles is used. A step in which the base layer 211 is formed over the substrate 210 to form an insulating layer 274 is the same as the above-mentioned steps; therefore, it is not described. A water-soluble resin 277 and a mask 273 comprising a resist are discharged over the insulating layer 274 with the same device as illustrated in FIG. 23A The water-soluble resin 277 is used for preventing pattern deformation in the case where a resist material has high fluidity or in the case where the resist material increases its fluidity in baking. Additionally, the water-soluble resin 277 protects a region where resist is unnecessary, for example a periphery of the substrate. Then, after baking or photo-curing, washing is carried out with water to remove the water-soluble resin alone as illustrated in FIG. 23B. Note that FIG. 23B shows a state before temporary baking. By using thus obtained mask 273, a fine pattern may be obtained by selectively etching the insulating layer 274 as illustrated in FIG. 23C. Subsequently, wirings 275a, 275b and 240 are formed by a droplet discharge method as illustrated in FIG. 6D, and an extra droplet 276 adhering to the mask 273 and the mask are removed simultaneously; Afterwards, planarization is carried out by pressing as illustrated in FIG. 23E. In case of adopting a process of forming a resist mask illustrated in FIGS. 23A to 23E, the mask 273 has a structure in which the end thereof has a curvature. Accordingly, the spacing between the extra droplet 276 and the wiring 275a can be further broadened. The water-soluble resin is described as an example. However, without limiting thereto, after forming a material including a solvent other than water, which is insoluble in a mask, the material alone may be solved in the solvent.

Either of the steps shown in FIGS. 23A to 23E or FIGS. 20A to 20C may be used.

Subsequently, similarly to Embodiment Mode 1, a gate insulating film 218, a semiconductor film and an n-type semiconductor film are formed sequentially by using a plasma CVD method or a sputtering method. In this embodiment mode, an embedded wiring having a flat surface even over a wiring is used; therefore, a coverage defect is not occurred even when each film thickness is small. For example, a thickness of the gate insulating film 218 can be set from 1 nm to 200 nm by using a plasma CVD method or a sputtering method, for example.

The semiconductor film is formed with an amorphous semiconductor film or a semiamorphous semiconductor film which is manufactured with a vapor phase growth method, a sputtering method or a thermal CVD method using a semiconductor material gas typified by silane and germanium.

An n-type semiconductor film may be formed with a PCVD method using a silane gas and a phosphine gas, which can be formed with an amorphous semiconductor film or a semiamorphous semiconductor film. A contact resistance of the semiconductor film and an electrode (electrode to be formed in a later step) is decreased when an n-type semiconductor film 220 is provided, which is preferable. However, it may be formed if necessary.

The gate insulating film 218, the semiconductor film, and the n-type semiconductor film are preferably formed selectively, which is possible by using the device shown in FIG. 9.

Subsequently, similarly to Embodiment Mode 1, a mask 221 is provided, and the semiconductor film and the n-type semiconductor film are etched selectively to obtain a semiconductor film 219 and an n-type semiconductor film 220 with an island shape (FIG. 20D).

Subsequently, a gate insulating film is selectively etched by providing a mask to form a contact hole. In an active matrix light emitting device, a plurality of TFTs is arranged in one pixel and connected with an upper wiring through a gate electrode and a gate insulating film.

Subsequently, a composition including a conductor (Ag (silver), Au (gold), Cu (copper), W (tungsten), Al (aluminum) or the like) is discharged by a droplet discharge method selectively to form source or drain wirings 222 and 223 and a lead-out electrode 217. Similarly, a power supply line for applying current to a light emitting element and a connection wire (not shown in the figure) are formed in the terminal portion (FIG. 20E). Alternatively, the source or drain wirings 222 and 223 and the lead-out electrode 217 may be formed by patterning after forming a metal film by a sputtering method, replacing by a droplet discharge method.

Subsequently, the n-type semiconductor film and an upper layer of the semiconductor film are etched with the used of the source or drain wirings 222 and 223 as masks to obtain a state illustrated in FIG. 21A. In this stage, a channel etch type TFT comprising a channel formation region 224, a source region 226 and a drain region 225 to be active layers is completed.

Subsequently, a protective film 227 for preventing the channel formation region 224 from being contaminated by impurity is formed (FIG. 20B). For the protective film 227, a material mainly containing silicon nitride or silicon nitride oxide obtained with a sputtering method or a PCVD method is used. In addition, the protective film 227 may be formed with the CVD device shown in FIG. 9 selectively. Here, an example of forming a protective film is shown; however, it is not required to be to be provided if it is particularly necessary.

Subsequently, an interlayer insulating film 228 is selectively formed by a droplet discharge method. A resin material such as an epoxy resin, an acrylic resin, a phenol resin, a novolac resin, a melamine resin, or a urethane resin is used as the interlayer insulating film 228. In addition, the interlayer insulating film 228 is formed by a droplet discharge method by using an organic material such as benzocyclobutene, parylene, flare, or light-transmitting polyimide; a compound material made from polymerization such as siloxane-based polymer; a composition material containing water-soluble homopolymer and water-soluble copolymer; or the like.

Then, the protective film is etched by using the interlayer insulating film 228 as a mask to form a projection (pillar) 229 comprising a conductor over a part of the source or drain wirings 222 and 223. The projection (pillar) 229 may be laminated by repeating discharging of a composition containing a conductor (Ag (silver), Au (gold), Cu (copper), W (tungsten), or Al (aluminum) or the like) and baking.

Subsequently, a first electrode 230 in contact with the projection (pillar) 229 is formed over the interlayer insulating film 228 (FIG. 21C). A terminal electrode 241 in contact with a wiring 240 is similarly formed. An example in which a driving TFT is an n-channel type is described here; therefore, the first electrode 230 preferably functions as a cathode. In the case where a first electrode has light-transmitting properties, a predetermined pattern formed of a composition mainly containing metal particles such as indium tin oxide (ITO), indium tin oxide containing silicon oxide (ITSO), zinc oxide (ZnO), tin oxide ($SnO_2$) is formed by a droplet discharge method or a printing method and baked to form the first electrode 230 and a terminal electrode 241. In the case where first electrode is reflective, the first electrode 230 and the terminal electrode 241 can be formed of a composition mainly containing particles of a metal such as Ag (silver), Au (gold), Cu (copper), W (tungsten), or Al (aluminum) by a droplet discharge method. As another method, a transparent conductive film or a light reflective conductive film is formed with a sputtering method, and a mask pattern is formed by a droplet discharge method; thus, the first electrode 230 may be formed by further etching.

Figure 21:
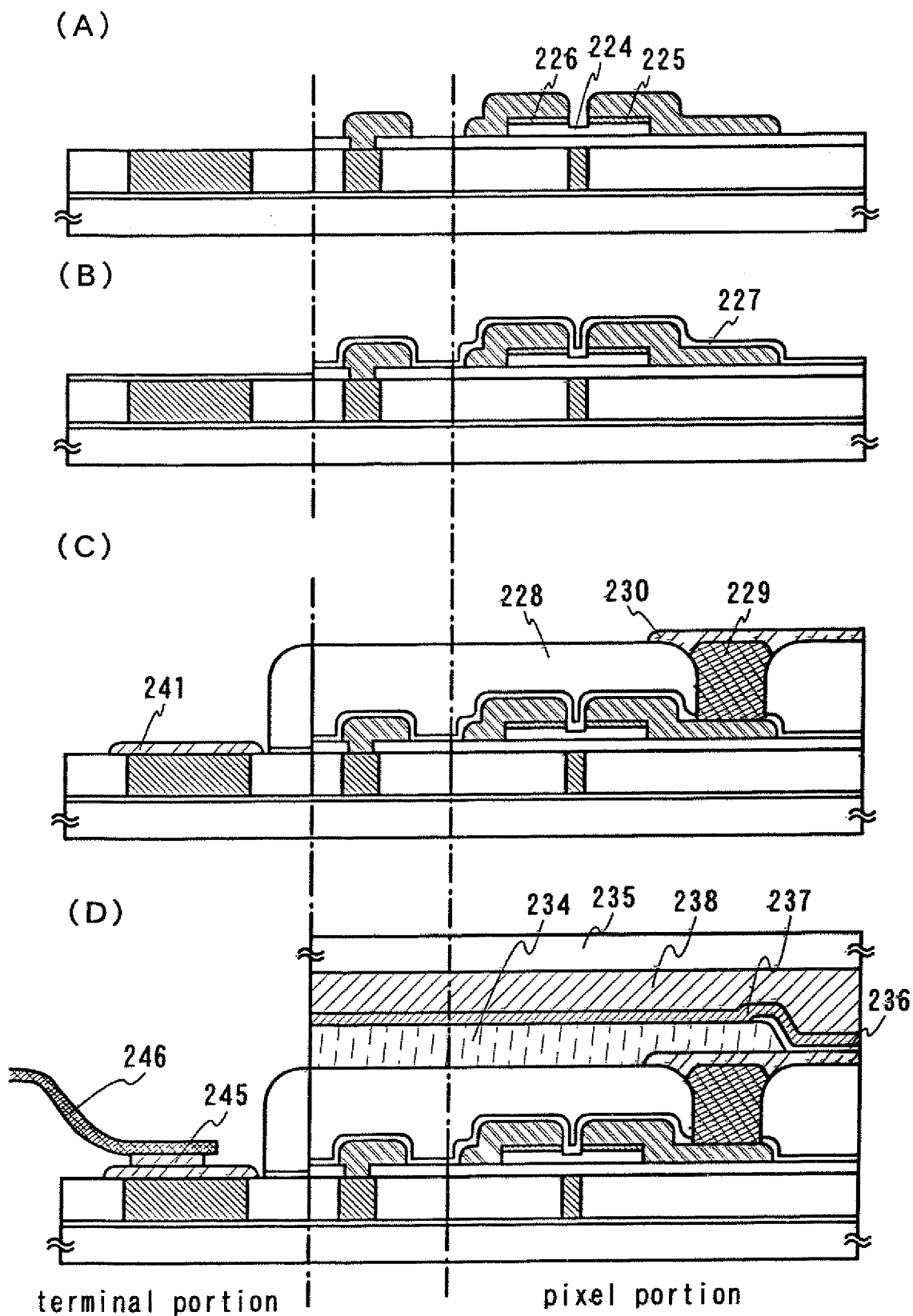
FIGS. 21A to 21D are cross-sectional views each illustrating a step of manufacturing a light emitting device.
Figure 22:
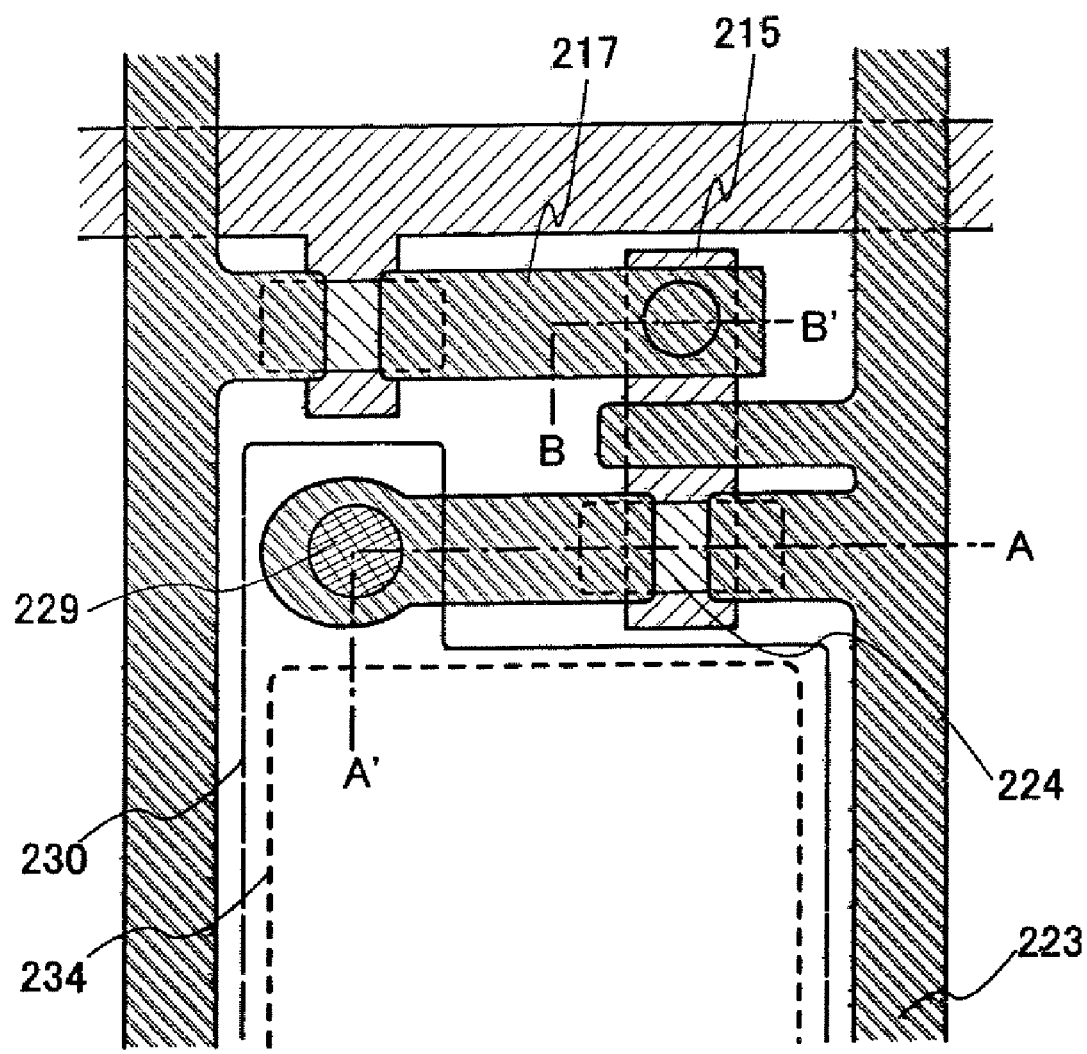
FIG. 22 is a top view showing a pixel.

FIG. 22 shows a top view of a pixel in a stage of FIG. 21C an example. In FIG. 22, a cross-section along with a chain line A-A' corresponds with a cross-sectional view of the right side of a pixel portion in FIG. 21C, and a chain line B-B' corresponds with a cross-sectional view of the left side of the pixel portion in FIG. 21C. Note that in FIG. 22, the same reference numerals are used as the parts corresponding parts in FIGS. 20A to 20E and 21A to 22D. In FIG. 22, a part to be an edge of a sidewall 234 which is formed later is shown with a dotted line.

In case of forming a pattern of relatively large area such as the first electrode 230 by a droplet discharge method, there is a risk that a projection and a depression are caused. Accordingly, it is preferable that a surface of the first electrode 230 is planarized by hot-press with the pressing device shown in FIGS. 5A and 5B. Additionally, in case of using a material such as indium tin oxide (ITO) which requires baking for crystallization as a material of the first electrode 230, pressing and baking can be carried out simultaneously.

An example in which the protective film 227 is provided is described here; therefore, the interlayer insulating film 228 and the projection (pillar) 229 are formed separately. However, in the case where the protective film is not provided, the interlayer insulating film 228 and the projection (pillar) 229 can formed by the same device (for example, the device shown in FIGS. 7 and 8A to 8C) by a droplet discharge method.

Then, a partition 234 covering a periphery of the first electrode 230 is formed. The partition (also referred to as a bank) 234 is formed by using a material containing silicon, an organic material and an inorganic material. In addition, a porous film may be used. It is preferable that a photosensitive or non-photosensitive material such as acryl, polyimide or the like is used since a radius of curvature of the side surface is serially varies without any break in a thin film in an upper layer.

According to the above-mentioned steps, a TFT substrate for a light emitting display panel in which a bottom gate type TFT (also referred to as an inverted staggered type TFT) and first electrode are formed over the substrate 210 is completed.

Subsequently, a layer functioning as an electroluminescent layer, namely, a layer 236 containing an organic compound is formed. The layer 236 containing an organic compound has a laminated structure, and each layer is formed by using a vapor deposition method or a coating method, respectively. For example, it is sequentially laminated in order of an electron transport layer, a light emitting layer, a hole transport layer, a hole inject layer over a cathode. Note that plasma treatment in oxygen atmosphere or heating treatment in vacuum atmosphere is preferably carried out before forming the layer 236 containing an organic compound. In case of using a vapor deposition method, an organic compound is vaporized beforehand by resistive heating, and it is scattered in a direction of the substrate by which a shutter is opened in vapor deposition. The vaporized organic compound is scattered above to be evaporated on the substrate through an opening provided in a metal mask. In addition, a mask may be aligned every luminous color (R, G and B) for full-colorization.

In addition, full color can be displayed by using a material exhibiting monochrome emission as the layer 236 containing an organic compound, and combining the layer 236 with a color filter or a color conversion layer without color-coating. For example, in case of forming an electroluminescent layer exhibiting white or orange emission, full color can be displayed by separately providing a color filter or a fill color filter, a color conversion layer, the combination thereof. The color filter and the color conversion layer may be formed over a second substrate (sealing substrate) to be pasted with the substrate. As described above, any of the material exhibiting monochrome emission, the color filter and the color conversion layer an be formed by a droplet discharge method.

Of course, monochrome emission may be displayed. For example, a light emitting display device of an area collar type may be formed by means of monochrome emission. A passive matrix display portion is suitable for the light emitting display device of an area color type and can mainly display characters and symbols.

Subsequently, the second electrode 237 is formed. The second electrode 237 functioning as an anode of a light emitting element is formed by using a transparent conductive film which transmits light. For example, besides ITO or ITSO, a transparent conductive film in which zinc oxide (ZnO) of 2% to 20% is mixed with indium oxide is used. A light emitting element has a structure in which the layer 236 containing an organic compound is interposed between the first electrode and the second electrode. In addition, the first and second electrodes are required to set the material thereof considering a work function. Both the first and second electrodes may be an anode or a cathode depending on a pixel structure.

In order to decrease resistance of the second electrode 237, a supporting electrode may be provided over a second electrode of a region which is not to be a light emitting region.

In addition, a protective layer protecting the second electrode 237 may be formed. For example, a protective film comprising a silicon nitride film can be formed by using a disciform target containing silicon and making atmosphere of a film formation chamber nitrogen atmosphere or atmosphere containing nitrogen and argon. Additionally, a thin film mainly containing carbon (DLC film, CN film or amorphous carbon film) is formed as a protective film, and a film formation chamber using a CVD method may be separately provided. A diamond like carbon film (also referred to as a DLC film) can be formed with a plasma CVD method (typically, a RF plasma CVD method, a microwave CVD method, a electron cyclotron resonance (ECR) CVD method, a hot-filament CVD method or the like), a combustion flame method, a sputtering method, an ion beam evaporation method, a laser beam evaporation method or the like. A hydrogen gas and a hydrocarbon group gas (for example, $CH_4$, $C_2H_2$, $C_6H_6$ or the like) are used as a reactive gas for film formation, which are ionized by glow discharge, and resultant ions are accelerated and impacted to the cathode which is negatively self-biased to form a film. A CN film may be formed by using a $C_2H_4$ gas and a $N_2$ gas as reaction gases. The DLC film and the CN film are insulating films, which are transparent or translucent with respect to visible light. The transparency with respect to the visible light means that a transmittance of the visible light ranges from 80% to 100%, and the translucence means that a transmittance of the visible light ranges from 50% to 80%. Note that the protective film is not particularly provided if it is not required.

Subsequently, the scaling substrate 235 is pasted with a sealant (not shown in the figure), to seal the light emitting element. A region surrounded with sealant is filled with a transparent filler 238. As the filler 238, it is not particularly limited as long as it has light-transmitting properties, and ultraviolet curing epoxy resin or a heat curing may be typically used. A highly heat resistant UV curing epoxy resin (product name 2500 Clear, manufactured by Electrolite Cooperation) having a refractive index of 1.50, a viscosity of 500 cps, a Shore D hardness of 90, a tensile strength of 3000 psi, a Tg point of 150° C., a volume resistivity of $1\times10^{15}$ Ω·cm, and a withstand voltage of 450 V/mil is used here. By filling the filler 238 between a pair of substrates, a total transmittance can be improved.

An FPC 246 is pasted to a terminal electrode 241 with an aerotropic conductive film 245 interposed therebetween by using a known method (FIG. 21D).

According to the above-mentioned steps, an active matrix light emitting device can be manufactured.

Figure 24:
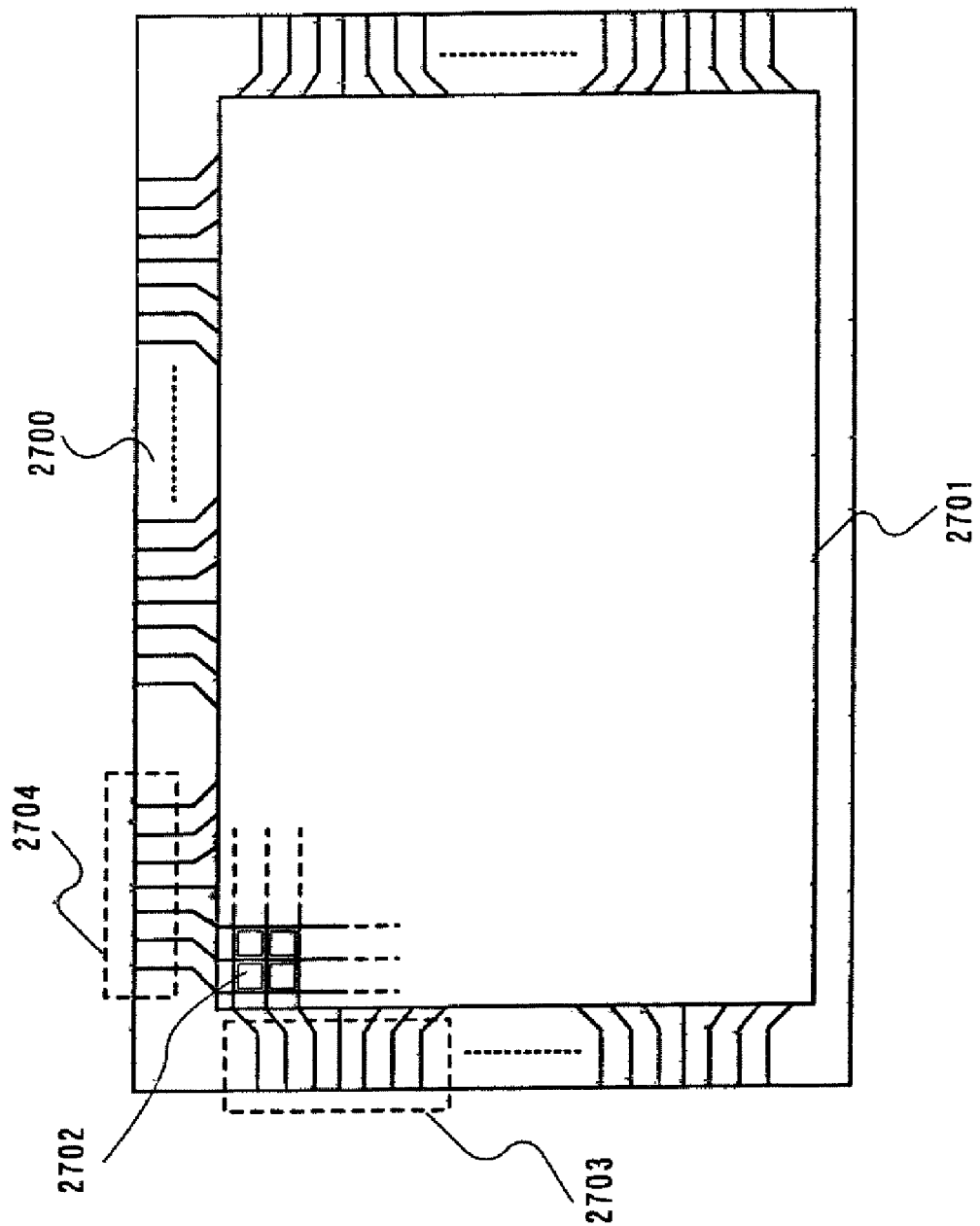
FIG. 24 is a top view showing a light emitting display device according to a certain aspect of the present invention.

FIG. 24 is a top view showing an example of a structure of an EL display panel. FIG. 24 shows a structure of a light emitting display panel in which a signal to be imputed to a scan line and a signal line is controlled by an external driver circuit. Over a substrate 2700 with an insulating surface, a pixel portion 2701 in which pixels 2702 are arranged in matrix, a scan line side input terminal 2703 and a signal line side input terminal 2704 are formed. The number of pixels may be provided according to various standards. The number of pixels of XGA may be 1024×768×3 (RGB), that of UXGA may be 1600×1200×3 (RGB), and that of a full-speck high vision may be 1920×1080×3 (RGB).

The pixels 2702 are arranged in a matrix by intersecting scan lines extended from the scan line input terminal 2703 with a signal lines extended from the signal line input terminal 2704. Each pixel 2702 is provided with a switching element and a pixel electrode connected thereto. A typical example of the switching element is a TFT. A gate electrode side of a TFT is connected to the scan line, and a source or drain side thereof is connected to the signal line; therefore, each pixel can be controlled independently by a signal inputted from outside.

When the first electrode is formed of a transparent material and the second electrode is formed of a metal material, a structure in which light is emitted through the substrate 210, namely, a bottom emission structure is obtained. Alternatively, when the first electrode is formed of a metal material and the second electrode is formed of a transparent material, a structure in which light is emitted through the sealing substrate 235, namely, a top emission structure is obtained. Furthermore, when the first and second electrodes are formed of a transparent material, a structure in which light is emitted through both the substrate 210 and scaling substrate 235 is obtained. The present invention may suitably adopt any one of the above-mentioned structures.

As mentioned above, in this embodiment mode, a shortened manufacturing time and a simplified manufacturing step can be realized by omitting a light-exposure step using a photomask by a droplet discharge method. In addition, an EL display device can be easily manufactured by forming each kind of patterns directly on a substrate by a droplet discharge method by even using a glass substrate after fifth generation, one side of which exceeds 1000 mm is used. Further, a large-area panel can be manufactured since an embedded wiring with low resistance can be formed by using a droplet discharge method.

In this embodiment mode, a step in which spin coat is not carried out, and a light-exposure step with a photomask is avoided as much as possible. However, without limitation, a part of patterning may be carried out in the light-exposure step using a photomask.

This embodiment mode can be freely combined with Embodiment Mode 1.

The invention comprising the above-mentioned structures are described in more detail with following embodiments.

Embodiment 1

The pixel structure shown in FIG. 3 is an example of forming a gate wiring and a gate electrode integrally. In this embodiment, the example of forming the gate wiring and the gate electrode separately is shown in FIGS. 10A and 10B.

Figure 10:
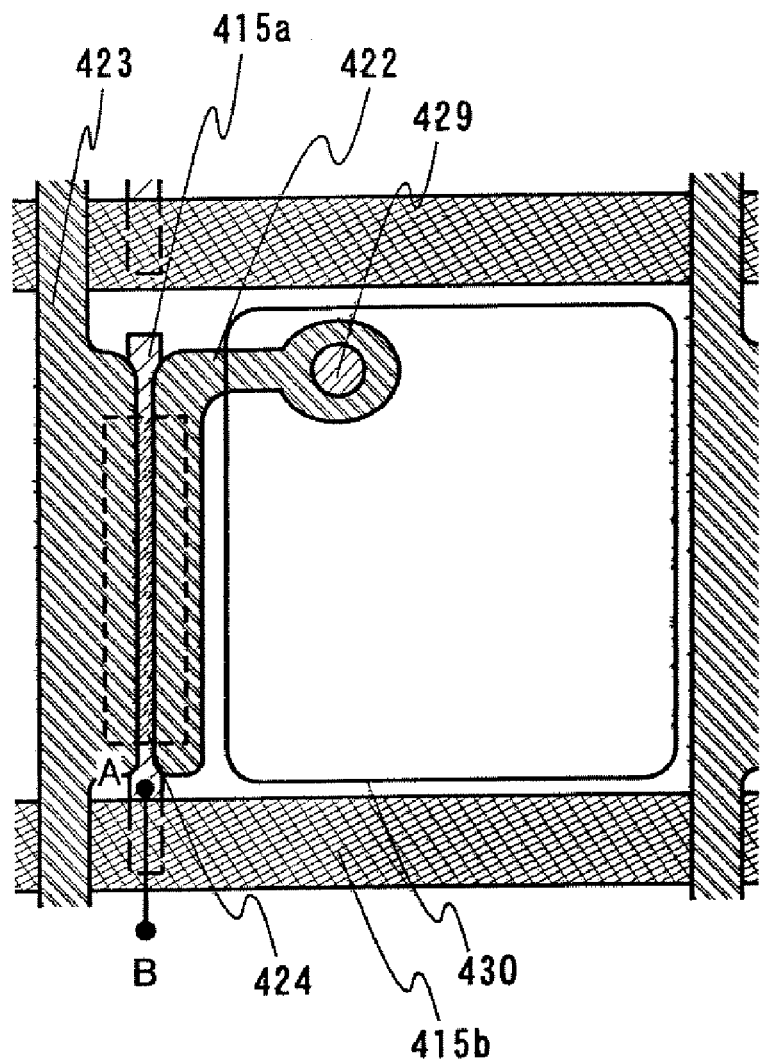
FIGS. 10A and 10B are top views each showing a pixel (Embodiment 1)
Figure 10:
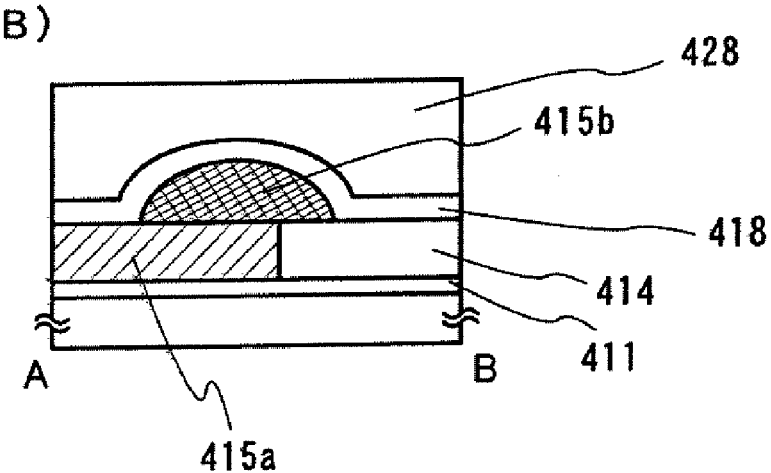

FIG. 10A is an example of a top view of a pixel. In case of forming a large-area panel, it is a bus line arranged vertically and horizontally that needs a low resistance. Therefore, in this embodiment, a gate electrode 415a is an embedded wiring; and a gate wiring 415b, a wiring having a mound-like cross-section.

First, similarly to Embodiment Mode 1, a base film 411 and an insulating layer 414 are formed over a substrate, and only gate electrode 415a having a small wiring width is formed by a droplet discharge method. Then, after carrying out planarization by using a press treatment or a CMP processing, a gate wiring 415b having a large wiring width is formed by a droplet discharge method so as to contact with the gate electrode 415a.

In case of forming a gate electrode having a small wiring width and a gate wiring having a large wiring width by a droplet discharge method, a processing time for drawing the wide gate wiring gets longer when a discharge unit with a small nozzle diameter is used so as to form the gate electrode having a small wiring width.

In view of the above, in this embodiment, a discharge unit with a small nozzle diameter is used for the gate electrode with a small wiring width, and a discharge unit having a large nozzle diameter is used for the gate wiring with a large wiring width in order to improve throughput. In the case where a little timing difference is caused between each formation of the gate electrode and the gate wiring, adhesiveness of the electrode or wiring formed first is relatively high because of an embedded wiring; however, there is a risk of decreasing adhesiveness therebetween. Accordingly, before forming the electrode or wiring to be formed later, a UV processing or a plasma treatment for improving adhesiveness is preferably carried out.

Subsequent steps may be carried out according to Embodiment Mode 1 to form a gate insulating film 418, a semiconductor film 424, a drain electrode 422, a source wiring 423, an interlayer insulating film 428, a pillar 429, and a pixel electrode 430 sequentially. Since the gate wiring 415b has a mound-like shape, deposition condition must be set so that coverage defect is not generated in the gate insulating film 418 and the interlayer insulating film 428

This embodiment mode can be freely combined with Embodiment Mode 1.

Embodiment 2

In this embodiment, an example of dropping a liquid crystal by a droplet discharge method is shown. Additionally, in this embodiment, an example of obtaining four panels from a large-area substrate 100 is shown in FIGS. 11A to 11D.

Figure 11:
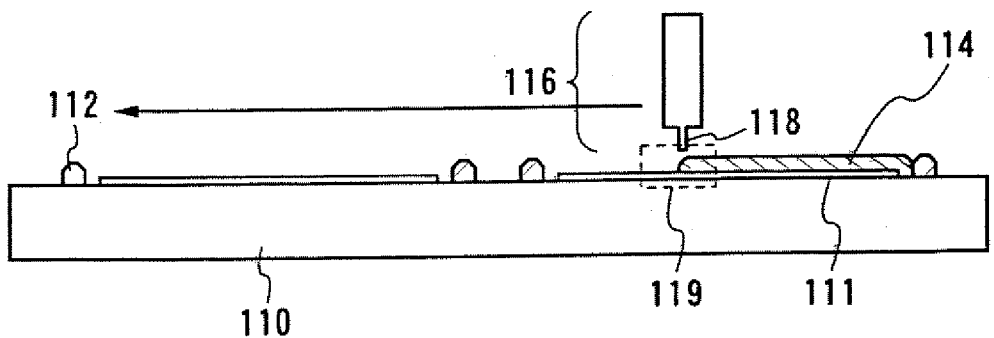
FIGS. 11A, 11C and 11D are cross-sectional views each showing carrying out a liquid crystal drop by a droplet discharge method.
Figure 11:
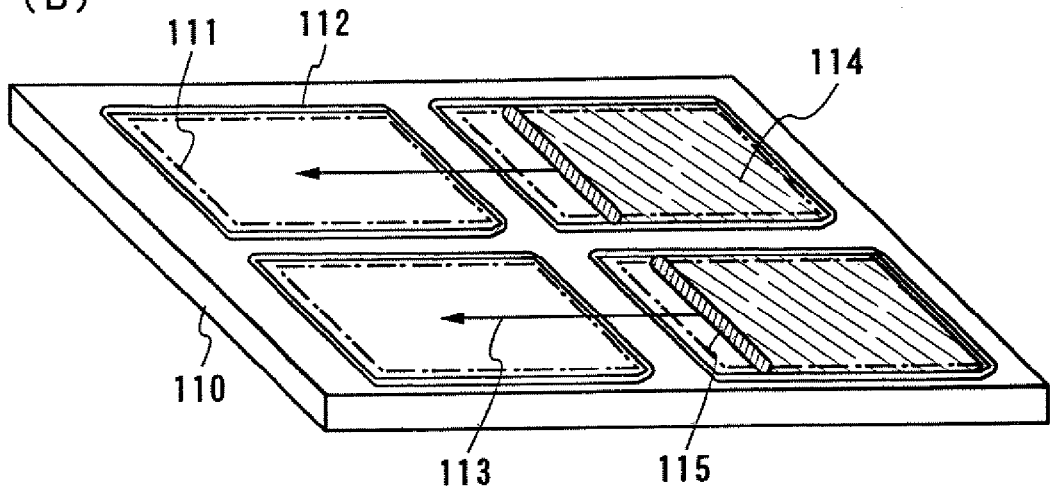
Figure 11:
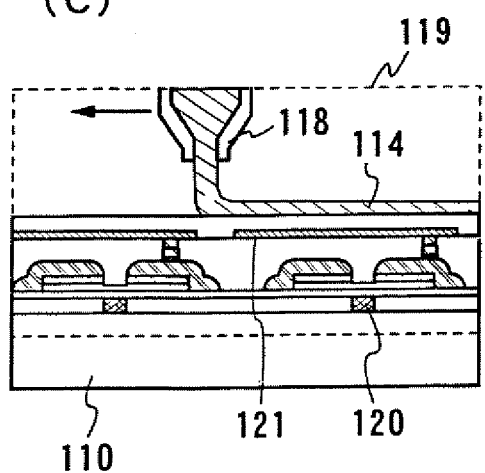
Figure 11:
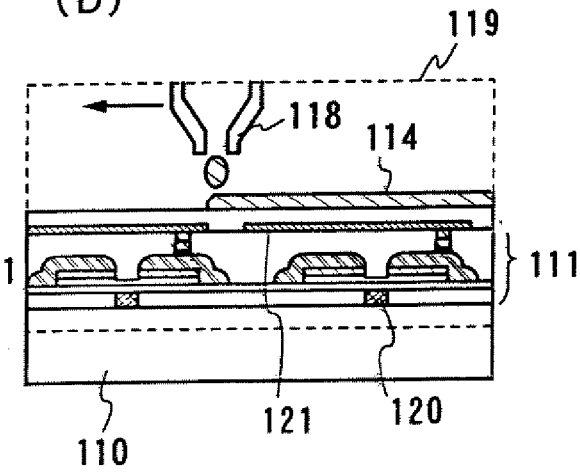

FIG. 11A shows a cross-sectional view of a liquid crystal layer being formed by ink-Jet printing. A liquid crystal material 114 is discharged, sprayed, or dropped from a nozzle 118 of a droplet discharge device 116 so as to cover a pixel area 111 that is surrounded by a sealant 112. The droplet discharge device 116 is moved in the direction of the arrow in FIG. 11A. Here, an example of moving the nozzle 118; however, the liquid crystal layer may be formed by moving the substrate while the nozzle is fixed.

FIG. 11B shows a perspective diagram. The liquid crystal material 114 is selectively discharged, sprayed, or dropped only in the area surrounded by the sealant 112, and an object surface 115 is moved correspondingly to a nozzle scan direction 113.

FIGS. 11C and 11D show enlarged cross-sectional views of an area surrounded by a dotted line in FIG. 11A. When the liquid crystal material has high viscosity, it is discharged continuously and adheres in a manner where each droplet of the liquid crystal material is joined to one another as shown in FIG. 11C. On the other hand, when the liquid crystal material has low viscosity, it is discharged intermittently and the droplets are dropped as shown in FIG. 11D.

In FIG. 11C, reference numerals 120 and 121 denote a reversed staggered type TFT and a pixel electrode, respectively. A pixel portion 111 comprises pixel electrodes arranged in matrix; switching elements connected to the pixel electrode, which is a reversed staggered type TFT here; and a storage capacitor (not shown in the figure).

A workflow of manufacturing a panel is hereinafter described with reference to FIGS. 12A to 12D.

Figure 12:
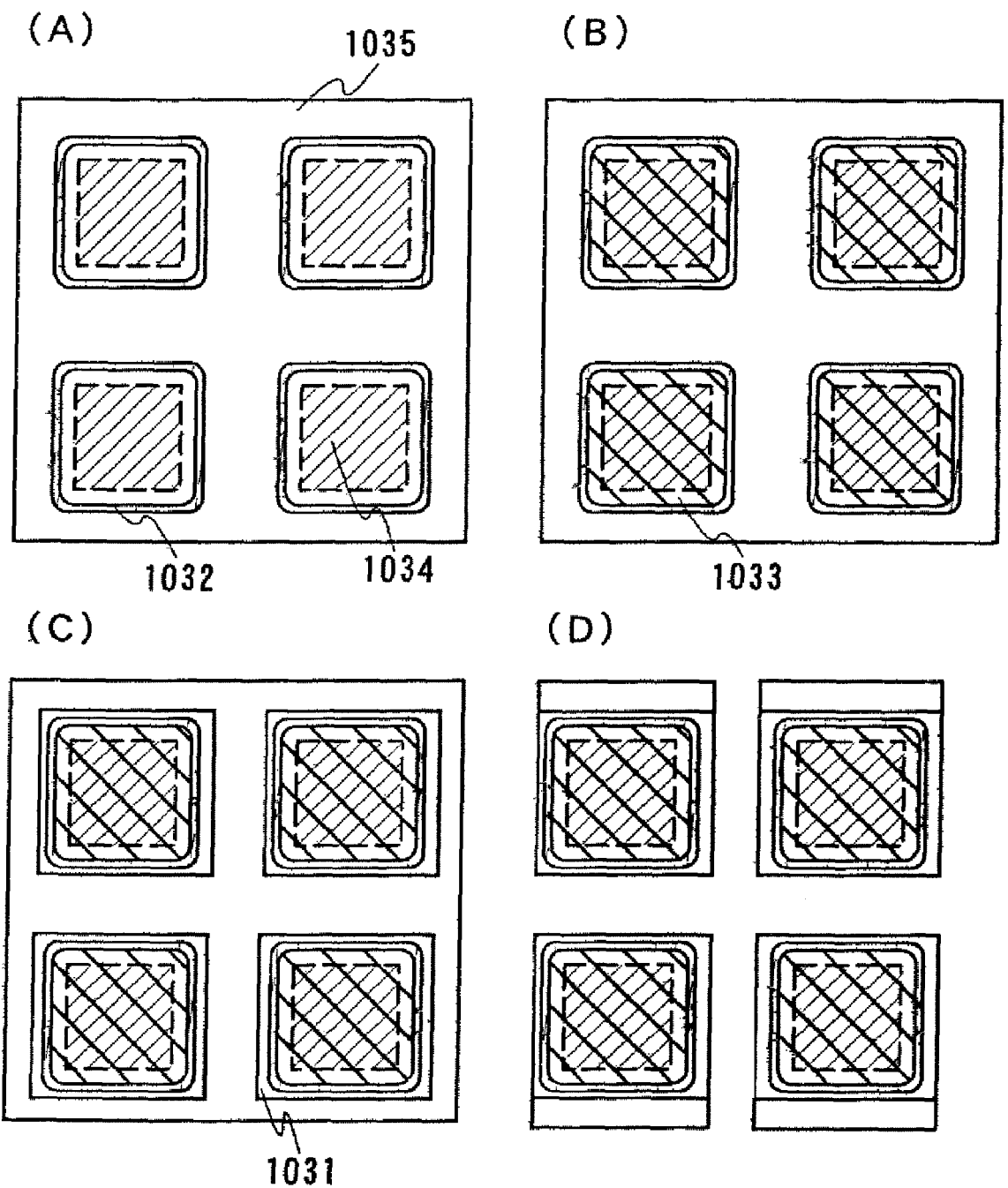
FIGS. 12A to 12D are top views each showing a process (Embodiment 2).

First, a first substrate 1035 in which a pixel portion 1034 is formed over its insulating surface is prepared. The first substrate 1035 is pretreated with the following steps: forming an orientation film, rubbing, forming spherical spacers, forming a column spacer, forming a color filter or the like. Subsequently, a sealant 1032 is formed in a predetermined position (a pattern surrounding the pixel area 1034) with a dispenser or an inkjet device over the first substrate 1035 in an inert atmosphere or under reduced pressure, as shown in FIG. 12A. A material containing a filler (diameters of 6 μm to 24 μm) which has viscosities of 40 Pa·s to 400 Pa·s, is used as the sealant 1032 that is translucent. It is preferable to select a sealant that is insoluble in a liquid crystal to be in contact therewith. A photo cured acrylic resin or a thermosetting acrylic resin may be used as the sealant. Further, the sealant 1032 can be formed also with a printing method since it has a simple seal pattern.

Subsequently, a liquid crystal 1033 is dropped to an area surrounded by the sealant 1032 by an ink jet method (FIG. 12B). A known liquid crystal material with the viscosity that allows discharging with an ink jet method may be used as the liquid crystal 1033. Further, it is suitable to drop a liquid crystal by an ink-jet method since the viscosity of a liquid crystal material can be controlled by adjusting the temperature. The required amount of the liquid crystal 1033 can be stored in the area surrounded by the sealant 1032 without a loss.

The first substrate 1035 provided with the pixel area 1034 and the second substrate 1031 provided with a counter electrode and an orientation film are pasted together under reduced pressure so as to prevent bubbles from being mixed in (FIG. 12C). The sealant 1032 is cured here by heat-treating or applying an ultra-violet ray. Note that heat treatment may be carried out in addition to the ultra-violet irradiation.

Figure 13:
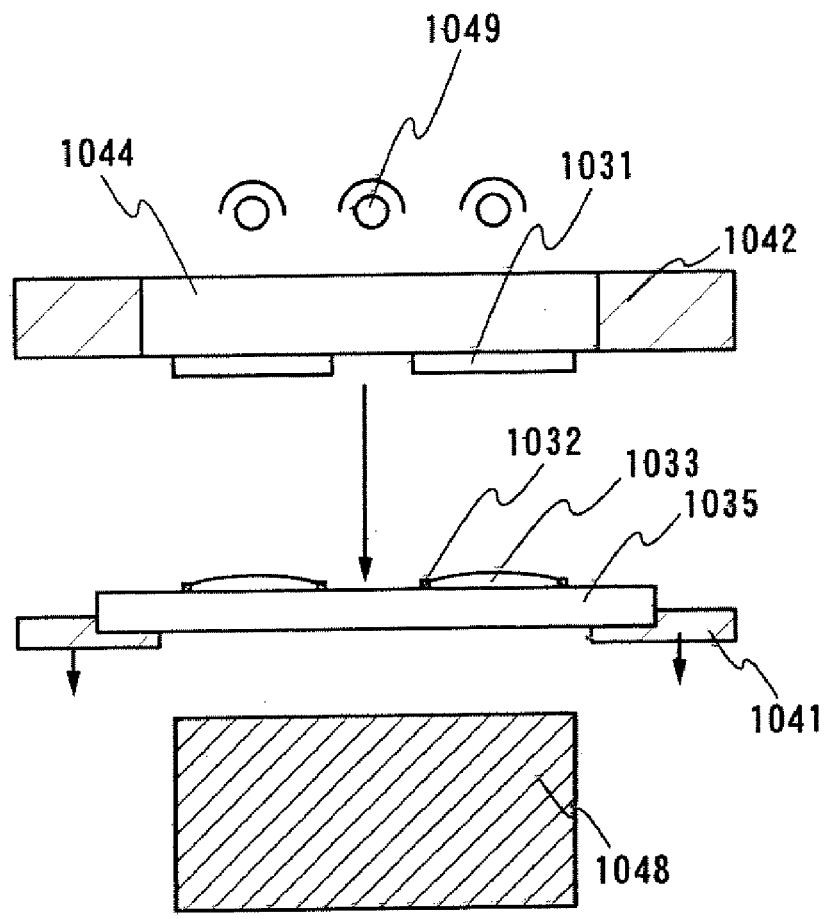
FIGS. 13A and 13B are cross-sectional views each showing a pasting device and a pasting process (Embodiment 2)
Figure 13:
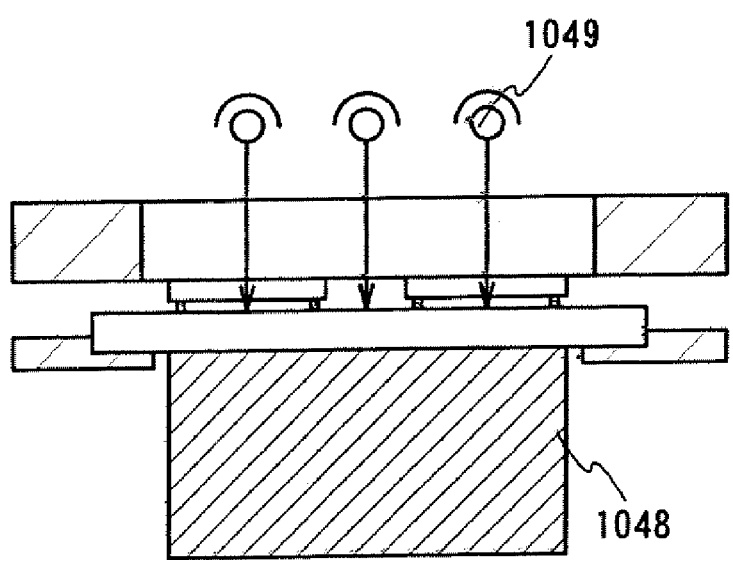

FIGS. 13A and 13B show an example of a pasting device that is capable of carrying out ultra-violet irradiation or heat treatment while or after substrates are pasted.

In FIGS. 13A and 13B, reference numeral 1041 denotes a first substrate support; 1042, a second substrate support; 1044, a window; 1048, a downside measuring plate; and 1049, a light source. In FIGS. 13A and 13B, the same reference numerals are used as the corresponding parts with FIGS. 12A to 12D.

The bottom downside measuring plate 1048 includes a heater, which cures a sealant. The second substrate support is provided with the window 1044, so that ultra-violet light or the like from the light source 1049 can transmit therethrough. Although it is not shown here, an alignment of a position of the substrate is performed through the window 1044. The second substrate 1031 serving as a counter substrate is cut into a desirable size in advance, and fixed to the second substrate support 1042 with a vacuum chuck or the like. FIG. 13A shows a state before pasting.

In pasting, after the first and second substrate supports are lowered, the first substrate 1035 and the second substrate 1031 are pasted together by pressurization, and ultra-violet light is applied to be cured in that state. A state after pasting is shown in FIG. 13B.

Next, the first substrate 1035 is cut by using a cutting machine such as a scriber, a breaker, or a roll cutter (FIG. 12D). Thus, four panels can be manufactured from one substrate. Further, an FPC is pasted by a known method.

A glass substrate, a quartz substrate, or a plastic substrate can be used as the first substrate 1035 and the second substrate 1031.

Figure 14:
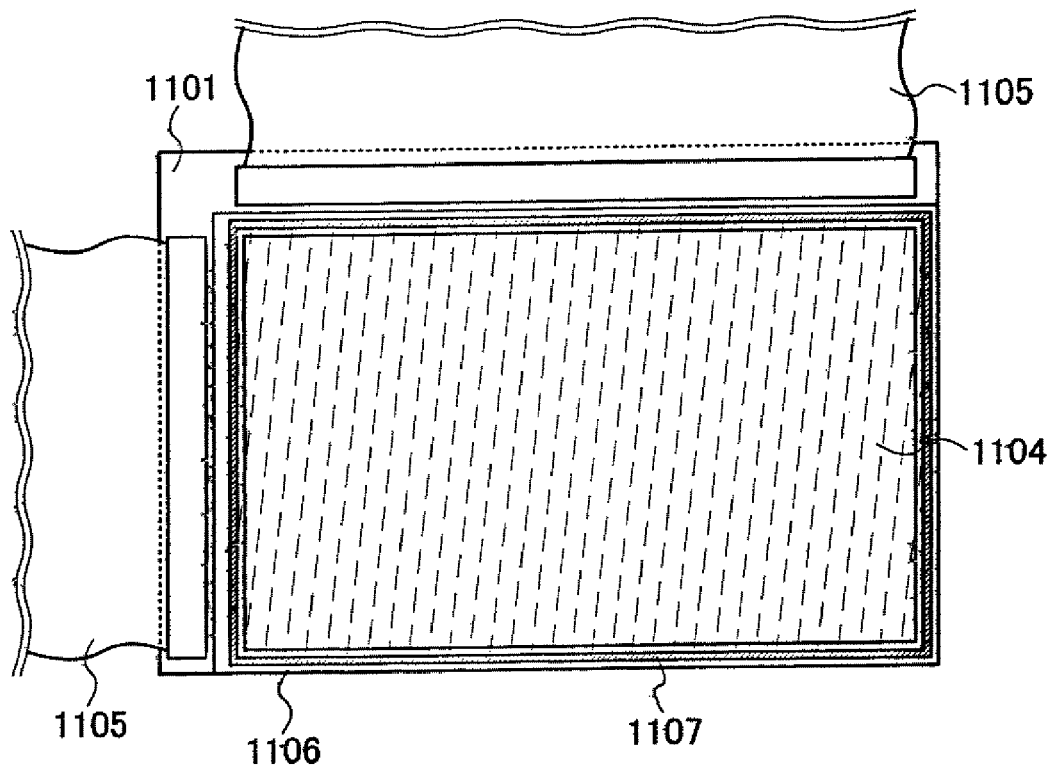
FIGS. 14A and 14B are top views each showing a liquid crystal module (Embodiment 2)
Figure 14:
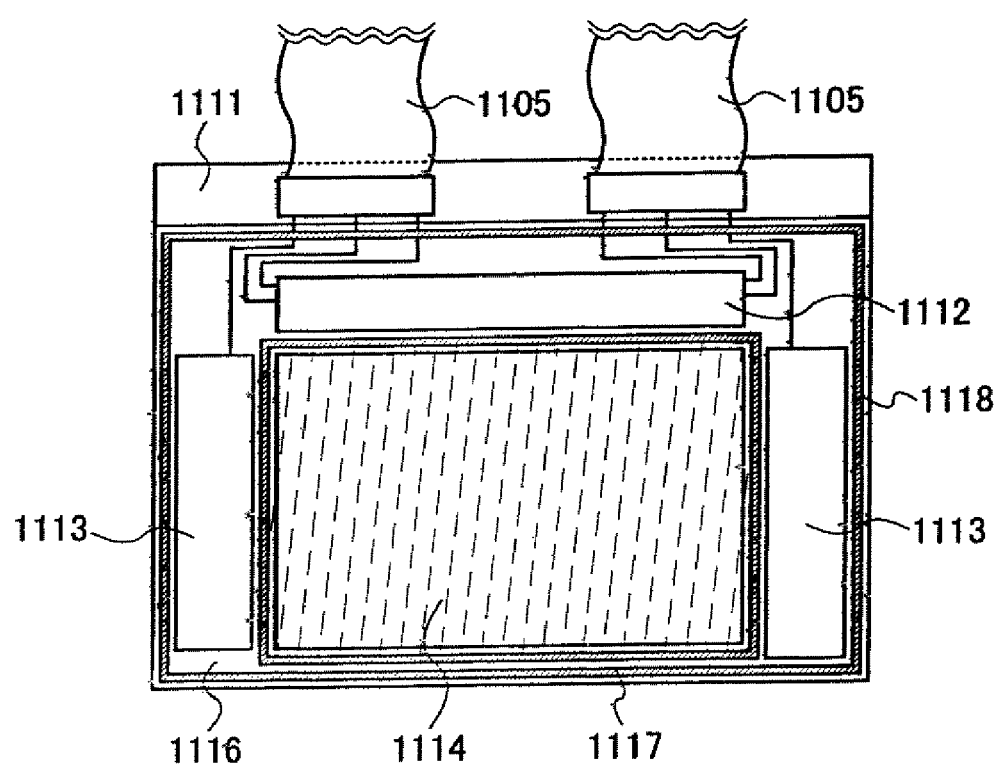

FIG. 14A shows a top view of a liquid crystal module obtained through the above steps. FIG. 14B shows a top view of another liquid crystal module.

A TFT in which an active layer comprises an amorphous semiconductor film has low field-effect mobility of around 1 $cm^2/Vsec$. Therefore, a driver circuit for displaying an image is formed with an IC chip, and is mounted in a TAB (Tape Automated Bonding) method or a COG (Chip On Glass) method.

In FIG. 14A, reference numeral 1101 denotes an active matrix substrate; 1106, a counter substrate; 1104, a pixel area; 1107, a sealant; and 1105, an FPC. Note that a liquid crystal is discharged with an ink jet method, and a pair of substrates 1101 and 1106 are pasted together with the sealant 1107 under reduced pressure.

In case of using the TFT comprising an active layer formed of a semiamorphous silicon film, a part of a driver circuit can be fabricated, thereby fabricating a liquid crystal module shown in FIG. 11B. In case of forming a driver circuit, an additional process in which a gate insulating film is selectively removed to form a contact hole is necessary.

Figure 15:
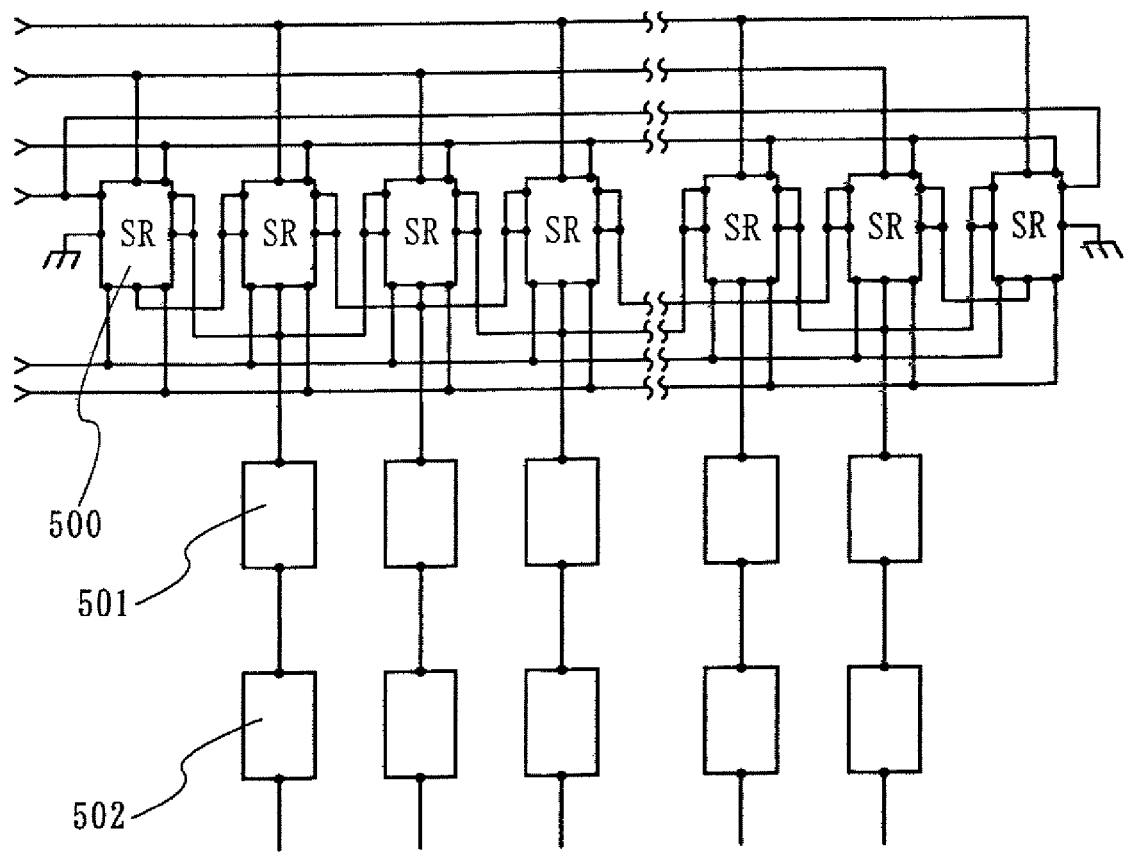
FIG. 15 is a block diagram showing a driver circuit (Embodiment 2)

FIG. 15 shows a block diagram of a scan line side driver circuit configured by an n-channel type TFT using a semiamorphous silicon film having the field effect mobility of 5 $cm^2/V·sec$ to 50 $cm^2/V·sec$.

In FIG. 15, a block shown with numeral reference 500 corresponds to a pulse output circuit outputting a sampling pulse for one stage, and a shift register is configured by n pieces of pulse output circuit. Reference numeral 501 denotes a buffer circuit, and a pixel 502 is connected at the ends thereof.

Figure 16:
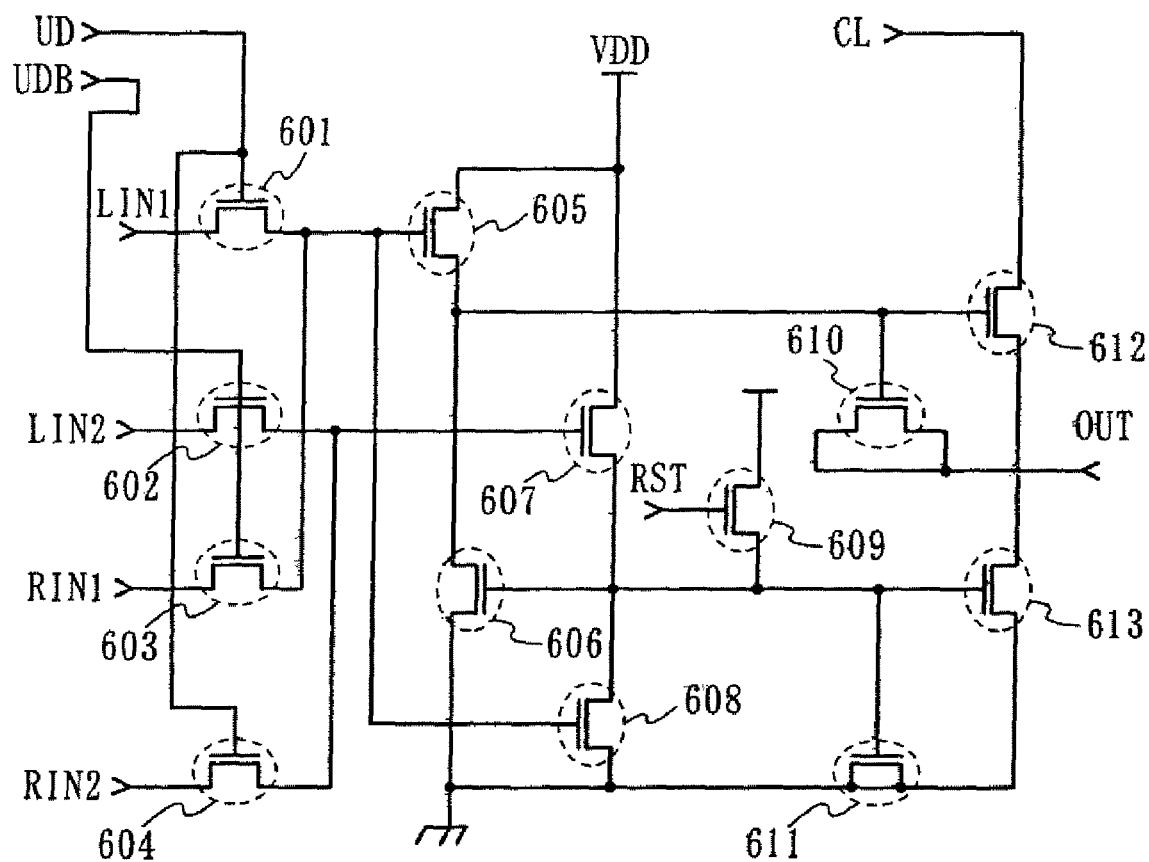
FIG. 16 is a circuit diagram showing a driver circuit (Embodiment 2)

FIG. 16 shows a specific structure of the pulse output circuit 500, and the circuit is configured by n-channel type TFTs 601 to 612. At this time, the size of the TFTs may be determined in consideration of an operating characteristic of the n-channel type TFTs using a semiamorphous silicon film.

For example, when the channel length is set to 8 µm, the channel width can be set in the range of from 10 µm to 80 µm.

Figure 17:
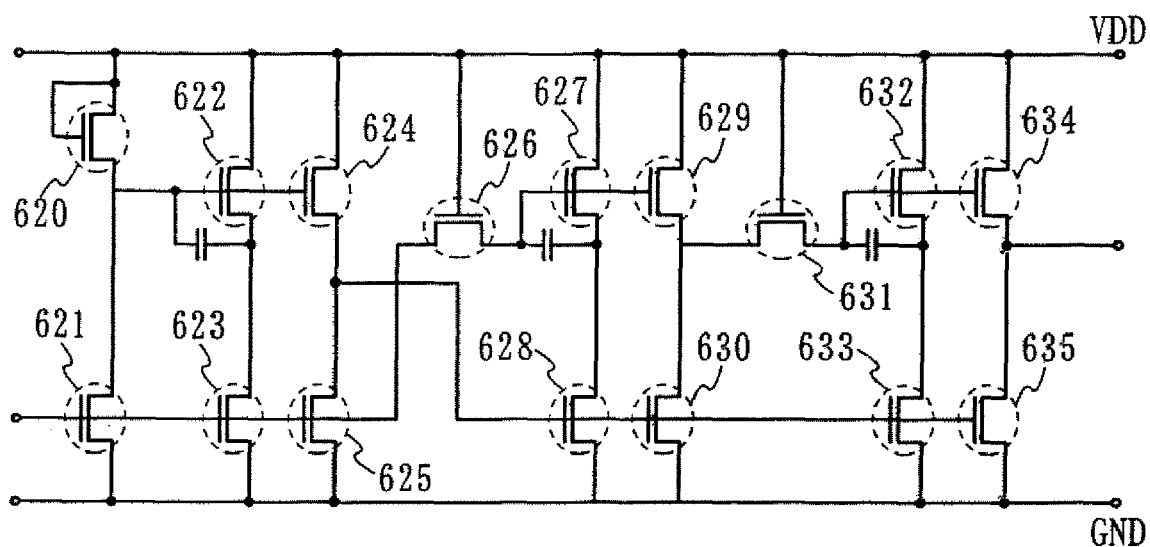
FIG. 17 is a circuit diagram showing a driver circuit (Embodiment 2)

In addition, FIG. 17 shows a specific structure of a buffer circuit 501. The buffer circuit is configured by n-channel type TFTs 620 to 636 in the same manner. At this time, the size of the TFTs may be determined in consideration of an operating characteristic of the n-channel type TFTs using a semiamorphous silicon film. For example, when the channel length is set to 10 µm, the channel width can be set ranging from 10 µm to 1800 µm.

An IC chip (not shown in the figure) is mounted on a driver circuit which cannot be formed with the TFT having the active layer comprising the semiamorphous silicon film.

Additionally, the driver circuit may be formed with a TFT comprising a poly crystalline silicon film by selectively emitting laser light only onto a region in which the driver circuit is formed. Excimer laser light with a wavelength of 400 nm or less, and a second and third harmonic waves of YAG laser are used as laser light. For example, pulsed laser light with a repetition frequency of approximately from 10 Hz to 1000 Hz is used, the pulsed laser light is condensed to from 100 mJ/cm$^2$ to 500 mJ/cm$^2$ by an optical system, and emitted with an overlap ratio of from 90% to 95%, and thus, the silicon film surface may be scanned with it. When an amorphous semiconductor film is crystallized, the second harmonic to the fourth harmonic of basic waves is preferably applied by using a solid state laser which is capable of continuously oscillating in order to obtain crystals with large grain size. Typically, the second harmonic (a wavelength of 532 nm) or the third harmonic (a wavelength of 355 nm) of an Nd:YVO$_4$ laser (a basic wave of 1064 nm) may be applied. In case of using a continuous wave laser, laser light emitted from the continuous wave YVO$_4$ laser with 10 W output is converted into a harmonic wave by using a non-linear optical element. Also, a method of emitting a harmonic wave by applying YVO$_4$ crystals and the non-linear optical element into a resonator can be given. Then, preferably, the laser light is shaped so as to have a rectangular shape or an elliptical shape by an optical system on the surface, thereby irradiating the surface with the laser light. At this time, the energy density of approximately from 0.01 MW/cm$^2$ to 100 MW/cm$^2$ (preferably from 0.1 MW/cm$^2$ to 10 MW/cm$^2$) is required. The semiconductor film is irradiated with the laser light while moving the semiconductor film relatively to the laser light at a rate approximately from 10 cm/s to 2000 cm/s.

In FIG. 14B, reference numeral 1111 denotes an active matrix substrate; 1116, a counter substrate; 1112, a source signal line driver circuit; 1113, a gate signal line driver circuit; 1114, a pixel portion; 1117, a first sealant; and 1115, an FPC. Note that a liquid crystal is discharged with a ink-jet method, and the pair of substrates 1111 and 1116 are pasted together with the first sealant 1117 and a second sealant. The liquid crystal is stored in the pixel portion 1114 since the liquid crystal is unnecessary for the source signal line driver circuit 1112 and the gate signal line driver circuit 1113. The second sealant 1118 is provided for reinforcement of an entire panel.

Figure 18:
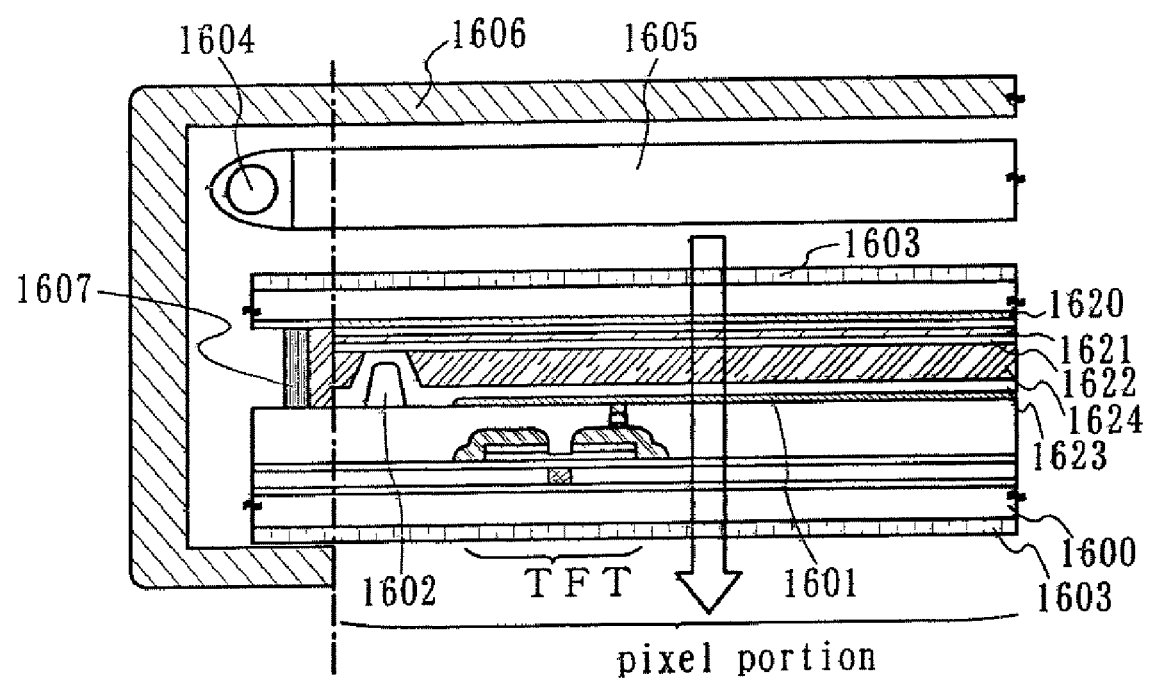
FIG. 18 is a cross-sectional structural view showing an active matrix liquid crystal display device (Embodiment 2)

A back light 1604 and a light conducting plate 1605 are provided in the obtained liquid crystal module, and the liquid crystal module is covered with a cover 1606; thereby, an active matrix liquid crystal display device (transmission type) is completed, a part of which a cross-sectional view is shown in FIG. 18. Note that the cover and the module are fixed by using an adhesive or an organic resin. Since the active matrix liquid crystal display device is a transmission type, a polarizing plate 1603 is pasted to both the active matrix substrate and the counter substrate.

In FIG. 18, reference numeral 1600 denotes a substrate; 1601, a pixel electrode; 1602, a column spacer; 1607, a sealant; 1620, a color filter in which a colored layer and a light-shielding film are disposed so as to corresponds to each pixel; 1621, a counter electrode; 1622 and 1623, orientation films; 1624, a liquid crystal layer; 1619, a protective film. The column spacer 1602 may also be formed by a droplet discharge method.

This embodiment mode can be freely combined with Embodiment Mode 1 or Embodiment 1.

Embodiment 3

Figure 19:
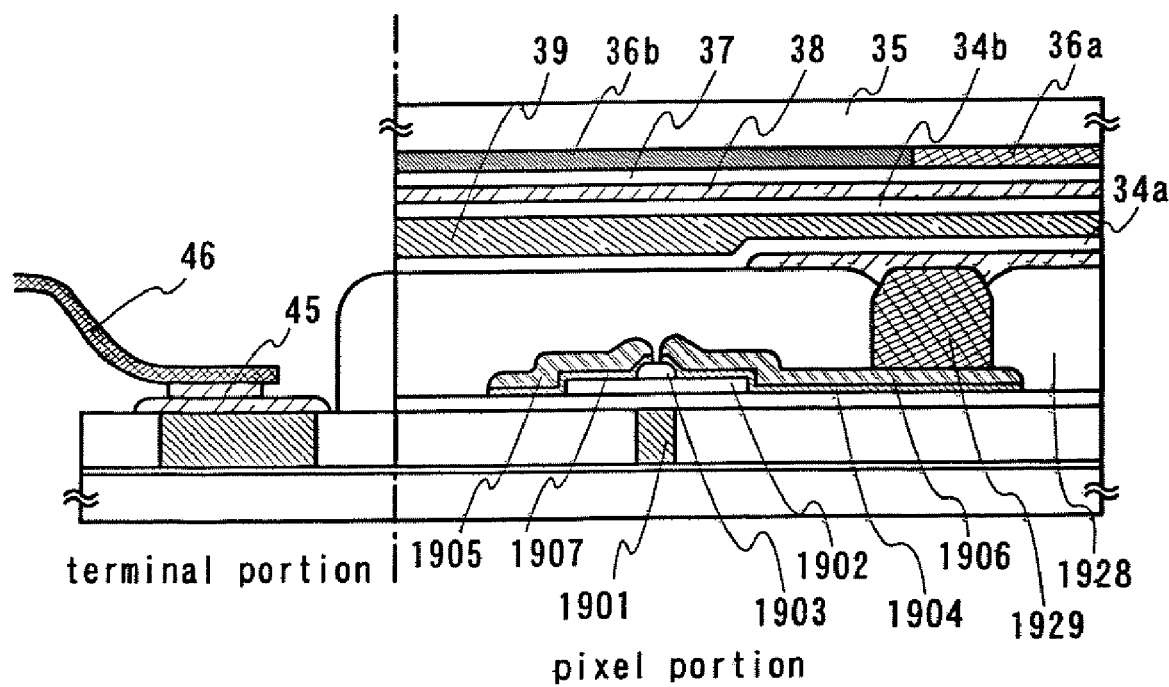
FIG. 19 is a cross-sectional view showing a liquid crystal display device (Embodiment 3)

This embodiment describes an example of manufacturing an active matrix liquid crystal display device which uses a channel stopper type TFT FIG. 19 shows a cross-sectional view of a liquid crystal display device of this embodiment.

First, according to Embodiment Mode 1, a base film and an insulating film are formed over an substrate, and a gate electrode 1901 is formed between patterned insulating films by a droplet discharge method. Subsequently, after planarization by pressing, a gate insulating film, a semiconductor film and a channel protective film are formed. As the channel protective film, a material mainly containing silicon oxide, silicon nitride or silicon nitride oxide is formed by a PCVD method or a sputtering method. Then, a channel protective film is selectively etched to form a channel protective layer 1903. Alternatively, the channel protective film may be formed by a droplet discharge method selectively.

Subsequently, the semiconductor film is patterned to form an island-like semiconductor film 1902. An n-type semiconductor film is formed, and wirings 1905 and 1906 are formed by a droplet discharge method. Source or drain regions 1907 and 1904 comprising the n-type semiconductor film are selectively etched using wirings 1905 and 1906 as masks. A pillar 1929 and an interlayer insulating film 1928 are patterned with the same device by a droplet discharge method and baked. Here, the pillar 1929 is discharged first, and the interlayer insulating film 1928 is discharged later; however, either of the above may be discharged first without a particular limit on a step order. Additionally, after a temporary baking or a final baking of either one of the pillar 1929 or the interlayer insulating film 1928, the other may be discharged and baked with a different device.

Subsequent steps may be carried out similarly to Embodiment Mode 1. This embodiment is the same with Embodiment Mode 1 except its TFT structure. Therefore, in FIG. 19, the same reference numerals are used as identical portions to HG 2D.

This embodiment mode can be freely combined with Embodiment Mode 1, Embodiments 1 or 2.

Embodiment 4

This embodiment describes an example in which a driver circuit for driving is mounted on an EL display panel made by Embodiment Mode 2.

Figure 25:
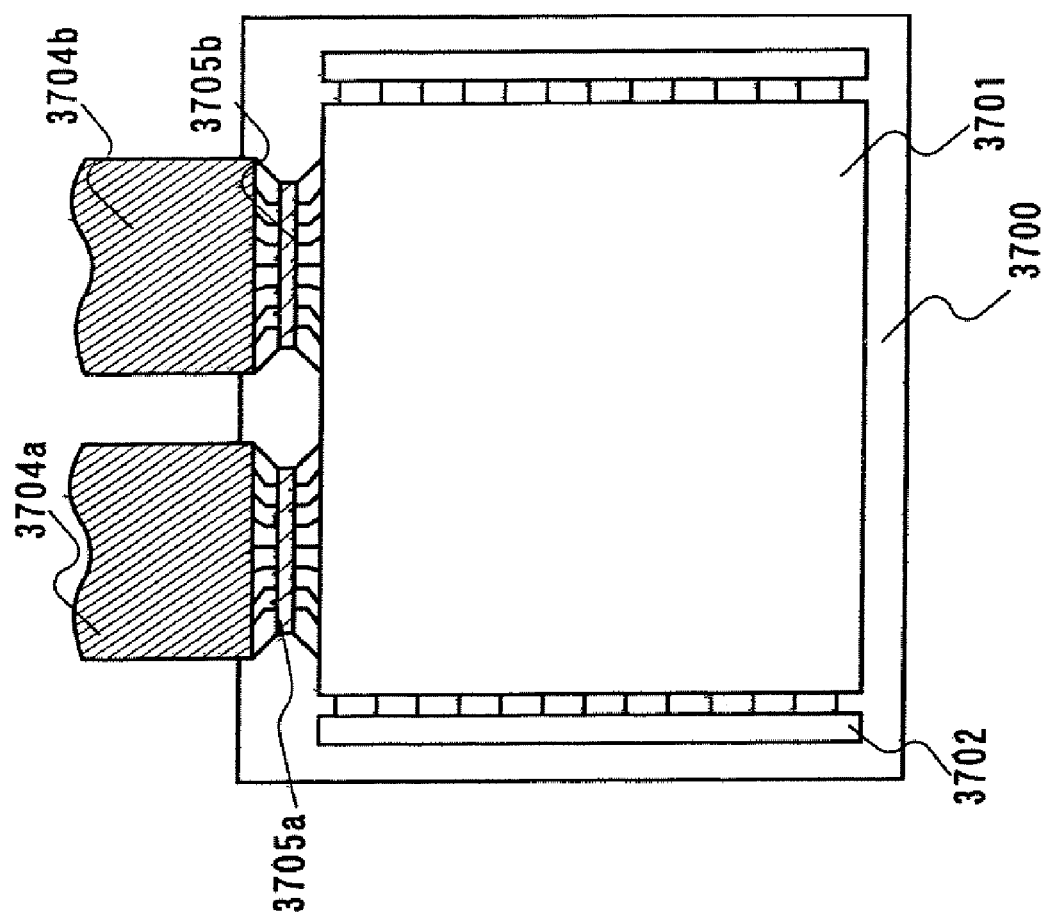
FIG. 25 is a top view showing a light emitting display device according to a certain aspect of the present invention.

First, a display device adopting a COG method is described with reference to FIG. 25. Over a substrate 3700, a pixel portion 3701 displaying information such as characters or an image, a driver circuit 3702 on scan side are provided. The substrate provided with a plurality of driver circuits is divided into a rectangular shape, and divided driver circuits (herein after referred to as a driver IC) 3705a and 3705b are mounted over the substrate 3700. FIG. 25 shows a mode in which the plurality of the driver ICs 3705a and 3705b are mounted, and a tape 3704a and 3704b are mounted over ends of the driver ICs 3705a and 3705b. By setting the width of the tape to have the same length with that of the pixel portion on a side of signal line, a tape may be mounted over a single driver IC or an end of the driver IC.

In addition, a TAB method may be adopted. In that case, a plurality of tapes is attached, and a driver IC may be mounted on the tape. Similarly to the case of COG method, a single driver IC may be mounted on a single tape. In view of its intensity, metal pieces or the like that fixes the driver IC may be attached together in this case.

In view of improving productivity, a plurality of the driver ICs to be mounted on the EL display panel may be formed on a rectangular substrate having one side of 300 mm to 1000 mm or more.

In other words, a plurality of circuit patterns each including a driver circuit portion and input and output circuit terminals as a unit may be formed to be divided and taken out in the last. In consideration of a length of one side of the pixel portion and a pixel pitch, the driver ICs may be formed into a rectangular shape of which long side length is from 15 mm to 80 mm and short side length is from 1 mm to 6 mm. Alternatively, it may be formed into a shape of which length is the same as that of one side of the pixel region, or as the sum of the lengths one side of the pixel portion and one side of each driver circuit.

The driver IC is more advantageous than an IC chip in the length of the long side in the outside dimension. By using a driver IC having a long side length of 15 mm to 80 mm, the number of driver ICs to be mounted corresponding to a pixel region can be reduced as compared with in case of using the IC chip, thereby leading to improved productive yield. Furthermore, when the driver IC is formed on a glass substrate, the form of a substrate used as a mother body is not limited to the shape of the substrate; therefore, the productivity is not decreased. This provides a great advantage as compared with the case where the IC chips are taken from a circular silicon wafer.

In FIG. 25, the driver ICs 3705a and 3705b in which driver circuits are formed are mounted on an exterior region of the pixel portion 3701. Those driver ICs 3705a and 3705b are each driver circuit on the signal line. In order to form a pixel region for a RGB full color, 3072 signal lines in XGA and 4800 signal lines in UXGA are necessary. The signal lines of such a number forms a leading out line by dividing into several blocks at an edge of the pixel region 2401 and are gathered in accordance with a pitch of output terminals of the driver ICs 3705a and 3705b.

The driver IC is preferably formed by using a crystalline semiconductor formed over a substrate. It is preferable that the crystalline semiconductor is formed by being irradiated with a continuous-wave laser. Therefore, a continuous-wave solid state laser or a gas laser is used as an oscillator with which the laser light is generated. A transistor can be formed by using a polycrystalline semiconductor layer with a large grain size having less crystal defects. In addition, high-speed driving is possible since the mobility or response speed is favorable, and it is possible to further improve an operating frequency of an element than that of a conventional element. Further, high reliability can be obtained since there are few variations in properties. Note that a channel length direction of a transistor and a scan direction of laser light may be accorded with each other to further improve an operating frequency. This is because the highest mobility can be obtained when the channel length direction of a transistor and a scan direction of laser light with respect to a substrate are almost parallel (preferably, from −30° to 30°) in a step of laser crystallization by a continuous-wave laser. The channel length direction coincides with a direction of current floating in a channel formation region, in other words, a direction in which an electric charge moves. The transistor thus manufactured has an active layer configured by a polycrystalline semiconductor layer in which a crystal grain is extended in a channel direction, and this means that a crystal grain boundary is formed almost along the channel direction.

In carrying out laser crystallization, it is preferable to condense the laser light considerably, and a beam spot thereof is preferably about from 1 mm to 3 mm as wide as a minor axis of the driver ICs. In addition, in order to ensure an enough and effective energy density to an object to be irradiated, region to be irradiated with laser light of the laser light is preferably a linear shape. However, a linear shape here does not refer to a line in a proper sense, but includes a rectangle or an oblong with a large aspect ratio. For example, the linear shape refers to a rectangle or an oblong with an aspect ratio of 2 or more preferably from 10 to 10000). Accordingly, productivity can be improved by conforming a width of a beam spot of the laser light to that of a short side length of the driver IC.

FIG. 25 shows a mode in which the scan line driver circuit is integrally formed with the pixel portion and the driver IC is mounted as the signal line driver circuit. However, the invention is not limited to this mode, and the driver IC may be mounted as both a scan line driver circuit and a signal line driver circuit. In that case, it is preferable to differentiate a specification of the driver ICs to be used on the scan line side and signal line side.

In the pixel region 3701, the signal line and the scan line are intersected to form a matrix and a transistor is disposed corresponding to each intersection. In this embodiment, a TFT having a structure in which a channel is formed with an amorphous semiconductor or a semiamorphous semiconductor can be used as the transistor arranged in the pixel portion 3701. The amorphous semiconductor is formed by a method such as a plasma CVD method or a sputtering method. The semiamorphous semiconductor is formed with a plasma CVD method, a sputtering method or the like. It is possible to form the semiamorphous semiconductor at a temperature of 300° C. or less with a plasma CVD method. A film thickness necessary to form a transistor is obtained in a short time even in case of a non-alkaline glass substrate of an external size of, for example, 550 mm×650 mm. Such a manufacturing technique is effective in manufacturing a liquid crystal display device of a large screen. In addition, a semiamorphous TFT can obtain an electron field-effect mobility of 2 $cm^2/V \cdot sec$ to 10 $cm^2/V \cdot sec$ by forming a channel formation region from a semiamorphous silicon film. Therefore, this TFT can be used as a switching element of pixels and as an element which configures the scan line driver circuit. Therefore, an EL display panel realizing a system-on-panel can be manufactured.

In FIG. 25, it is premised on that a scan line side driver circuit is formed integrally on the substrate by using a TFT of which semiconductor layer comprises a semiamorphous silicon film. In case of using the TFT of which semiconductor layer comprises a semiamorphous silicon film, both the scan line side driver circuit and signal line side driver circuit may be mounted as driver ICs.

In that case it is preferred to differentiate a specification of the driver ICs to be used on the scan line side and signal line side. For example, withstand voltage of around 30V is required for a transistor configuring a driver IC of the scan line side; however, drive frequency is 100 kHz or less, and a high speed operation is not particularly required. Therefore, it is preferable that a channel length (L) of a transistor configuring a driver on the scan side is set to be sufficiently long. On the other hand, a withstand pressure of around 12 V is enough for the transistor of the signal line driver ICs; however, a drive frequency is around 65 MHz at 3 V and a high speed operation is required. Therefore, it is preferable to set a channel length or the like of the transistor configuring a driver with a micron rule.

A mounting method of driver IC is not particularly limited, and can use a known COG method, wire bonding method or TAB method.

By conforming the thickness of the driver IC to that of the counter substrate, they can be much the same height, leading to reduction in thickness of a display device as a whole. Further, since each substrate is formed of the same material, thermal stress is not generated even when the temperature in the liquid crystal display device is changed, and thus characteristics of the circuit made up of TFTs are not damaged. Moreover, as shown in this embodiment mode, by mounting a driver IC which is longer than an IC chip as a driver circuit, the number of driver ICs to be mounted in a pixel region can be reduced.

As described above, a driver circuit can be incorporated in an EL display panel.

Embodiment 5

Figure 26:
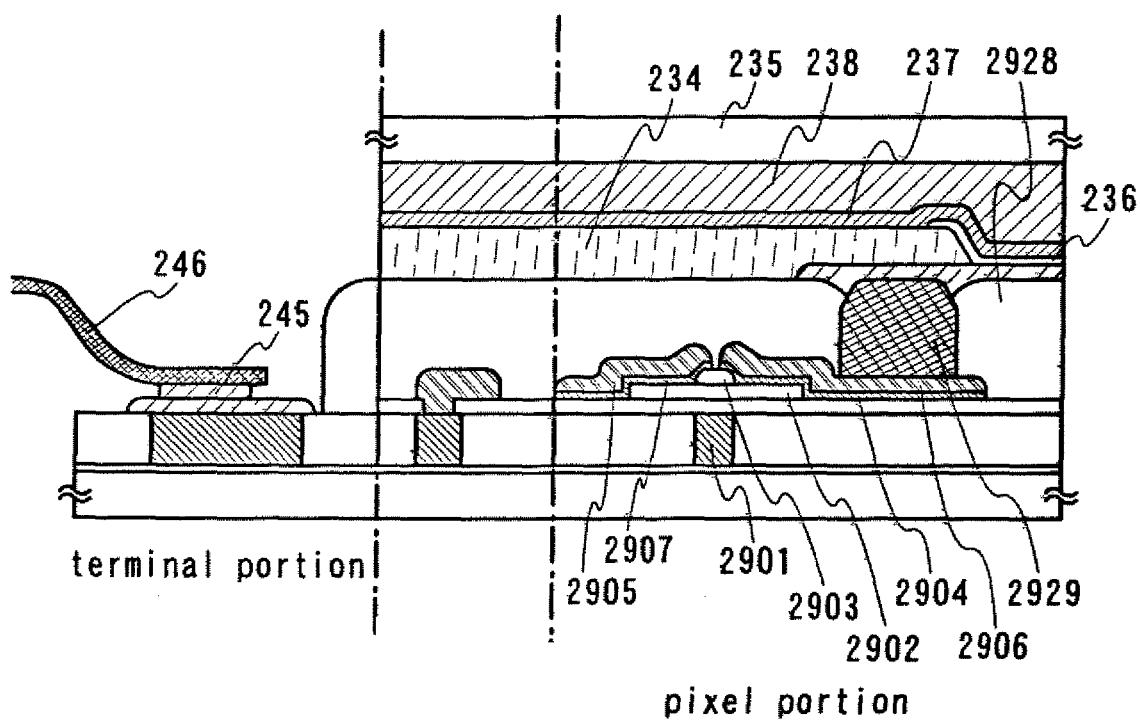
FIG. 26 is a cross-sectional view showing an example of a light-emitting device.

This embodiment shows an example of manufacturing an active matrix light emitting display device using a channel stopper type TFT. Note that FIG. 26 shows a cross-sectional view of a light emitting display device of this embodiment.

First, according to Embodiment Mode 2, a base layer and an insulating layer are formed over a substrate, and form a gate electrode 2901 is formed between patterned insulating layers by a droplet discharge method. Subsequently, after planarization by pressing, a gate insulating film, a semiconductor film and a channel protective film are formed. As a channel protective film, a material mainly containing silicon oxide, silicon nitride or silicon nitride oxide is formed by a PCVD method or a sputtering method. Then, a channel protective film is selectively etched to form a channel protective layer 2903. Alternatively, the channel protective film may be formed by a droplet discharge method selectively.

Subsequently, the semiconductor film is patterned to form an island-like semiconductor film 2902. An n-type semiconductor film is formed, and wirings 2905 and 2906 are formed by a droplet discharge method. Source and drain regions 2907 and 2904 comprising the n-type semiconductor film are selectively etched using wirings 2905 and 2906 as masks. A pillar 1929 and an interlayer insulating film 1928 are patterned with the same device by a droplet discharge method and baked. Here the pillar 2929 is discharged first, and the interlayer insulating film 2928 is discharged later; however, either of the above may be discharged first without a particular limit on a step order. Additionally, after a temporary baking or a final baking of either one of the pillar 2929 or the interlayer insulating film 2928, the other may be discharged and baked with a different device.

Subsequent steps may be carried out similarly to the preferred embodiment mode of the present invention. This embodiment is the same as the preferred embodiment mode of the invention except its TFT structure. Therefore, in FIG. 26, the same reference numerals are used as identical portions to FIG. 21D.

This embodiment can be freely combined with Embodiment Mode 2, Embodiments 4.

Embodiment 6

A scan line side driver circuit of can be formed over a substrate 3700 as described with Embodiment 4 (FIG. 25) in an active matrix light emitting device since a semiconductor layer of a TFT is formed of a semiamorphous silicon film.

The scan line side driver circuit may be realized by configuring circuits of the block diagrams, which are shown in FIGS. 15, 16 and 17, by a TFT using a semiamorphous silicon film having a field effect mobility of 1 $cm^2V\cdot sec$ to 15 $cm^2/V\cdot sec$. The detail of FIGS. 15, 16 and 17 are described in Embodiment 2; therefore, they are not described here.

This embodiment can be freely combined with Embodiment Mode 2, or Embodiments 4 or 5.

Embodiment 7

This embodiment describes a structure of a pixel of an EL panel with reference to an equivalent circuit diagram illustrated in FIGS. 27A to 27F.

Figure 27:
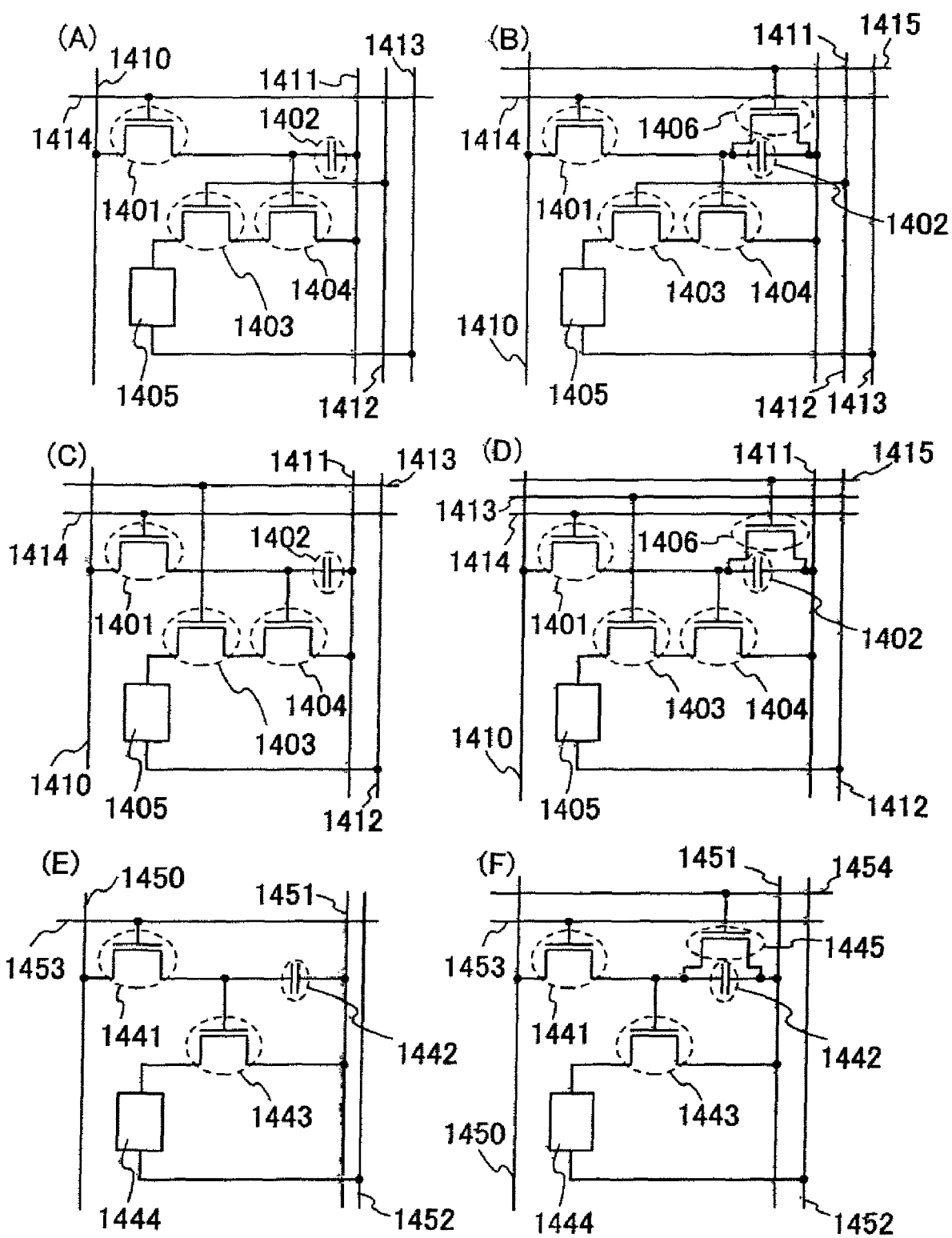
FIGS. 27A to 27F are circuit diagrams each showing a structure of the pixel applicable to an EL display panel.

A pixel shown in FIG. 27A, a signal line 1410 and power supply lines 1411 to 1413 are disposed in a column direction; and a scan line 1414, a row direction. Additionally, the pixel comprises a switching TFT 1401, a driving TFT 1403, a current control TFT 1404, a capacitor element 1402 and a light emitting element 1405.

A pixel shown in FIG. 27C is the same as that shown in FIG. 27A except that a gate electrode of the driving TFT 1403 is connected to a power supply line 1415 disposed in a row direction. In other words, both the pixels shown in FIGS. 27A and 27C indicate the same equivalent circuit diagram. However, in case of disposing a power supply line 1412 in a row direction (FIG. 27A) and the case of disposing a power supply line 1412 in a column direction (FIG. 27C), each power supply line is formed of a conductive layer in different layers. Here, paying attention to a wiring to which the gate electrode of the driving TFT 1403 is connected, FIG. 27A and FIG. 27C are separately described in order to show that the layers in a layer in which the power supply lines are formed are different.

As characteristics of the pixels shown in FIGS. 27A and 27C, the driving TFT 1403 and the current control TFT 1404 is serially connected in the pixel, and a channel length $L_3$ and channel width $W_3$ of the driving TFT 1403 and channel length $L_4$ and channel width $W_4$ of the current control TFT 1404 are set so as to satisfy $L_3/W_3:L_4/W_4$=5 to 6000:1. As an example of the case satisfying 6000:1, a case can be given, in which $L_3$ is 500 µm; $W_3$, 3 µm; $L_4$, 3 µm; and $W_4$, 100 µm.

In addition, the driving TFT 1403 operates in a saturation region and functions to control current value of the current flowing to the light emitting element 1405. The current control TFT 11404 operates in a linear region and functions to control supply of the current to the light emitting element 1405. It is preferable that both the TFTs have the same conductive type in view of a manufacturing step. As the driving TFT 1403, a TFT of a depletion type may be used as well as an enhancement type. Small variations in $V_{GS}$ of the current control TFT 1404 do not have an influence on a current value of the light emitting element 1405 since the current control TFT 1404 operates in a linear region according to the present invention having the above structure. In other words, current value of light emitting element 1405 is determined by the driving TFT 1403 operating in a saturation region. The invention having the above-mentioned structures can provide a display device in which unevenness in luminance due to variations in characteristics of a TFT is improved to enhance an image quality.

In the pixels shown in FIGS. 27A to 27D, the TFT 1401 controls an input of video signal to the pixel. When the TFT 1401 is turned on, and a video signal is inputted to the pixel, the video signal is held in a capacitor element 1402. Although the pixels comprise each of the capacitor element 1402 in FIGS. 27A and 27C, the invention is not limited to this. When a gate capacitance and the like can replace the capacitance for holding a video signal, the capacitor element 1402 is not necessarily provided explicitly.

The light emitting element 1405 has a structure in which an electroluminescent layer is sandwiched between a pair of electrodes. A pixel electrode and a counter electrode (anode and cathode) have a potential difference so that a forward bias voltage is applied to the light emitting element 1405. The electroluminescent layer is formed of a material selected from various materials such as organic materials or inorganic materials. The luminescence in the electroluminescent layer includes luminescence that is generated when an excited singlet state returns to a ground state (fluorescence) and luminescence that is generated when an excited triplet state returns to a ground state (phosphorescence).

A pixel shown in FIG. 27B has the same structure as that shown in FIG. 27A, except that a transistor 1406 and a scan line 1416 are added. Similarly, a pixel shown in FIG. 27D has the same structure as that shown in FIG. 27C, except that the transistor 1406 and the scan line 1416 are added.

The transistor 1406 is controlled to be on/off by the added scan line 1416. When the transistor 1406 is turned on, charges held in the capacitor element 1402 are discharged, thereby turning the transistor 1406 off. In other words, supply of current to the light emitting element 1405 can be forcibly stopped by disposing the transistor 1406. Accordingly, by adopting the structures shown in FIGS. 27B and 27D, a lighting period can be started simultaneously with or shortly after a writing period before signals are written to all the pixels, thereby leading to the increased duty ratio.

In a pixel shown in FIG. 27E, a signal line 1450 is arranged in a column direction and power supply lines 1451 and 1452 and a scan line 1453 are arranged in a row direction. The pixel further comprises a switching TFT 1441, a driving TFT 1443, a capacitor element 1442, and a light emitting element 1444. A pixel shown in FIG. 27F has the same structure as that shown in FIG. 27E, except that a TFT 1445 and a scan line 1454 are added. It is to be noted that the structure of FIG. 27F also allows the duty ratio to be increased due to the TFT 1445.

This embodiment can be freely combined with any one of Embodiment Mode 2, and Embodiments 4 to 6.

Embodiment 8

As a semiconductor device and electronic device according to the present invention, a video camera, a digital camera, a goggle type display (head mount display), a navigation system, a sound reproduction device (car audio, audio composition or the like), a laptop personal computer, a game machine, a personal digital assistant (mobile computer, a mobile phone, a portable game machine, an electronic dictionary or the like), an image reproduction device (specifically, a device playing a recording medium such as a Digital Versatile Disc (DVD), comprising a display capable of displaying an image) or the like can be given. In particular, it is preferable to use the invention for a large-sized television or the like, having a large screen. An operative example of those electronic devices is shown in FIGS. 28A to 28D.

Figure 28:
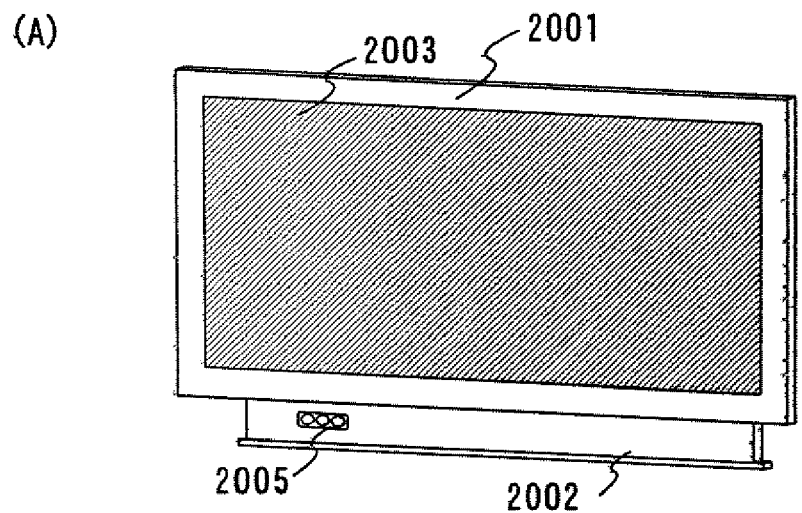
FIGS. 28A to 28D are views showing an example of an electronic device. (Embodiment 4)
Figure 28:
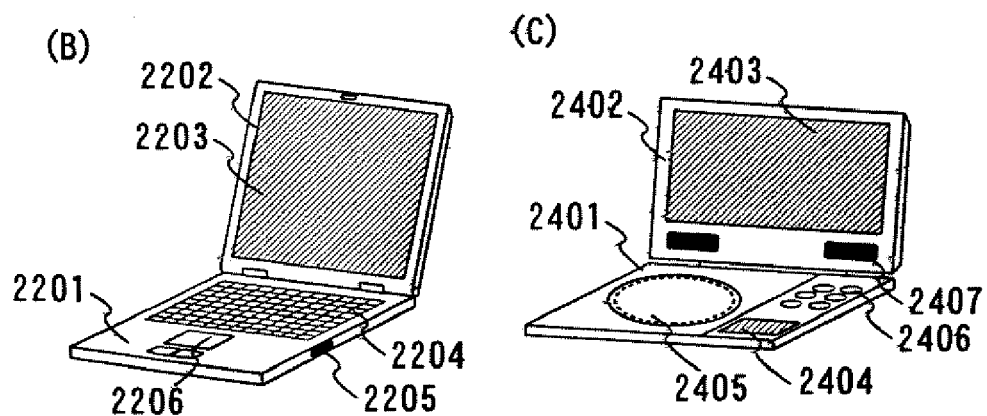
Figure 28:
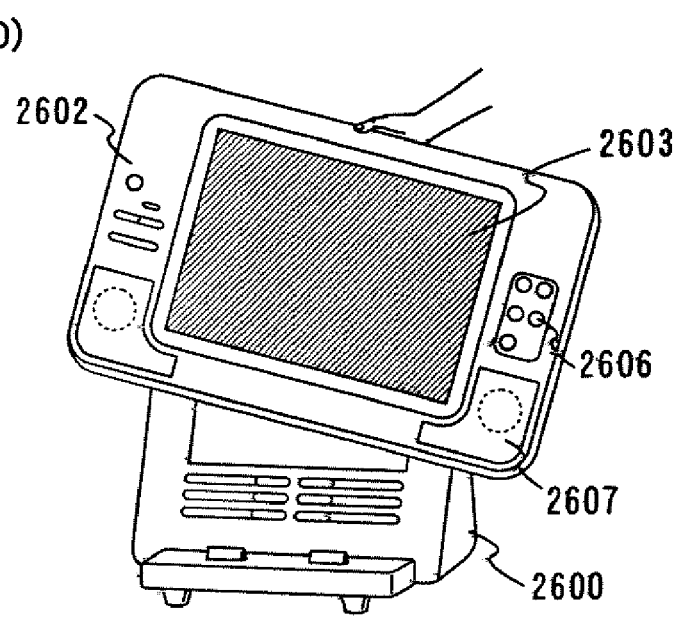

FIG. 28A shows a large-sized display device comprising a large screen of 22 inches to 50 inches, which includes a casing 2001, a support 2002, a display portion 2003, a video input terminal 2005 and the like. A display device includes every display device for displaying information for a personal computer, a TV broadcast reception, an interactive TV and the like. A large-sized display device which is relatively inexpensive can be realized even when a large substrate after the fifth generation, which has a side exceeding 1000 mm is used.

FIG. 28B shows a laptop personal computer including a main body 2201, a casing 2202, a display portion 2203, a keyboard 2204, an external connection port 2205, a pointing mouse 2206 and the like. A laptop personal computer which is relatively inexpensive can be realized according to the invention.

FIG. 28C shows a portable image reproduction device equipped with a recording medium (specifically, DVD player), which includes a main body 2401, a casing 2402, a display portion A 2403, a display portion B 2404, a recording medium (DVD or the like) reading portion 2405, an operation key 2406, a speaker unit 2407 and the like. The display portion A 2403 mainly displays image information whereas the display portion B 2404 mainly displays text information. The image reproduction device equipped with a recording medium includes home video game machines and the like. An image reproduction device which is relatively inexpensive can be realized according to the invention.

FIG. 28D shows a wireless TV, and only the display thereof is portable. A battery and a signal receiver are incorporated in a casing 2602, and a display portion 2604 and a speaker unit 2607 are driven by the battery. The battery can be charged with a charger 2600 a number of times. Additionally, the charger 2600 can send and receive a video signal, and it can send the video signal to a signal receiver of the display. The casing 2602 is controlled by an operation key 2606. The device shown in FIG. 28D is also an interactive video/audio communication device since the device can send a signal from the casing to the charger 2600 by operating the operation key 2606. Additionally, by operating the operation key 2606, a signal can be sent from the casing to the charger 2600. Further, by making another electronic device receive a signal sendable from the charger 2600, communication of another electronic device can be controlled. In that respect, it is also a general-purpose remote control device. According to the invention, a portable TV with relatively large (from 22 inches to 50 inches) can be provided through an inexpensive manufacturing process.

As described above, a display device obtained by the invention may be used as a display portion of every electronic device.

This embodiment mode can be freely combined with any one of Embodiment Mode 1 or 2, or Embodiment from 1 to 7.

INDUSTRIAL APPLICABILITY

According to the present invention, a liquid crystal display panel or a light emitting display panel can be manufactured at low cost by using a glass substrate after the fifth generation, of which one side exceeds 1000 mm.

Additionally, according to the invention, productivity can be improved, and further, a process without carrying out spin coat can be realized. Accordingly, loss of material solution and an amount of waste solution can be reduced.

EXPLANATION OF REFERENCE

10 substrate; 11 base layer; 12 depression; 13 mask; 14 Insulating layer; 15 Metal wiring; 16 Extra droplet; 18 Gate insulating film; 19 Semiconductor film; 20 N-type semiconductor film; 21 Mask; 22 Source wiring or a drain wiring; 23 Source wiring or a drain wiring; 24 Channel formation region; 25 Drain region; 26 Source region; 27 Protective film; 28 Interlayer insulating film; 29 Pillar; 30 Pixel electrode; 34a Orientation film; 34b Orientation film; 35 Counter substrate; 36a

Colored layer; 36b Light-shielding layer; 37 Over coat layer; 38 Counter electrode; 39 Liquid crystal; 40 Wiring; 41 Terminal electrode; 45 Anisotropic conductive layer; 46 FPC; 51 Substrate; 52 Hot plate; 53 Hot plate; 54 Top plate; 55a Support; 55b Support; 56 Teflon coat film; 57 Layer to be processed; 55a Heater; 55b Heater; 61 Substrate; 62 Roller; 63 Feed roller; 64 Roller conveyer; 66 Teflon coat film; 67 Layer to be processed; 73 Mask; 74 Insulating layer; 75 Wiring; 76 Extra droplet; 77 Water soluble resin; 110 Large-area substrate; 111 Pixel portion; 112 Sealing portion; 113 Nozzle scan direction; 114 Material solution; 115 Object surface; 116 Droplet discharge device; 118 Nozzle; 119 Portion surrounded with a dotted line; 120 Inverted staggered type TFT; 121 Pixel electrode; 210 Substrate; 211 Base layer; 212 Depression; 213 Mask; 214 Insulating layer; 215a Metal wiring; 215b Metal wiring; 216 Droplet; 217 Lead-out electrode; 218 Gate insulating film; 219 Semiconductor film; 220 N-type semiconductor film; 221 Mask; 222 Source wiring or a drain wiring; 223 Source wiring or a drain wiring; 224 Channel formation region; 225 Drain region; 226 Source region; 227 Protective film; 228 Interlayer insulating film; 229 Pillar; 230 First electrode; 234 Partition; 235 Sealing substrate; 236 Layer containing an organic compound; 237 Second electrode; 238 Filler; 240 Wiring; 241 Terminal electrode; 245 Anisotropic conductive film; 246 FPC; 273 Mask; 274 Insulating layer; 275a Wiring; 275b Wiring; 276 Extra droplet; 277 Water soluble resin; 300 Large-area substrate; 302 Pixel portion; 303 Resist film; 380 Resist separation solution nozzle; 381 Resist separation solution nozzles; 382 Deionized water nozzles; 383 Blow nozzles; 384a Substrate support; 411 Base layer; 414 Insulating layer; 415a Gate electrode; 415b Gate wiring; 418 Gate insulating film; 422 Drain electrode; 423 Source electrode; 424 Semiconductor film; 428 Interlayer insulating film; 429 Pillar; 430 Pixel electrode; 500 Pulse output circuit; 501 Buffer circuit; 502 a pixel; 601 N-channel type TFT; 620 to 635 N-channel type TFT; 800 Nozzle unit; 801 Substrate; 802 First material layer; 803 Second material layer; 900 Substrate; 901 CVD device; 902 CVD device; 903 CVD device; 904 substrate transportation path; 1031 Second substrate; 1032 Sealant; 1033 Liquid crystal; 1034 Pixel portion; 1035 First substrate; 1041 First substrate support; 1042 Second substrate support; 1044 Window; 1048 Bottom downside base plate; 1049 Light source; 1101 Substrate; 1104 Pixel portion; 1105 FPC; 1106 Counter substrate; 1107 Sealant; 1111 Substrate; 1112 Source signal line driver circuit; 1113 Gate signal line driver circuit; 1114 Pixel portion; 1115 FPC; 1116 Counter substrate; 1117 First sealant; 1118 Second sealant; 1401 Switching TFT; 1402 Capacitor element; 1403 Driving TFT; 1404 Current control TFT; 1405 Light emitting element; 1406 TFT; 1410 Signal line; 1411 Power source line; 1412 Power source line; 1413 Power source line; 1414 Scan line; 1415 Power source line; 1416 Scan line; 1441 Switching TFT; 1442 Capacitor element; 1443 Driving TFT; 1444 Light emitting element; 1445 TFT; 1450 Signal line; 1451 Power source line; 1452 Power source line; 1453 Scan line; 1454 Scan line; 1500 Large-sized substrate; 1503 Region where one panel is formed; 1504 Imaging unit; 1505a Head; 1505b Head; 1505c Head; 1507 Stage; 1511 Marker; 1600 Substrate; 1601 Pixel electrode; 1602 Spacer; 1603 Orientation film; 1604 Back light; 1605 Light conducting plate; 1606 Cover; 1607 Sealant; 1620 Colored layer; 1621 Counter electrode; 1622 Orientation film; 1623 Orientation film; 1624 Liquid crystal layer; 1901 Gate electrode; 1902 Semiconductor film; 1903 Channel protective layer; 1904 Source region or a drain region; 1905 Wiring; 1906 Wiring; 1907 Source region or a drain region; 1928 Interlayer insulating film; 1929 Pillar; 2001 Casing; 2002 Support; 2003 Display portion; 2005 Video input terminal; 2201 Main body; 2202 Casing; 2203 Display portion; 2204 Keyboard; 2205 External connection port; 2206 Pointing mouse; 2401 Main body; 2402 Casing; 2403 Display portion A; 2404 Display portion B; 2405 Recording medium reading part; 2406 Operation key; 2407 Speaker unit; 2600 Charger; 2602 Casing; 2603 Display portion; 2604 Display portion; 2606 Operation key; 2407 Speaker unit; 2700 Substrate; 2701 Pixel portion; 2702 Pixel; 2703 Scan line side input terminal; 2704 Signal line side input terminal; 2901 Gate electrode; 2902 Semiconductor film; 2903 Channel protective layer; 2904 Source region or a drain region; 2905 Wiring; 2906 Wiring; 2907 Source region or a drain region; 2928 Interlayer insulating film; 2929 Pillar; 3700 Substrate; 3701 Pixel portion; 3702 Driver circuit; 3704a Tape; 3704b Tape; 3705a Driver IC; 3705b Driver IC

What is claimed is:

1. A semiconductor device comprising
a base layer formed over a substrate having an insulating surface;
an insulating layer and at least one of a gate wiring and a gate electrode formed over the base layer;
a gate insulating film formed over one of the gate wiring and the gate electrode; and
an active layer of a thin film transistor including at least a channel formation region over the gate insulating film;
a source wiring and an electrode formed over the active layer; and
a pixel electrode formed over the electrode,
wherein one of the gate wiring and the gate electrode contains a resin and has the same film thickness as that of the insulating layer.

2. A semiconductor device according to claim 1, wherein the base layer comprises a material selected from the group consisting of a transition metal, an oxide of said transition metal, a nitride of said transition metal, and an oxynitride of said transition metal.

3. A semiconductor device according to claim 2, wherein the transition metal comprises a material selected from the group consisting of Sc, Ti, Cr, Ni, V, Mn, Fe, Co, Cu, Zn.

4. A semiconductor device according to claim 1, wherein the active layer of the thin film transistor is a non-single crystalline semiconductor film or a polycrystalline semiconductor film added with hydrogen or halogen hydrogen.

5. A semiconductor device according to claim 1, the width of the gate electrode of the thin film transistor is from 5 μm to 100 μm.

6. A semiconductor device according to claim 1, wherein the length of the gate electrode width of the thin film transistor is shorter than that of the thickness of the gate electrode of the thin film transistor.

7. A semiconductor device according to claim 1, wherein a surface including an upper surface of the gate wiring or the gate electrode and a surface including an upper surface of the insulating layer are in the same plane.

8. A semiconductor device according to claim 1, wherein a PV value of a projection and a depression on an upper surface of the insulating layer is less than 20 nm.

9. A semiconductor device according to claim 1, wherein P-V value of a projection and a depression on the upper surface of the gate wiring or gate electrode is lower than 20 nm.

10. A semiconductor device according to claim 1, further comprising: a liquid crystal display device including a second substrate opposing to the substrate, and a liquid crystal interposed between a pair of substrates composed of the substrate and the second substrate.

11. A semiconductor device according to claim 1, further comprising a plurality of light emitting elements including a cathode, a layer containing an organic compound and an anode.

12. A semiconductor device according to claim 1, wherein the semiconductor device is an interactive video/audio communication device or a general-purpose remote control device.

13. A semiconductor device comprising:
- an insulating layer and at least one of a gate wiring and a gate electrode formed over a substrate having an insulating surface;
- a gate insulating film formed over one of the gate wiring and the gate electrode; and
- an active layer of a thin film transistor including at least a channel formation region over the gate insulating film;
- a source wiring and an electrode formed over the active layer; and
- a pixel electrode formed over the electrode,
- wherein one of the gate wiring and the gate electrode contains a resin and has the same film thickness as that of the insulating layer.

14. A semiconductor device according to claim 13, wherein the length of the gate electrode width of the thin film transistor is shorter than that of the thickness of the gate electrode of the thin film transistor.

15. A semiconductor device according to claim 13, wherein a surface including an upper surface of the gate wiring or the gate electrode and a surface including an upper surface of the insulating layer are in the same plane.

16. A semiconductor device according to claim 13, further comprising: a liquid crystal display device including a second substrate opposing to the substrate, and a liquid crystal interposed between a pair of substrates composed of the substrate and the second substrate.

17. A semiconductor device according to claim 13, further comprising a plurality of light emitting elements including a cathode, a layer containing an organic compound and an anode.

18. A semiconductor device according to claim 13, wherein the semiconductor device is an interactive video/audio communication device or a general-purpose remote control device.

* * * * *

UNITED STATES PATENT AND TRADEMARK OFFICE
CERTIFICATE OF CORRECTION

PATENT NO. : 7,897,968 B2  
APPLICATION NO. : 12/504840  
DATED : March 1, 2011  
INVENTOR(S) : Hideaki Kuwabara et al.

Page 1 of 1

It is certified that error appears in the above-identified patent and that said Letters Patent is hereby corrected as shown below:

column 4, line 4, "beating" should read "heating"

column 4, line 50, "red out" should read "carried out"

column 8, line 31, "FIGS. 1A to 1F" should read "FIGS. 1A to 1E"

column 12, line 22, "titanium (Zn)" should read "titanium (Ti)"

column 19, line 6, "TFT mode" should read "TN mode"

column 24, line 24, "an be formed" should read "can be formed"

column 24, line 40, "set the material" should read "select the material"

column 25, line 8, "scaling substrate" should read "sealing substrate"

column 25, line 59, "scaling substrate" should read "sealing substrate"

column 30, line 49, "HG2D" should read "FIG. 2D"

column 34, line 47, "TFT 11404" should read "TFT 1404"

Signed and Sealed this  
Sixteenth Day of August, 2011

David J. Kappos  
*Director of the United States Patent and Trademark Office*